United States Patent
Cai et al.

(10) Patent No.: US 9,450,381 B1
(45) Date of Patent: Sep. 20, 2016

(54) MONOLITHIC INTEGRATED PHOTONICS WITH LATERAL BIPOLAR AND BICMOS

(71) Applicant: International Business Machines Corporation, Armonk, NY (US)

(72) Inventors: Jin Cai, Cortlandt Manor, NY (US); Effendi Leobandung, Stormville, NY (US); Ning Li, White Plains, NY (US); Tak H. Ning, Yorktown Heights, NY (US); Jean-Olivier Plouchart, New York, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/662,590

(22) Filed: Mar. 19, 2015

(51) Int. Cl.
*H01S 5/30* (2006.01)
*H01S 5/20* (2006.01)

(52) U.S. Cl.
CPC ........... *H01S 5/3009* (2013.01); *H01S 5/2018* (2013.01); *H01S 5/3054* (2013.01); *H01S 5/3086* (2013.01)

(58) Field of Classification Search
CPC ... H01S 5/3009; H01S 5/2018; H01S 5/3086
See application file for complete search history.

(56) References Cited

U.S. PATENT DOCUMENTS

| 4,956,682 | A | 9/1990 | Ohnaka et al. |
| 6,477,285 | B1 | 11/2002 | Shanley |
| 6,709,954 | B1 * | 3/2004 | Werking ................. H01L 21/78 257/E21.599 |
| 6,828,598 | B1 | 12/2004 | Coffa et al. |
| 6,870,977 | B2 | 3/2005 | Devaux et al. |
| 6,991,892 | B2 | 1/2006 | Block |
| 7,218,826 | B1 | 5/2007 | Gunn, III et al. |
| 7,251,408 | B1 | 7/2007 | Gunn, III et al. |
| 7,372,121 | B2 | 5/2008 | Zhong et al. |
| 8,062,919 | B2 | 11/2011 | Apsel et al. |
| 2002/0110309 | A1 | 8/2002 | Devaux et al. |
| 2007/0099430 | A1 * | 5/2007 | Higgins ............ H01L 21/76816 438/734 |
| 2015/0061118 | A1 * | 3/2015 | Chen ..................... H01L 24/16 257/737 |

FOREIGN PATENT DOCUMENTS

JP    1150356    6/1989

OTHER PUBLICATIONS

Cai, J. et al., "Complementary Thin-Base Symmetric Lateral Bipolar Transistors on SOI" IEEE International Electron Devices Meeting (IEDM) (Dec. 5-7, 2011) pp. 16.3.1-16.3.4.

* cited by examiner

*Primary Examiner* — Dung Nguyen
(74) *Attorney, Agent, or Firm* — Scully, Scott, Murphy & Presser, P.C.; Louis J. Percello, Esq.

(57) ABSTRACT

After forming a first trench extending through a top semiconductor layer and a buried insulator layer and into a handle substrate of a semiconductor-on-insulator (SOI) substrate, a dielectric waveguide material stack including a lower dielectric cladding layer, a core layer and an upper dielectric cladding layer is formed within the first trench. Next, at least one lateral bipolar junction transistor (BJT), which can be a PNP BJT, an NPN BJT or a pair of complementary PNP BJT and NPN BJT, is formed in a remaining portion of the top semiconductor layer. After forming a second trench extending through the dielectric waveguide material stack to re-expose a portion of a bottom surface of the first trench, a laser diode is formed in the second trench.

9 Claims, 40 Drawing Sheets

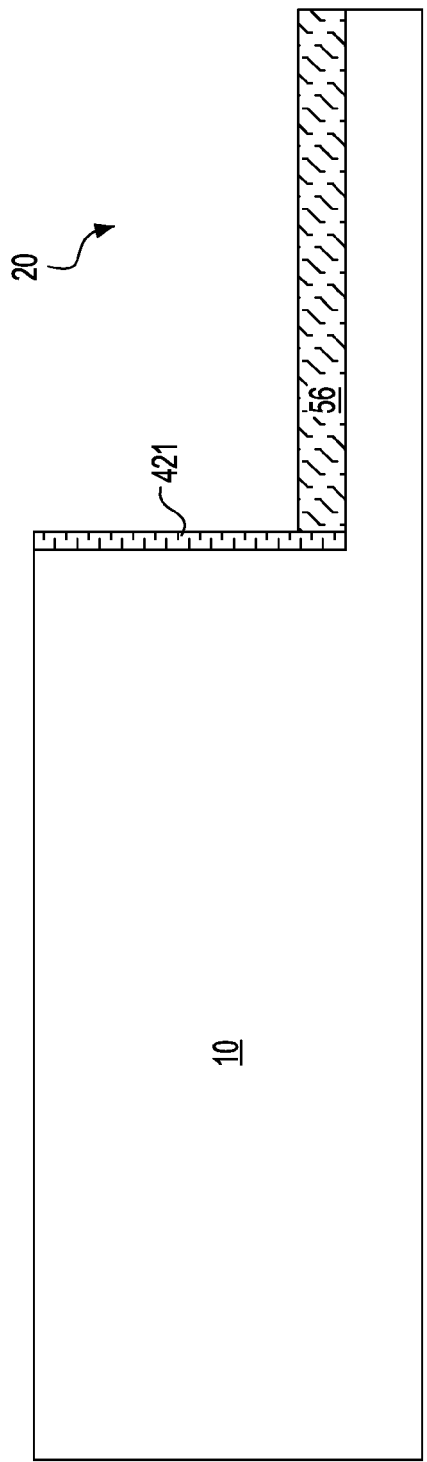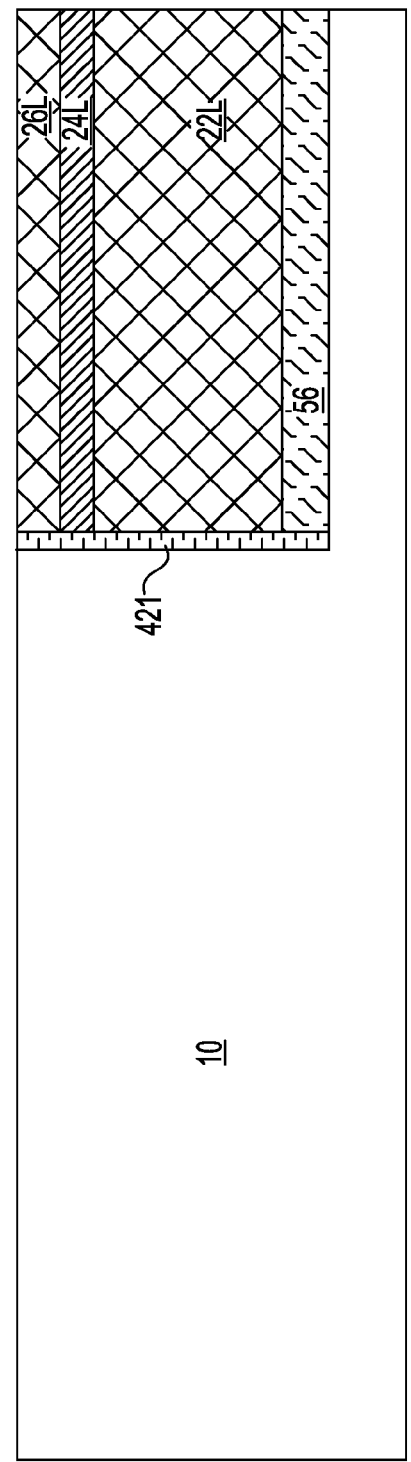
FIG. 35
FIG. 36

US 9,450,381 B1

MONOLITHIC INTEGRATED PHOTONICS WITH LATERAL BIPOLAR AND BICMOS

BACKGROUND

The present application relates to semiconductor structures, and particularly to semiconductor structures including electronic and photonic components on a common substrate and methods of manufacturing the same.

Integration of electronic (e.g., transistors, capacitors, resistors) and photonic (e.g., modulators, lasers, photodetectors, waveguides) components on a single integrated chip using a standard semiconductor process has been actively pursued to provide fast optical communication links. Complementary metal-oxide-semiconductor (CMOS) transistors are normally used in the electronic/photonic integrated circuit to drive the photonic components. CMOS transistors are also widely used in receiver circuits. It is well known that bipolar junction transistors (BJTs) have better analog and radiofrequency (RF) characteristics than CMOS transistors. Therefore, it is more desirable to employ BJTs in RF integrated circuits for high-frequency applications. The BJTs may also be combined with CMOS transistors in bipolar complementary metal oxide semiconductor (BiCMOS) integrated circuits to take advantage of the positive characteristics of both transistor types in the construction of the electronic/photonic integrated circuit. However, conventional BJT fabrication processes are not compatible with prevalent CMOS technologies and therefore incur much higher cost. In addition, the conventional BJT design requires larger layout area than CMOS transistors, further adding to the manufacturing cost. Therefore, methods to integrate CMOS technology compatible BJTs with various photonic components on a common substrate remain needed.

SUMMARY

The present application provides methods of integrating photonic devices and bipolar BJTs on a common substrate employing processes that are compatible with a CMOS manufacturing process flow, which can be a gate-first process flow or a gate-last process flow. Instead of a more conventional BJT design with vertically stacked emitter-base-collector layers, a lateral BJT design with emitter-base-collector arranged laterally similar to source-channel-drain configuration in a CMOS transistor is used. Recent advancement of lithography has enabled symmetric thin-base lateral BJTs with high performance. The photonic devices include a laser diode that is edge coupled to a dielectric waveguide. After forming a first trench extending through a top semiconductor layer and a buried insulator layer and into a handle substrate of an SOI substrate, a dielectric waveguide material stack including a lower dielectric cladding layer, a core layer and an upper dielectric cladding layer is formed within the first trench. Next, at least one lateral BJT, which can be a PNP BJT, an NPN BJT or a pair of complementary PNP BJT and NPN BJT is formed in a remaining portion of the top semiconductor layer. After forming a second trench extending through the dielectric waveguide material stack to re-expose a portion of a bottom surface of the first trench, a laser diode is formed in the second trench.

According to an aspect of the present application, a semiconductor structure is provided. The semiconductor structure includes at least one electronic device located on a portion of a semiconductor-on-insulator (SOI) substrate. The at least one electron device includes at least one bipolar junction transistor (BJT). The semiconductor structure further includes photonic devices embedded within another portion of the SOI substrate. The photonic devices include a dielectric waveguide comprising a lower dielectric cladding portion, a core portion present on the lower dielectric cladding portion, and an upper dielectric cladding portion present on the core portion and an optoelectronic device edge coupled to the dielectric waveguide. The optoelectronic device includes an active layer laterally aligned to the core portion of the dielectric waveguide.

According to another aspect of the present application, a method of forming a semiconductor structure is provided.

In one embodiment, the method includes first forming a first trench within a semiconductor-on-insulator (SOI) substrate. The first trench extends through a top semiconductor layer of the SOI substrate and a buried insulator layer of the SOI substrate and into a handle substrate of the SOI substrate. A dielectric waveguide material stack is then formed in the first trench. After forming at least one electronic device including at least one bipolar junction transistor (BJT) in the top semiconductor layer, a second trench extending through a portion of the dielectric waveguide material stack is formed. The second trench re-exposes a portion of the bottom surface of the first trench. After sequentially epitaxially depositing a compound semiconductor seed layer on the exposed portion of the bottom surface of the first trench and a compound semiconductor buffer layer on the compound semiconductor seed layer, an optoelectronic device is formed on the compound semiconductor buffer layer within the second trench.

In another embodiment, the method includes first providing a semiconductor-on-insulator (SOI) substrate including a handle substrate, a lower germanium-containing semiconductor layer present on the handle substrate, a buried insulator layer stack present on the lower germanium-containing semiconductor layer, and a top germanium-containing semiconductor layer present on the buried insulator layer stack. The buried insulator layer stack includes a first dielectric layer contacting the lower germanium-containing semiconductor layer, a second dielectric layer present on the first dielectric layer, and a third dielectric layer present on the second dielectric layer. After forming a trench within the SOI substrate such that the trench extends through the top germanium-containing semiconductor layer and the buried insulator layer stack to expose a portion of the lower germanium-containing semiconductor layer, spacers are formed on sidewalls of the trench. A compound semiconductor buffer layer is then epitaxially deposited on a bottom surface of the trench. Next, an optoelectronic device is formed on the compound semiconductor buffer layer within the trench. After forming a dielectric cap on a topmost surface of the optoelectronic device, at least one electronic device is formed in the top semiconductor layer. The at least one electronic device comprises at least one bipolar junction transistor (BJT).

BRIEF DESCRIPTION OF SEVERAL VIEWS OF THE DRAWINGS

FIG. 35 is a cross-sectional view of a fourth exemplary semiconductor structure after forming a first trench in a bulk semiconductor substrate and a spacer and forming a spacer on a sidewall of the first trench and a compound semiconductor seed layer on a bottom surface of the first trench according to a fourth embodiment of the present application.

FIG. 36 is a cross-sectional view of the fourth exemplary semiconductor structure of FIG. 35 after forming a dielectric waveguide material stack on the compound semiconductor seed layer in the first trench.

DETAILED DESCRIPTION

Figure 1:
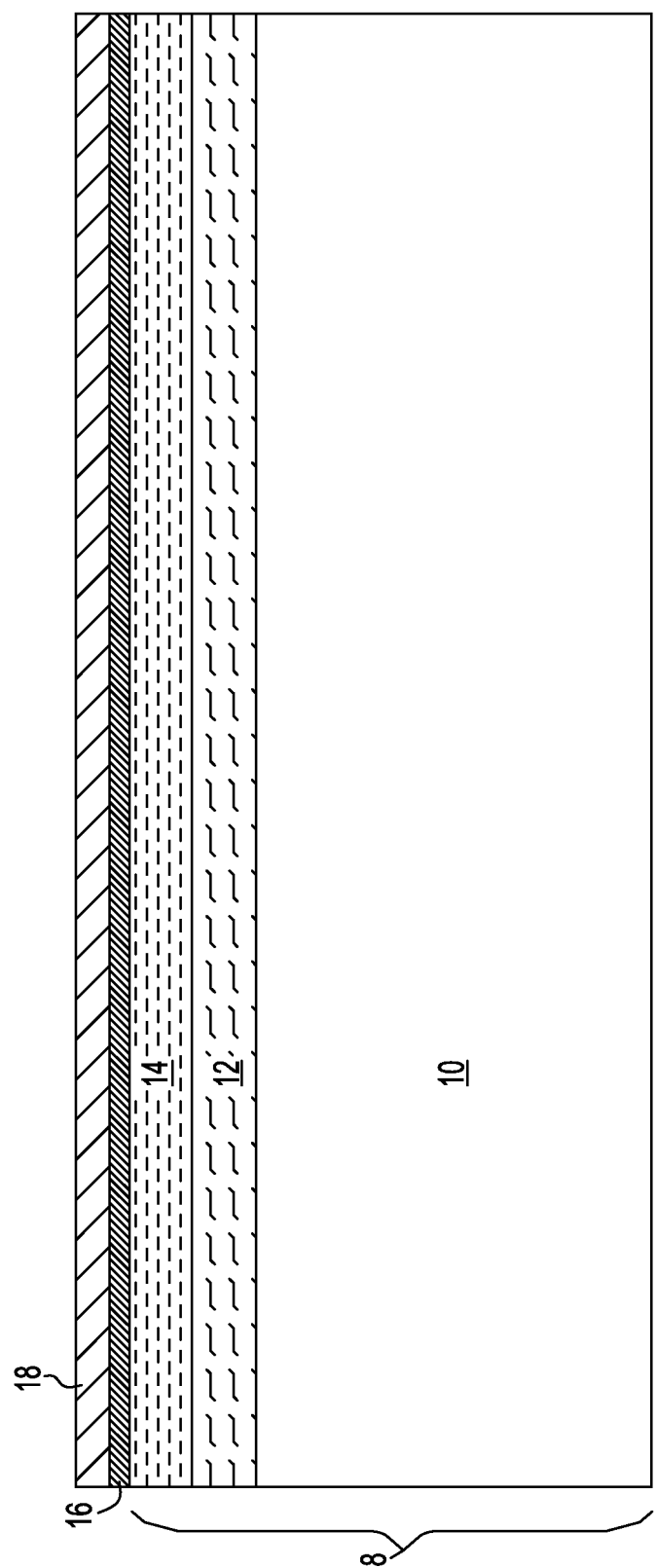
FIG. 1 is a cross-sectional view of a first exemplary semiconductor structure after forming at least one pad dielectric layer on a semiconductor-on-insulator (SOI) substrate that includes, from bottom to top, a handle substrate, a buried insulator layer and a top semiconductor layer according to a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, a first exemplary semiconductor structure according to a first embodiment of the present application includes a semiconductor-on-insulator (SOI) substrate 8 and at least one pad dielectric layer (16, 18) formed thereupon. The SOI substrate 8 includes, from bottom to top, a handle substrate 10, a buried insulator layer 12, and a top semiconductor layer 14. The buried insulator layer 12 isolates the top semiconductor layer 14 from the handle substrate 10.

The handle substrate 10 may include a semiconductor material, such as, for example, Si, Ge, SiGe, SiC, SiGeC, a compound semiconductor material such as a III-V compound semiconductor material or a II-VI compound semiconductor material, or a combination thereof. In one embodiment, the handle substrate 10 is composed of single crystalline silicon. The thickness of the handle substrate layer 10 can be from 50 μm to 2 mm, although less and greater thicknesses can also be employed.

The handle substrate 10 may be doped with dopants, which can be p-type or n-type. As used herein, the term "p-type" refers to the addition of impurities to an intrinsic semiconductor that creates deficiencies of valence electrons, while the term "n-type" refers to the addition of impurities that contribute free electrons to an intrinsic semiconductor. Exemplary p-type dopants include, but are not limited to, boron, aluminum, gallium and indium. Exemplary n-type dopants include, but are not limited to, antimony, arsenic and phosphorous. In one embodiment, the handle substrate 10 is composed of silicon doped with p-type dopants. The dopants may be introduced to the handle substrate 10 by ion implantation, gas phase doping or by an in-situ doping process that is employed while the material of the handle substrate 10 is being formed. The concentration of dopants that are present in the handle substrate 10 is typically greater than $1 \times 10^{15}$ atoms/cm$^3$. In one embodiment, the concentration of dopants that are present in the handle substrate 10 ranges from $1 \times 10^{16}$ atoms/cm$^3$ to $1 \times 10^{17}$ atoms/cm$^3$.

The buried insulator layer 12 may include a dielectric material such as silicon oxide, silicon nitride, silicon oxynitride, or a combination thereof. In one embodiment, the buried insulator layer 12 may be formed by a deposition process, such as chemical vapor deposition (CVD) or physical vapor deposition (PVD). In another example, the buried insulator layer 12 may be formed using a thermal growth process, such as thermal oxidation, to convert a surface portion of the handle substrate 10 into the buried insulator layer 12. The thickness of the buried insulator layer 12 that is formed can be from 100 nm to 200 nm, although lesser or greater thicknesses can also be employed.

The top semiconductor layer 14 may include a semiconductor material, such as, for example, Si, Ge, SiGe, SiC, SiGeC, a compound semiconductor material such as a III-V compound semiconductor material or a II-VI compound semiconductor material, or a combination thereof. The semiconductor materials of the top semiconductor layer 14 and the handle substrate 10 may be the same or different. In one embodiment, the top semiconductor layer 14 includes a single crystalline semiconductor material, such as, for example, single crystalline silicon. The top semiconductor layer 14 may be formed by a deposition process, such as CVD or plasma enhanced CVD (PECVD) or by a layer transfer process. The top semiconductor layer 14 that is formed may have a thickness from 50 nm to 100 nm, although lesser or greater thicknesses can also be employed.

At least one pad dielectric layer (16, 18) may be deposited on the SOI substrate 8 as an etch mask for forming trenches in the SOI substrate 8. In one embodiment and as shown in FIG. 1, the at least one pad dielectric layer (16, 18) is a material stack including a pad oxide layer 16 that is present on the topmost surface of the SOI substrate 8 (i.e., the top surface of the top semiconductor layer 14), and a pad nitride layer 18 that is present on the top surface of the pad oxide layer 16.

The pad oxide layer 16 may be composed of an oxide-containing dielectric material, such as silicon oxide or a dielectric metal oxide. The pad oxide layer 16 may be formed by a deposition process, such as CVD or spin on deposition. The pad oxide layer 16 may have a thickness ranging from 5 nm to 50 nm, although lesser and greater thicknesses can also be employed.

The pad nitride layer 18 may be composed of a nitride-containing dielectric material, such as silicon nitride or a dielectric metal nitride. The pad nitride layer 18 may be formed by a deposition process, such as CVD or PVD. The pad nitride layer 18 may have a thickness ranging from 50 nm to 200 nm, although lesser and greater thicknesses can also be employed.

Figure 2:
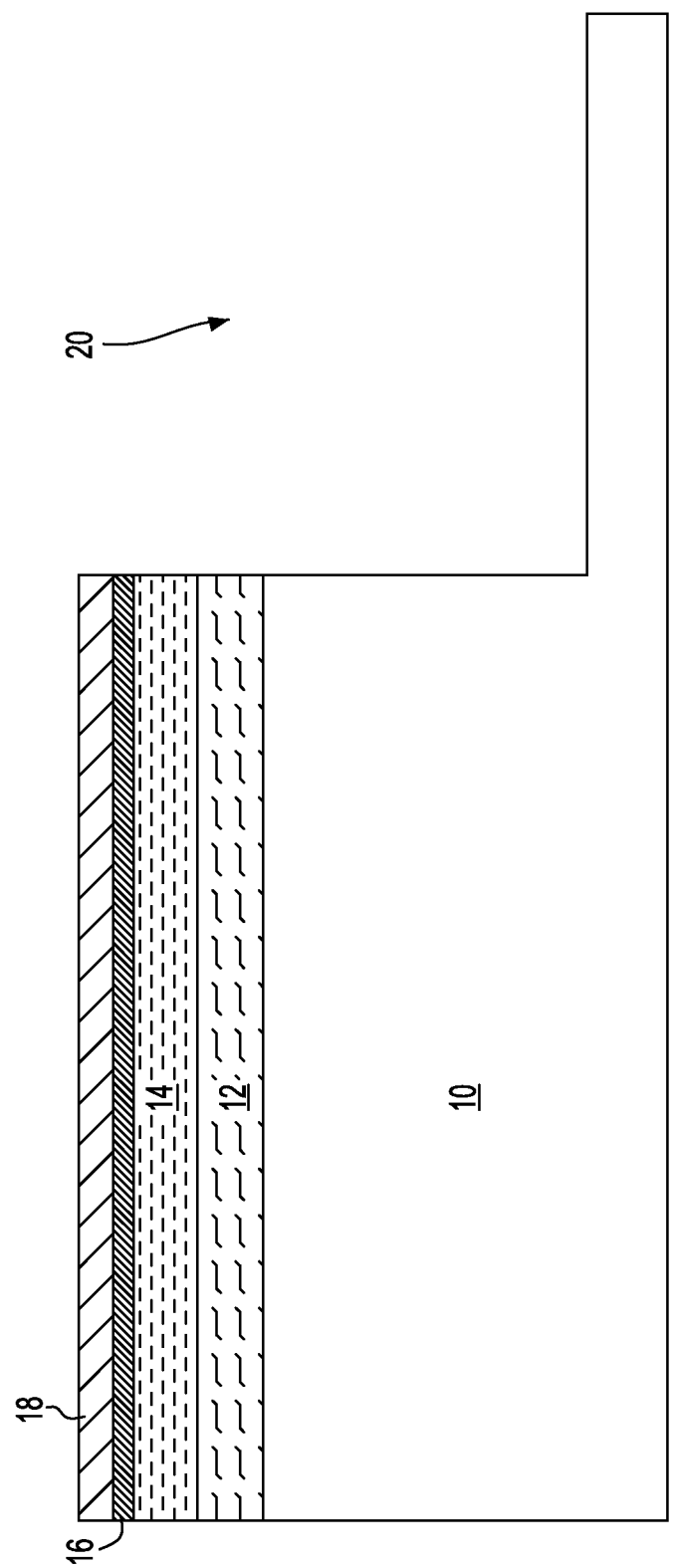
FIG. 2 is a cross-sectional view of a first exemplary semiconductor structure of FIG. 1 after forming a first trench through the top semiconductor layer and the buried insulator layer and into the handle substrate.

Referring to FIG. 2, a first trench 20 is formed within the SOI substrate 8. The first trench 20 may be formed by applying a photoresist layer (not shown) over the pad nitride layer 18 and lithographically patterning the photoresist layer to form an opening therein. The pattern of the opening in the photoresist layer can be transferred into the at least one pad dielectric layer (16, 18) by an anisotropic etch to form an opening in the at least one pad dielectric layer (16, 18). The anisotropic etch can be a dry etch such as, for example, reactive ion etch (RIE) or a wet etch. The remaining photoresist layer is subsequently removed, for example, by ashing.

Subsequently, the pattern of the opening in the at least one pad dielectric layer (16, 18) is transferred through the top semiconductor layer 14, the buried insulator layer 12, and an upper portion of the handle substrate 10 by an anisotropic etch that employs the at least one pad dielectric layer (16, 18) as an etch mask to provide the first trench 20. The anisotropic etch can be a dry etch such as, for example, RIE or a wet etch. The first trench 20 defines a photonic device region within which photonic devices are to be formed. The remaining portion of the top semiconductor layer 14 defines an electronic device region within which electronic devices are to be formed. The first trench 20 is etched to a depth that allows maximization of light coupling to a dielectric waveguide subsequently formed. The etching depths are typically on the orders of microns. In one embodiment, the etching depth is greater than 2 μm.

Figure 3:
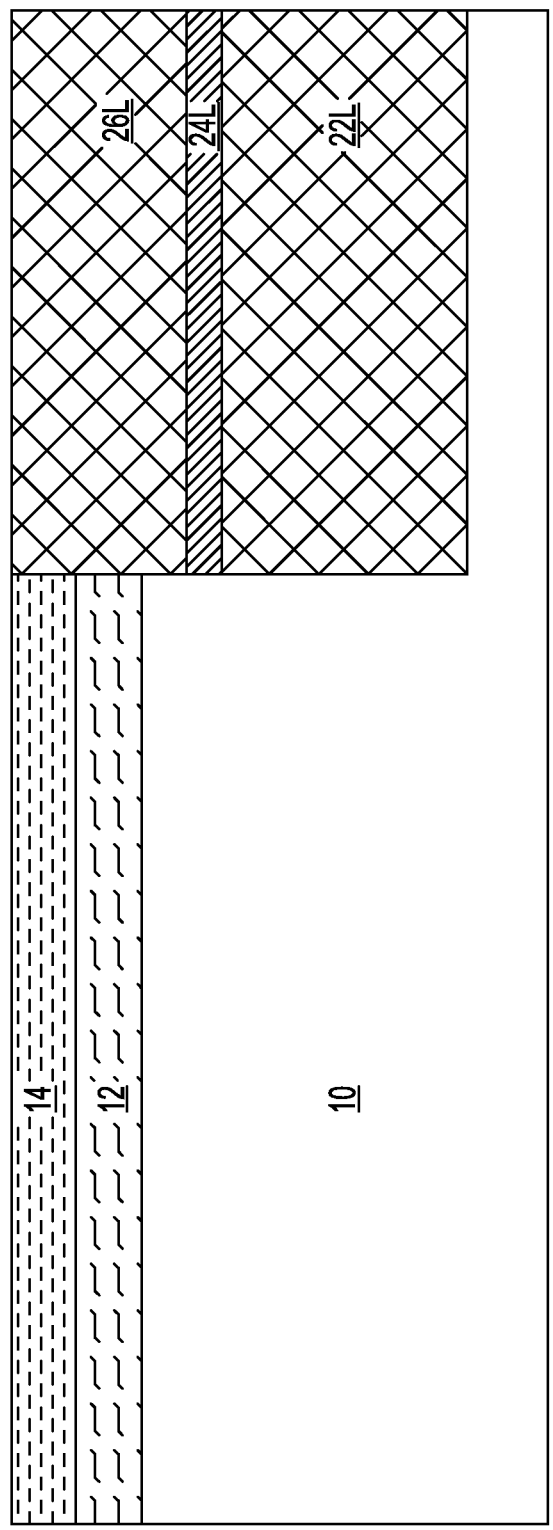
FIG. 3 is a cross-sectional view of the first exemplary semiconductor structure of FIG. 2 after forming a dielectric waveguide material stack within the first trench.

Referring to FIG. 3, a dielectric waveguide material stack including a lower dielectric cladding layer 22L, a core layer 24L and an upper dielectric cladding layer 26L is formed within the first trench 20. To function as a dielectric waveguide, each of the lower dielectric cladding layer 22L and the upper dielectric cladding layer 26L has a refractive index lower than the refractive index of the core layer 24L. The refractive index contrast between the lower and the upper dielectric cladding layers 22L, 26L and the core layer 24L is selected to allow a tight confinement of the light within the core layer 24L. In one embodiment, the lower dielectric cladding layer 22L and the upper dielectric cladding layer 26L may include a dielectric oxide such as, for example, silicon oxide, while the core layer 24L may include a dielectric nitride such as, for example, silicon nitride.

The lower dielectric cladding layer 22L may be formed by depositing a first dielectric material on the bottom surface of the trench 20 utilizing a conventional deposition process, such as, for example, CVD, PECVD or PVD. The lower dielectric cladding layer 22L is deposited to a thickness that is greater than the wavelength of light propagating in the dielectric waveguide (typically between 390 nm and 2000 nm).

The core layer 24L may be formed by depositing a second dielectric material on the top surface of the lower dielectric cladding layer 22L utilizing CVD, PECVD or PVD. The thickness of the core layer 24L is selected to be a fraction of the wavelength of light propagating in the dielectric waveguide, which can be from 1/10 to 1/2 of the wavelength of the light.

The upper dielectric cladding layer 26L may be formed by depositing a third dielectric material on the top surface of the core layer 24L and above the topmost surface of the at least one pad dielectric layer (16, 18), i.e., the top surface of the pad nitride layer 18. The third dielectric material can be the same as, or different from, the first dielectric material and can be formed by CVD or PVD. Portions of the third dielectric material layer that are located above the top surface of the top semiconductor layer 14 and the at least pad dielectric layer (16, 18) may be removed using a planarization process, such as, for example, chemical mechanical planarization (CMP) employing the top surface of the top semiconductor layer 14 as a stopping layer. The upper dielectric cladding layer 26L that that is formed has a top surface that is coplanar with the top surface of the top semiconductor layer 14. The thickness of the upper dielectric cladding layer 24L is selected to be greater than the wavelength of light propagating in the waveguide.

Figure 4:
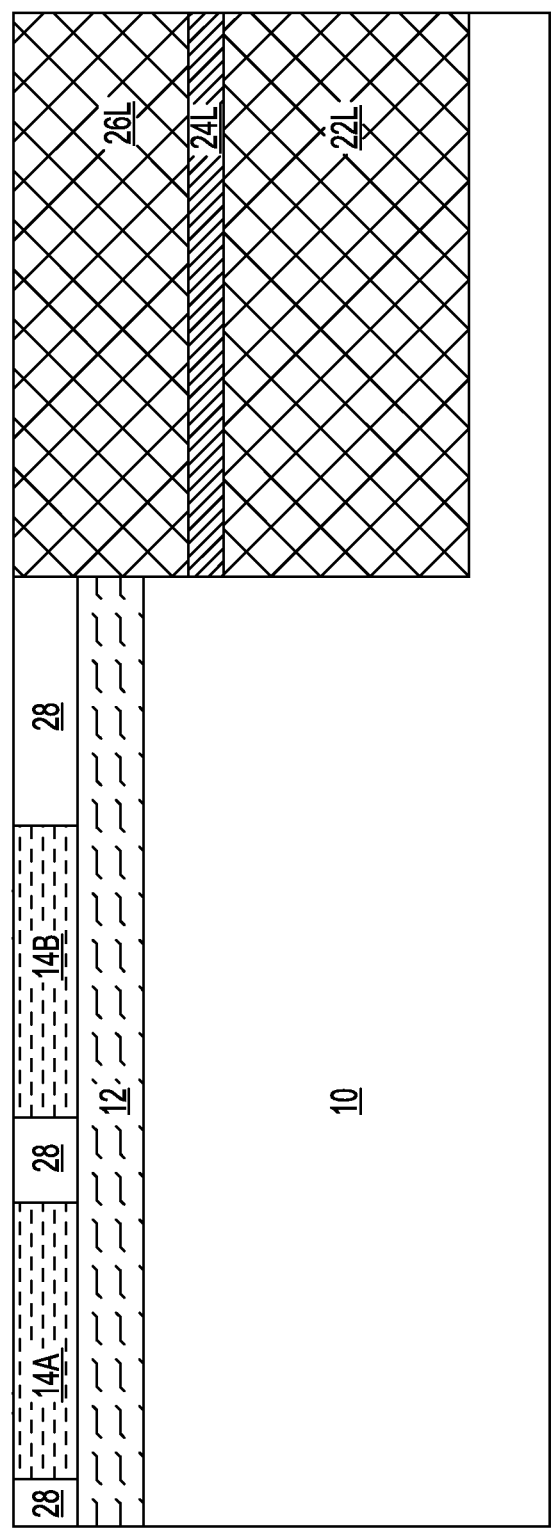
FIG. 4 is a cross-sectional view of the first exemplary semiconductor structure of FIG. 3 after forming shallow trench isolation (STI) structures in the top semiconductor layer to define a first device region and a second device region.
Figure 5:
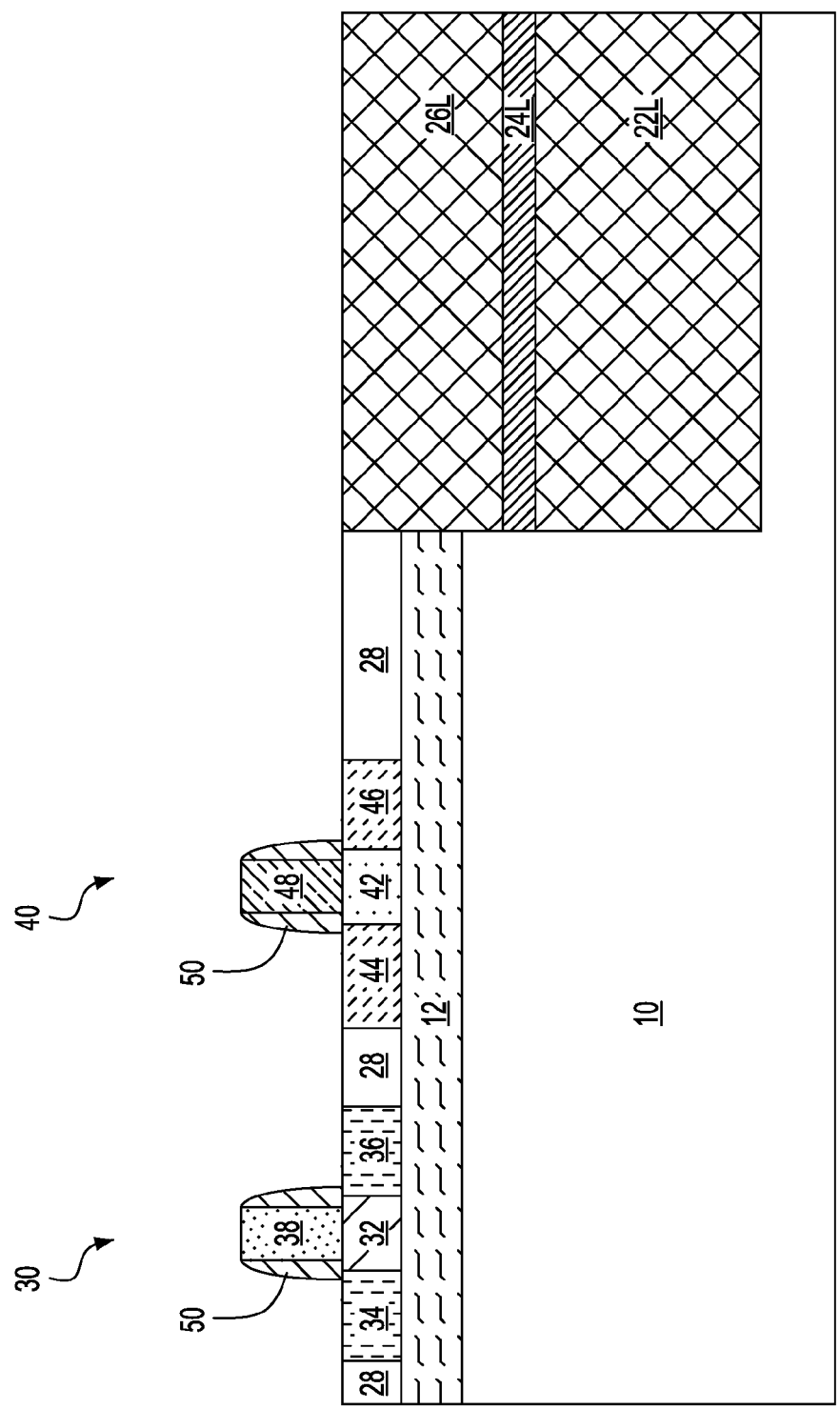
FIG. 5 is a cross-sectional view of the first exemplary semiconductor structure of FIG. 4 after forming a PNP bipolar junction transistor (BJT) in the first device region and an NPN BJT in the second device region.

Referring to FIG. 4, shallow trench isolation (STI) structures 28 are formed in the top semiconductor layer 14 to define transistor device regions. The STI structures 28 can be formed by forming shallow trenches (not shown) extending through the top semiconductor layer 14 and filling the shallow trenches with a dielectric material such as silicon oxide and/or silicon nitride. The shallow trenches can be formed, for example, by applying and lithographically patterning a photoresist layer (not shown) that is applied on the top surfaces of the top semiconductor layer 14 and the upper dielectric cladding layer 26L, and transferring the pattern in the photoresist layer through the top semiconductor layer 14 to expose the top surface of the buried insulator layer 12. After removal of the remaining photoresist layer, a dielectric material is deposited in the shallow trenches and subsequently planarized to form the STI structures 28. The STI structures 28 laterally surround and contact the remaining portion of the top semiconductor layer 14. The top surfaces of the STI structures 28 are coplanar with the top surface of the top semiconductor layer 14. In one embodiment and as shown in FIG. 4, the STI structures 28 define a first top semiconductor layer portion 14A in the first device region in which at least one first device having a first conductivity can be built and a second top semiconductor layer portion 14B in a second device region in which at least one second device having a second conductivity type opposite to the first conductivity type can be built. In one embodiment, the first device region is a p-type device region and is used in the fabrication of a PNP BJT 30 (FIG. 5), while the second device region is an n-type device region and is used in the fabrication of an NPN BJT 40 (FIG. 5). In some embodiments of the present application and when BJTs of a single conductivity type are formed in the top semiconductor layer 14, the STI structures 28 defines a single device region (not shown).

Referring to FIG. 5, at least one BJT is formed in a remaining portion of the top semiconductor layer 14. The at least one BJT can be a PNP BJT, an NPN BJT, or a pair of complementary PNP BJT and NPN BJT. In one embodiment and as shown in FIG. 5, a pair of complementary BJTs including a PNP BJT 30 located in the first device region and an NPN BJT 40 located in the second device region are formed.

The PNP BJT 30 includes a first intrinsic base 32, a first emitter 34 and a first collector 36 disposed in the first top semiconductor layer portion 14A in a lateral relationship with respect to each other. The first intrinsic base 32 is an n-type semiconductor region and the first emitter 34 and the first collector 36 are heavily-doped p-type semiconductor regions separated by the first intrinsic base 32. As used herein, heavy doping means introducing more than one dopant atom per one-hundred thousand atoms of silicon. The PNP BJT 30 also includes a first extrinsic base 38 contacting a top surface of the first intrinsic base 32. The first extrinsic base region 38 is a heavily-doped n-type semiconductor region. The first extrinsic base 38 is doped to a greater extent than the first intrinsic base 32.

The NPN BJT 40 includes a second intrinsic base 42, a second emitter 44 and a second collector 46 disposed in the second top semiconductor layer portion 14B in a lateral relationship with respect to each other. The second intrinsic base 42 is a p-type semiconductor region and the second emitter 44 and the second collector 46 are heavily-doped n-type semiconductor regions separated by the second intrinsic base 42. The second lateral bipolar transistor 40 also includes a second extrinsic base region 48 contacting a top surface of the second intrinsic base 42. The second extrinsic base region 48 is a heavily-doped p-type semiconductor region. The second extrinsic base 48 is doped to a greater extent than the first intrinsic base 42.

Each of the PNP BJT 30 and the NPN BJT 40 also includes a first dielectric spacer 50 present on each sidewall of the first and the second extrinsic base 38, 48.

The PNP BJT 30 and the NPN BJT 40 can be fabricated using techniques well known to those skilled in the art. For example, masked ion implantation steps can be first performed to dope the first top semiconductor layer portion 14A with n-type dopants while masking the second device region and dope the second top semiconductor layer portion 14B with p-type dopants while masking the first device region. The doping concentration of the n-type dopants in the first device region or the p-type dopants in the second device region may range from $1 \times 10^{17}$ parts/cm$^3$ to $1 \times 10^{19}$ parts/cm$^3$.

Next, a semiconductor material layer (not shown) is deposited over the top surfaces of the first and the second top semiconductor layer portions 14A, 14B, the STI structures 28 and the upper dielectric cladding layer 26L and lithographically patterned to form a patterned semiconductor material layer having a first portion contacting a portion of the first top semiconductor layer portion 14A from which the first extrinsic base 38 is derived and a second portion contacting a portion of the second top semiconductor layer portion 14B from which the second extrinsic base 48 is derived. The semiconductor material layer can include silicon or silicon germanium and can be deposited as an intrinsic semiconductor material layer by an epitaxial growth process. The thickness of the semiconductor material layer can be from 50 nm to 300 nm, although lesser and greater thicknesses can also be employed. Subsequently, the first portion of the patterned semiconductor material layer is doped with n-type dopants to provide the first extrinsic base 38 while the second device region is masked. The second portion of the patterned semiconductor material layer is doped with p-type dopants to provide the second extrinsic base 48 while the first device region is masked. The doping concentration in each of the first extrinsic base 38 and the second extrinsic base 48 may range from $5 \times 10^{19}$ parts/cm$^3$ to $5 \times 10^{20}$ parts/cm$^3$.

Next, first dielectric spacers 50 are formed by conformally depositing a first dielectric spacer material layer (not shown) around the first and second extrinsic bases 38, 48 and over the first and the second top semiconductor layer portions 14A, 14B, the STI structures 28 and the upper dielectric cladding layer 26L followed by an anisotropic etch to remove horizontal portions of the first dielectric spacer material layer. The first dielectric spacer material layer may include silicon oxide, silicon nitride or silicon oxynitride and may be formed by CVD or atomic layer deposition (ALD). The thickness of the first dielectric spacers 50 that are formed, as measured at the base that contact the first and the second top semiconductor layer portions 14A, 14B, can be from 10 nm to 300 nm, although lesser and greater thicknesses can also be employed.

Next, angled ion implantation is performed to dope portions of the first top semiconductor layer portion 14A located on opposite sides of the first extrinsic base 38 with p-type dopants while the second device region is masked. The first emitter 34 and the first collector 36 are thus formed in the first top semiconductor layer portion 14A. A remaining unimplanted region of the first top semiconductor portion 14A constitutes the first intrinsic base 32 that laterally contacts the first emitter 34 and the first collector 36. Subsequently, another angled ion implantation is performed to dope portions of the second top semiconductor layer portion 14B located on opposite sides of the second extrinsic base 48 with n-type dopants while the first device region is masked. The second emitter 44 and the second collector 46 are thus formed in the second top semiconductor layer portion 14B. A remaining unimplanted region of the second top semiconductor layer portion 14B constitutes the second intrinsic base 42 that laterally contacts the second emitter 44 and the second collector 46. The doping concentrations in the first emitter 34, the first collector 36, the second emitter 44, and the second collector 46 may range from $5 \times 10^{19}$ parts/cm$^3$ to $5 \times 10^{20}$ parts/cm$^3$.

Dopants in the PNP BJT 30 and the NPN BJT 40 may be subsequently activated by rapid thermal anneal such as, for example, laser anneal.

Figure 6:
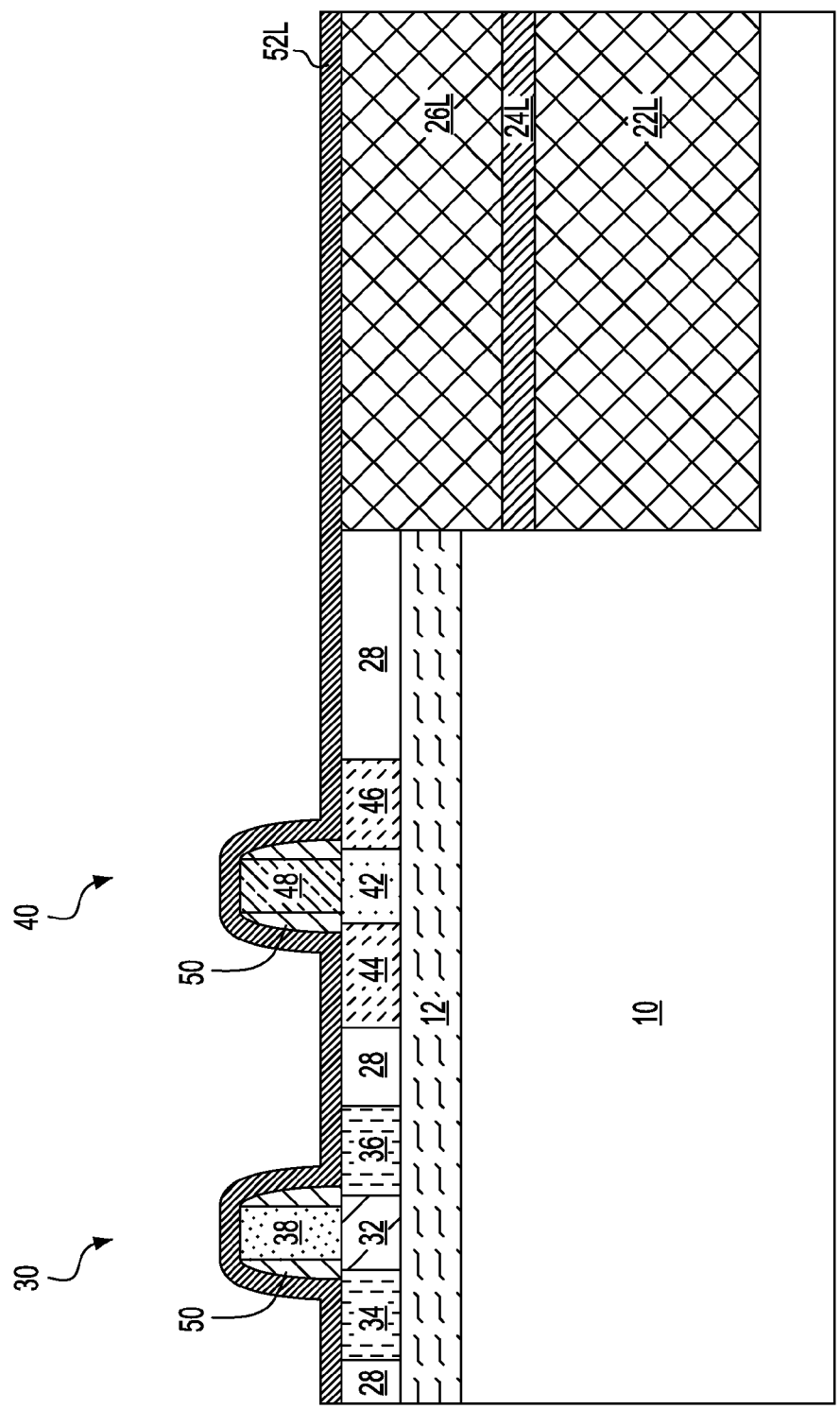
FIG. 6 is a cross-sectional view of the first exemplary semiconductor structure of FIG. 5 after forming a second dielectric spacer material layer over the SOI substrate and covering the PNP BJT, the NPN BJT, the STI structures and the dielectric waveguide material stack.

Referring to FIG. 6, a second dielectric spacer material layer 52L is formed over the SOI substrate 8 to cover the PNP BJT 30, the NPN BJT 40, the STI structures 28 and the upper dielectric cladding layer 26L. The second dielectric spacer material layer 52L may include silicon nitride or silicon oxynitride and may be conformally deposited by PECVD or ALD. The second dielectric spacer material layer 52L protects the PNP BJT 30 and the NPN BJT 40 during subsequent etching and deposition processes.

Figure 7:
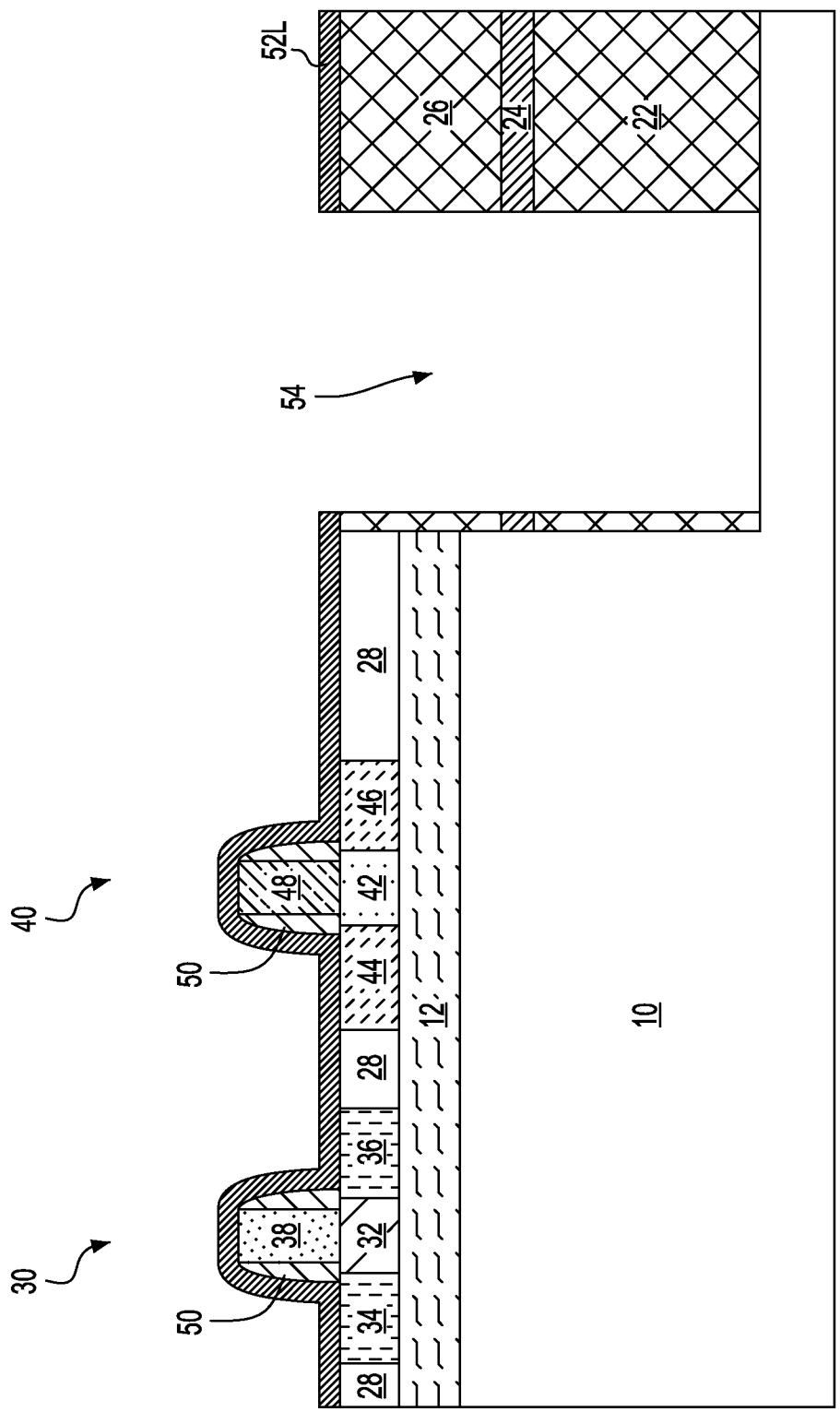
FIG. 7 is a cross-sectional view of the first exemplary semiconductor structure of FIG. 6 after forming a second trench extending through the dielectric waveguide material stack to re-expose a portion of a bottom surface of the first trench.

Referring to FIG. 7, a second trench 54 is formed extending through the dielectric waveguide material stack (22L, 24L, 26L) to re-expose a portion of the bottom surface of the first trench 20 (i.e., a sub-surface of the handle substrate 10).

The second trench 54 may be formed by applying a photoresist layer (not shown) over the second dielectric spacer material layer 52L and lithographically patterning the photoresist layer to form an opening therein. The pattern of the opening in the photoresist layer may be transferred into the second dielectric spacer material layer 52L by an anisotropic etch to form an opening in the second dielectric spacer material layer 52L. The anisotropic etch can be a dry etch such as, for example, RIE or a wet etch. The remaining photoresist layer is subsequently removed, for example, by ashing.

Subsequently, the pattern of the opening in the second dielectric spacer material layer 52L may be transferred through the dielectric waveguide material stack (22L, 24L, 26L) by an anisotropic etch that employs the second dielectric spacer material layer 52L as an etch mask to provide the second trench 54. The anisotropic etch can be a dry etch such as, for example, RIE or a wet etch. The second trench 54 defines a region within which an optoelectronic device such as a photodetector or a laser diode is subsequently formed. The remaining portion of the lower dielectric cladding layer 22L is herein referred to as a lower dielectric cladding portion 22. The remaining portion of the core layer 24L is herein referred to as a core portion 24. The remaining portion of the upper dielectric cladding layer 26L is herein referred to as an upper dielectric cladding portion 26. The lower dielectric cladding portion 22, the core portion 24 and the upper dielectric cladding portion 26 collectively constitute a dielectric waveguide (22, 24, 26).

Figure 8:
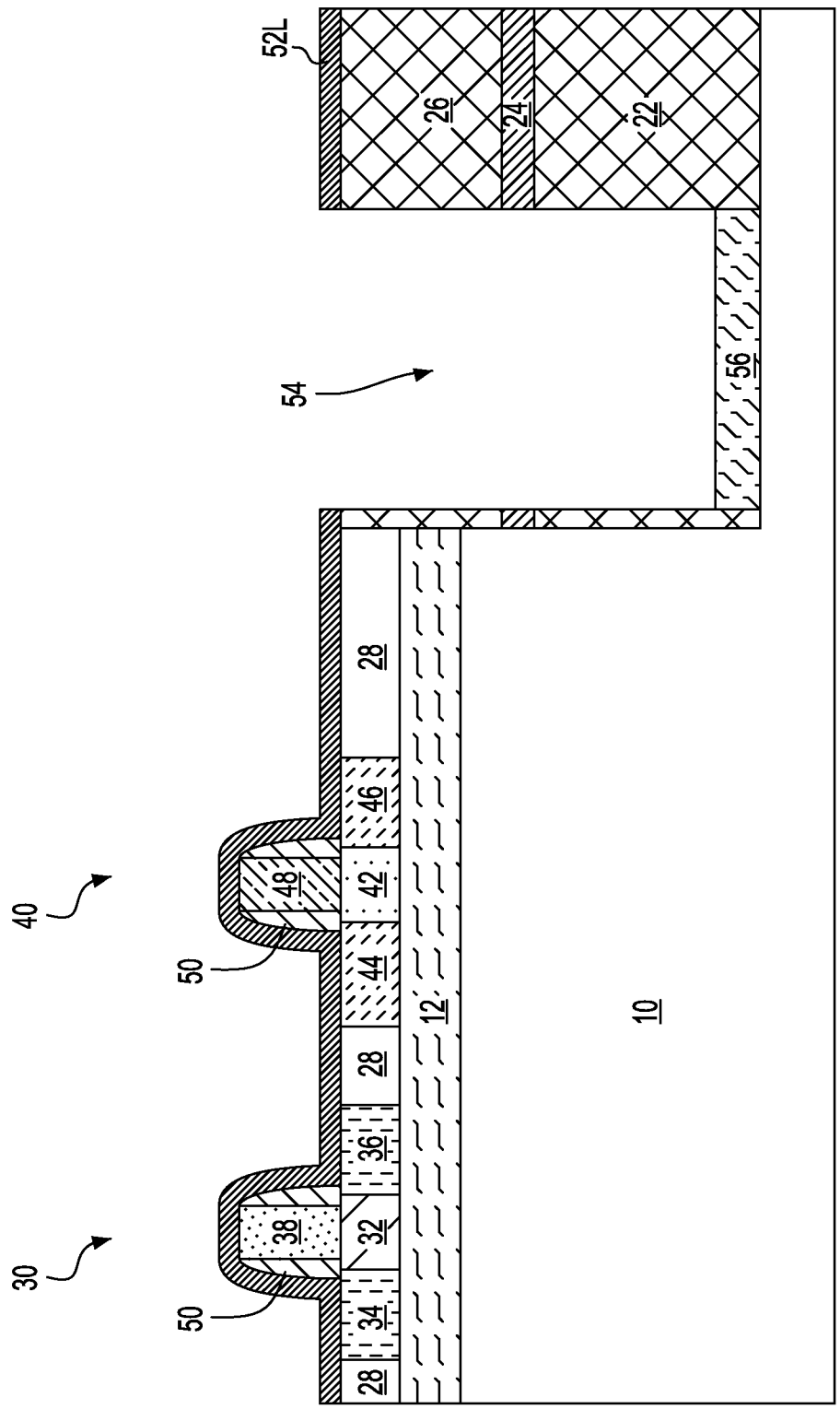
FIG. 8 is a cross-sectional view of the first exemplary semiconductor structure of FIG. 7 after forming a compound semiconductor seed layer on a bottom surface of the second trench.

Referring to FIG. 8, a compound semiconductor seed layer 56 is formed on the bottom surface of the second trench 54. The compound semiconductor seed layer 56 may include germanium or silicon germanium and may be formed by a selective epitaxy deposition. During the selective epitaxy deposition, the semiconductor material grows only on the semiconductor surface, such as the sub-surface of the handle substrate 10 that is physically exposed at the bottom of the second trench 54 and does not grow on dielectric surfaces, such as surfaces of the second dielectric spacer material layer 52L, the lower and the upper dielectric cladding portions 22, 24 and the core portion 24. The compound semiconductor seed layer 56 can be deposited by molecular beam epitaxy (MBE), metal-organic chemical vapor deposition (MOCVD), or any other epitaxial growth techniques known in the art, so that the compound semiconductor seed layer 56 is epitaxially aligned with the handle substrate 10. The thickness of the compound semiconductor seed layer 56 that is formed can be from 10 nm to 100 nm, although lesser and greater thicknesses can also be employed. Subsequently, the compound semiconductor seed layer 56 may be baked at 850° C. for 5 min before depositing another layer thereon.

Figure 9:
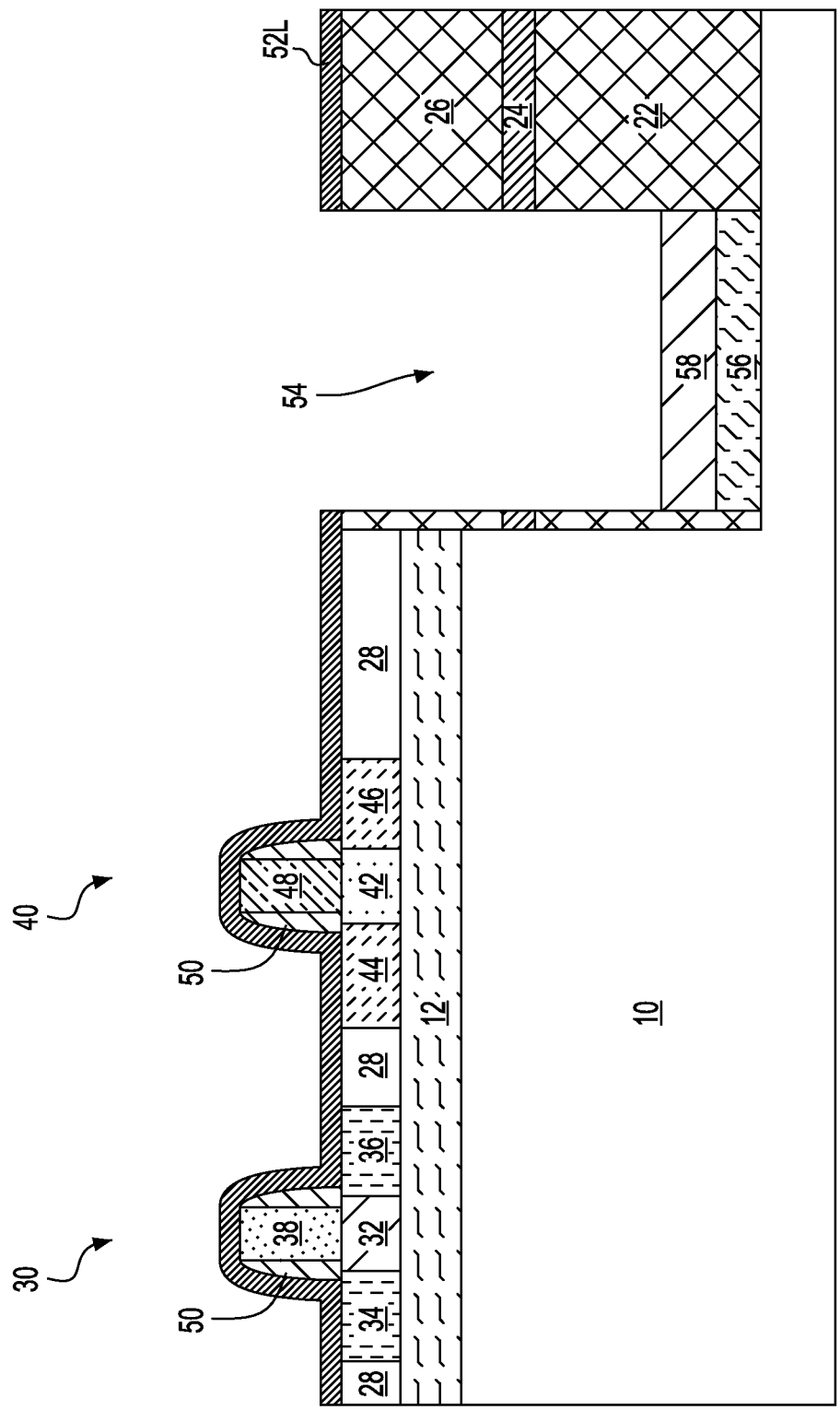
FIG. 9 is a cross-sectional view of the first exemplary semiconductor structure of FIG. 8 after forming a compound semiconductor buffer layer on the compound semiconductor seed layer.

Referring to FIG. 9, a compound semiconductor buffer layer 58 is formed on the compound semiconductor seed layer 56. The compound semiconductor buffer layer 58 is provided to reduce the lattice mismatch/strain which may exist between the constituent materials of a laser diode subsequently formed and the material of the compound semiconductor seed layer 56. The compound semiconductor buffer layer 58 may include an III-V compound semiconductor material that has a closely matched lattice structure with the underlying compound semiconductor seed layer 56. In one embodiment and when the compound semiconductor seed layer 56 includes germanium, the compound semiconductor buffer layer 58 may include GaAs. In another embodiment and when the compound semiconductor seed layer 56 includes silicon germanium, the compound semiconductor buffer layer 58 may include GaAsP. The compound semiconductor buffer layer 58 may be grown by selective epitaxy such as, for example, MBE or MOCVD so that the compound semiconductor buffer layer 58 can be epitaxially aligned with the compound semiconductor seed layer 56. The compound semiconductor buffer layer 58 that is formed may have a thickness from 50 nm to 500 nm, although lesser and greater thicknesses can also be employed.

Figure 10:
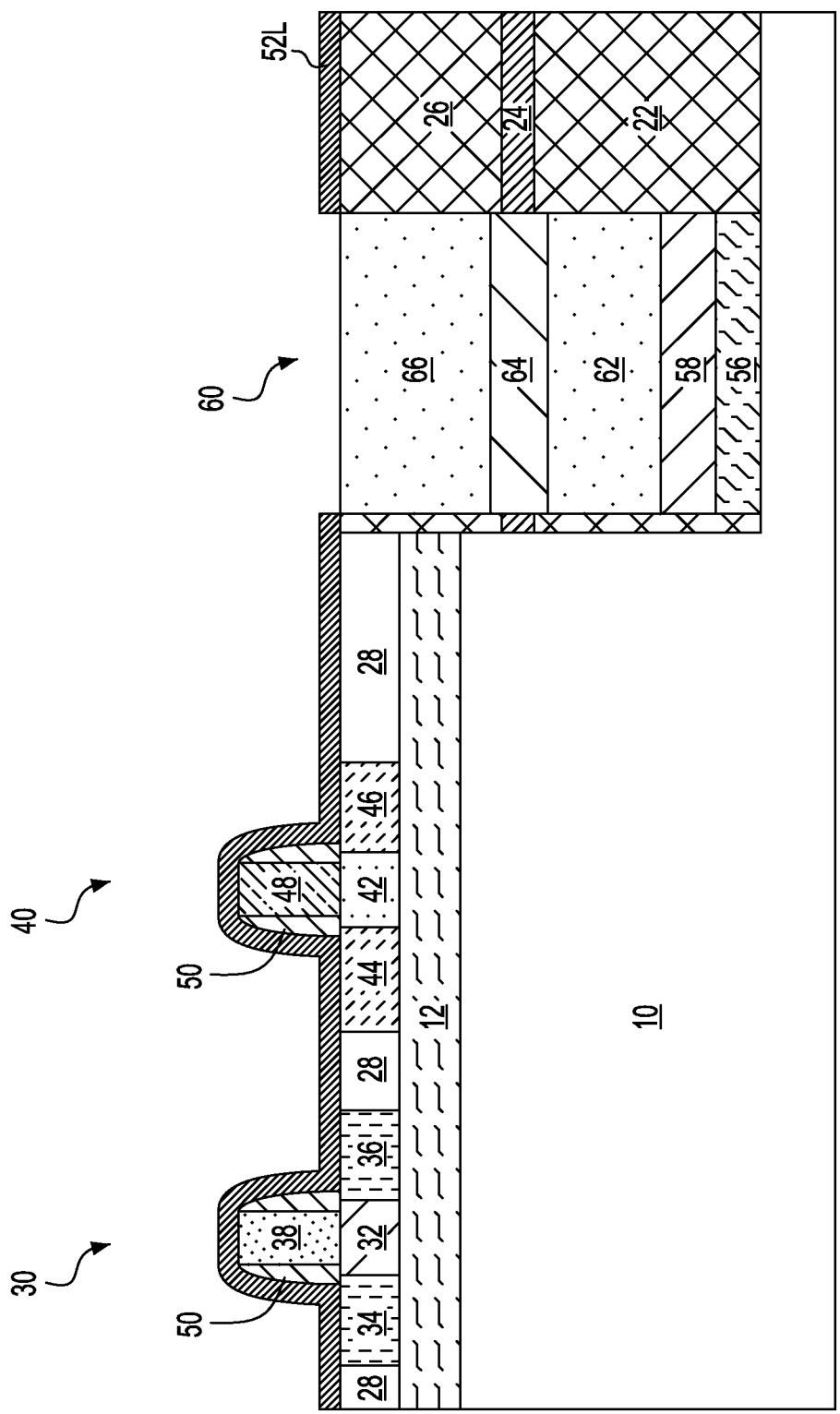
FIG. 10 is a cross-sectional view of the first exemplary semiconductor structure of FIG. 9 after forming a laser diode comprising a lower semiconductor cladding layer present on the compound semiconductor buffer layer, an active layer present on the lower semiconductor cladding layer and an upper semiconductor cladding layer present on the active layer in the second trench.

Referring to FIG. 10, an optoelectronic device is formed on top of the compound semiconductor buffer layer 58 and is edge coupled to the dielectric waveguide (22, 24, 26). In one embodiment, the optoelectronic device is a laser diode 60. The emission direction of the laser diode 60 is oriented toward the dielectric waveguide (22, 24, 26). The laser diode 60 includes an active layer 64 sandwiched between a lower semiconductor cladding layer 62 having a first conductivity and an upper semiconductor cladding layer 66 having a second conductivity type opposite the first conductivity. In one embodiment, the lower semiconductor cladding layer 62 is of an n-type conductivity, and the upper semiconductor cladding layer 66 is of a p-type conductivity. The active layer 64 is laterally aligned to and abutting the core portion 24 of the dielectric waveguide (22, 24, 26) so that the light emitted from the laser diode 60 is effectively coupled to the dielectric waveguide (22, 24, 26) and guided by the dielectric waveguide (22, 24, 26).

Each of the lower semiconductor cladding layer 62 and the upper semiconductor cladding layer 66 may include a first compound semiconductor material. The active layer 64 may include a second compound semiconductor material capable of emitting stimulated radiation when the lower semiconductor cladding layer 62 and the upper semiconductor cladding layer 66 are forward biased. The second compound semiconductor material that is employed in the active layer 64 can be the same as, or different from, the first compound semiconductor material that is employed in the lower and upper semiconductor cladding layers 62, 66. The second compound semiconductor material preferably has a bandgap smaller than that of the first compound semiconductor material so that electrons and holes injected from the lower and upper semiconductor cladding layers 62, 66 can be effectively confined in the active layer 64. In one embodiment, each of the lower and the upper semiconductor cladding layers 62, 66 includes AlGaAs, and the active layer 64 includes GaAs.

The compound semiconductor materials of the lower and upper semiconductor cladding layers 62, 66 and the active layer 64 may be deposited employing a selective epitaxy deposition, in which the compound semiconductor materials grow from semiconductor surfaces and does not grow from dielectric surfaces. Each of the lower semiconductor cladding layer 62 and the upper semiconductor cladding layer 66 that are formed may have a thickness about 1 μm. The active layer 64 that is formed may have a thickness from 100 nm to 500 nm. The thickness of the active layer 64 is selected to be greater than thickness of the core portion 24 of the dielectric waveguide (22, 24, 26) such that the top surface of the core portion 24 is located below the top surface of the active layer 64 while the bottom surface of the core portion 24 is located above the bottom surface of the active layer 64, thus allowing effective light coupling to the core portion 24.

In one embodiment, the lower semiconductor cladding layer 62 and the upper semiconductor cladding layer 66 may be doped in-situ during the selective epitaxy deposition of the first compound semiconductor material. In another embodiment, the lower semiconductor cladding layer 62 and the upper semiconductor cladding layer 66 may be deposited as intrinsic compound semiconductor material layers by selective epitaxy deposition of an intrinsic first compound semiconductor material, which can be subsequently doped by implanting n-type or p-type dopants, respectively.

Figure 11:
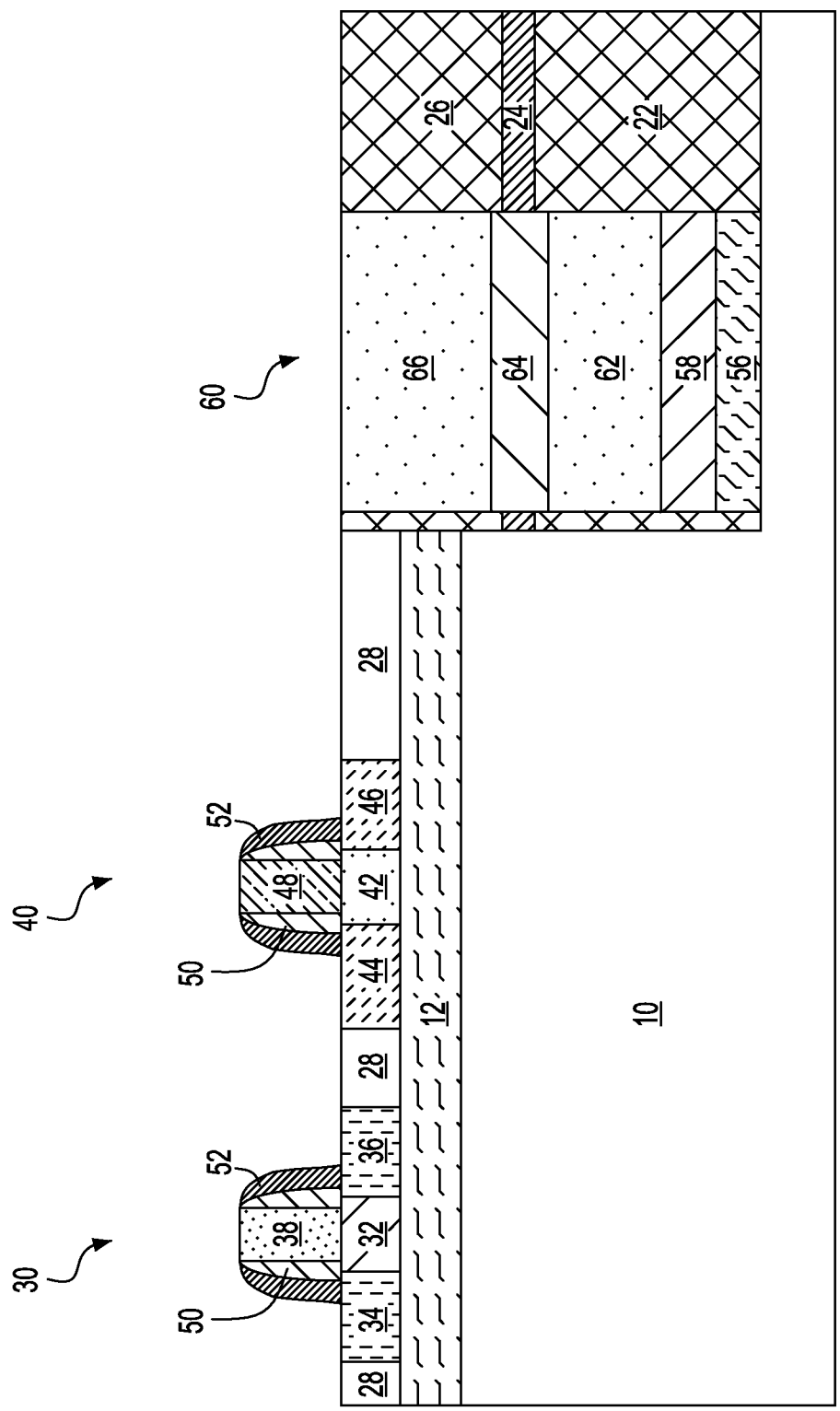
FIG. 11 is a cross-sectional view of the first exemplary semiconductor structure of FIG. 10 after forming a second dielectric spacer on each sidewall of the PNP BJT and the NPN BJT.

Referring to FIG. 11, a second dielectric spacer 52 is formed on each sidewall of the first dielectric spacer 50. The second dielectric spacer 52 may be formed by removing horizontal portions of the second dielectric spacer material layer 52L by an anisotropic etch such as RIE. The remaining vertical portions of the second dielectric spacer material layer 52L present on the sidewalls of the first dielectric spacers 50 constitute the second dielectric spacer 52.

Figure 12:
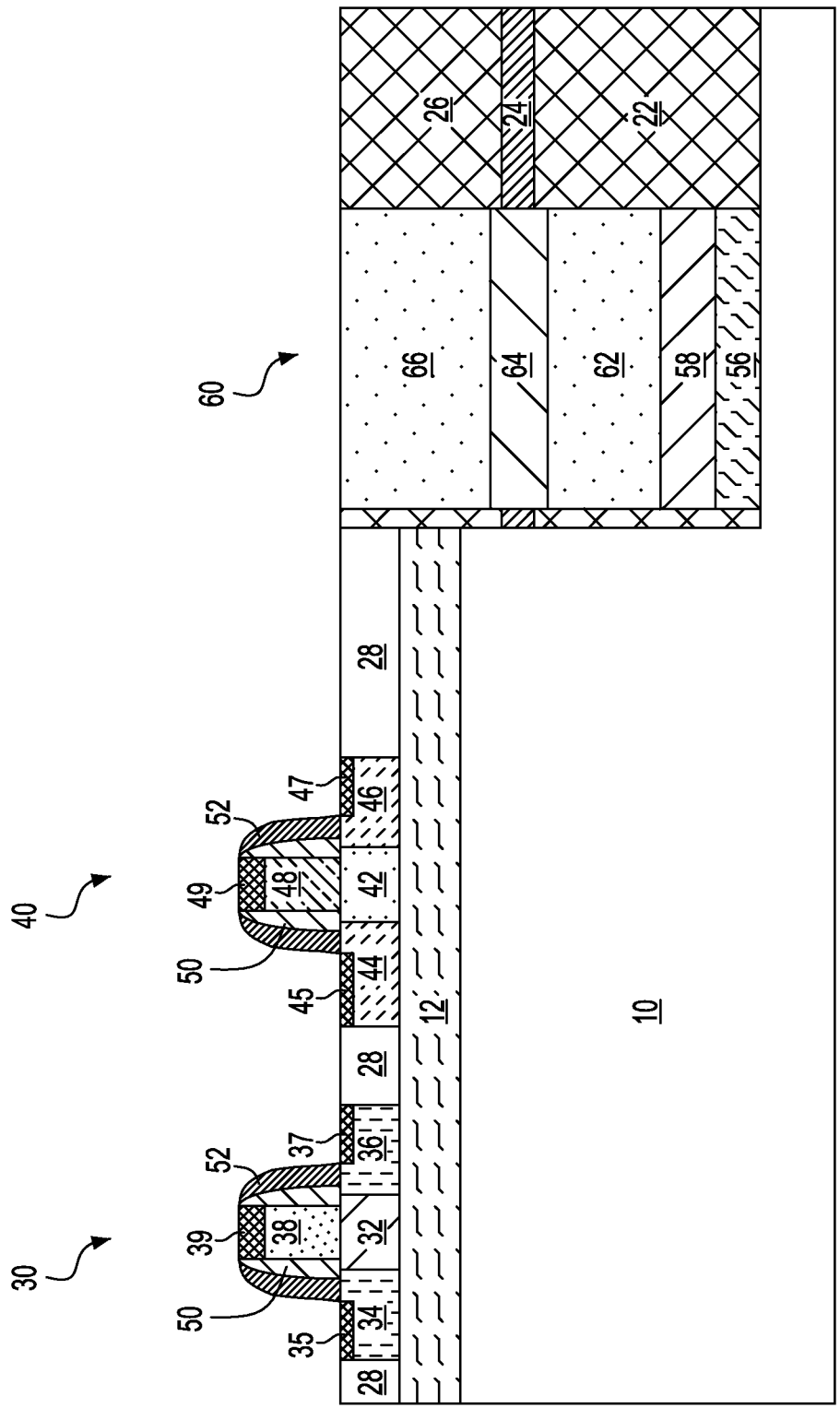
FIG. 12 is a cross-sectional view of the first exemplary semiconductor structure of FIG. 11 after forming metal semiconductor alloy regions on various elements of the PNP BJT and the NPN BJT.

Referring to FIG. 12, metal semiconductor alloy regions are optionally formed on various elements of the PNP BJT 30 and the NPN BJT 40. The metal semiconductor alloy regions include a first emitter-side metal semiconductor alloy region 35 formed on the first emitter 34, a first collector-side metal semiconductor alloy region 37 formed on the first collector, and a first base-side metal semiconductor alloy region 39 formed on the first extrinsic base 38. The second metal semiconductor alloy regions also include a second emitter-side metal semiconductor alloy region 45 formed on the second emitter 44, a second collector-side metal semiconductor alloy region 47 formed on the second collector 46, and a second base-side metal semiconductor alloy region 49 formed on the second extrinsic base 48. The metal semiconductor alloy regions (35, 37, 39, 45, 47, 49) may be formed, for example, by depositing a metal layer, inducing formation of the metal semiconductor alloy regions during an anneal at an elevated temperature, and subsequently removing unreacted portions of the metal layer selective to the metal semiconductor alloy regions. The metal semiconductor alloy regions (35, 37, 39, 45, 47, 49) may contain a metal silicide or a metal germanide.

Figure 13:
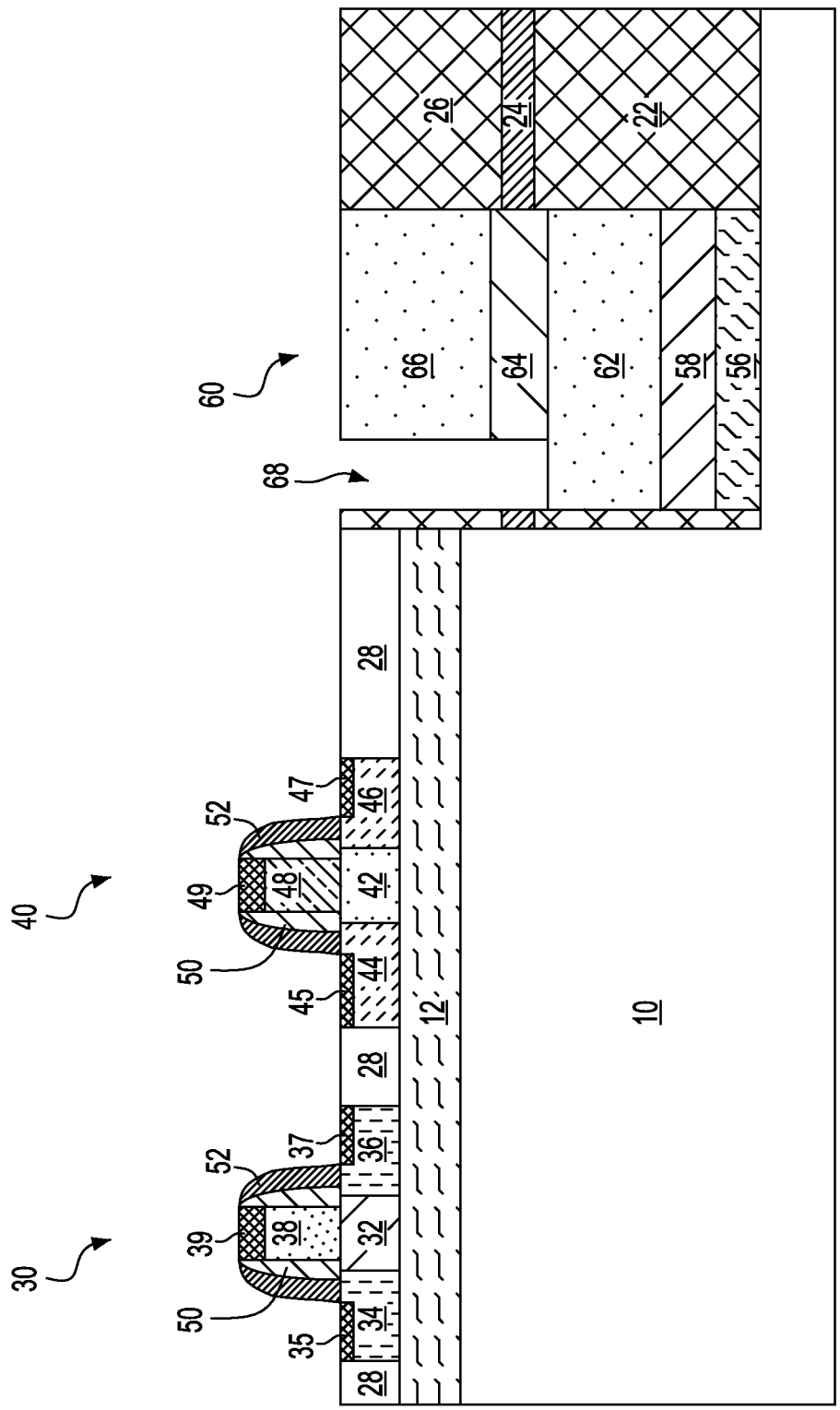
FIG. 13 is a cross-sectional view of the first exemplary semiconductor structure of FIG. 12 after providing an opening extending through the upper semiconductor cladding layer and the active layer to expose a portion of the lower semiconductor cladding layer.

Referring to FIG. 13, an opening 68 is formed extending through the upper semiconductor cladding layer 66 and the active layer 64 to physically expose a portion of the lower semiconductor cladding layer 62. The opening 68 may be formed by applying a photoresist layer (not shown) over the entire semiconductor structure of FIG. 12 and lithographically patterning the photoresist layer to form an opening therein. The pattern of opening in the photoresist layer can be transferred into the upper semiconductor cladding layer 66 and the active layer 64 by an anisotropic etch to form the opening 68. The anisotropic etch can be a dry etch such as, for example, RIE or a wet etch. The remaining photoresist layer is subsequently removed, for example, by ashing.

Figure 14:
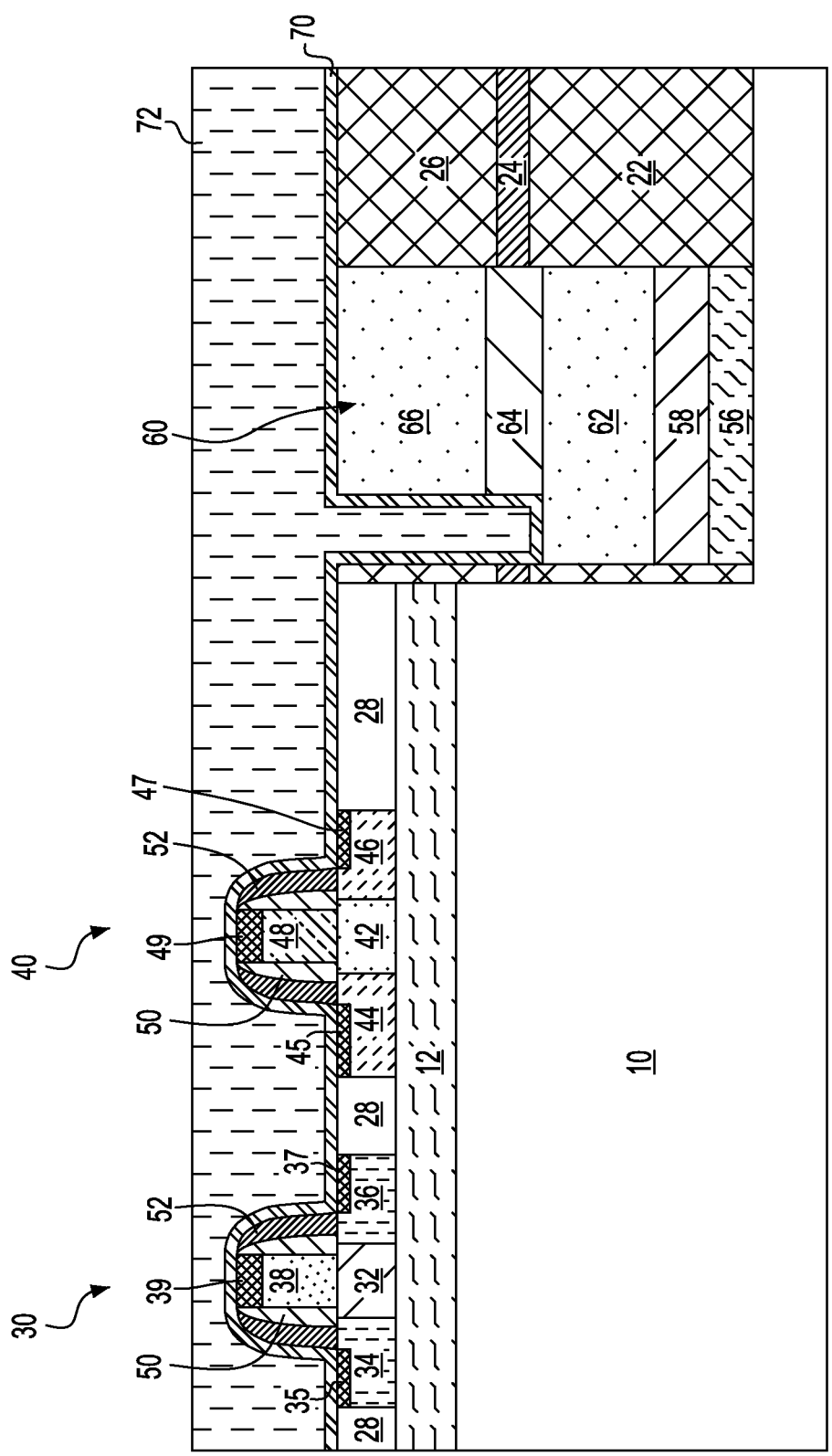
FIG. 14 is a cross-sectional view of the first exemplary semiconductor structure of FIG. 13 after forming a dielectric cap layer on the exposed surfaces of the PNP BJT, the NPN BJT, the second dielectric spacers, the STI structures, the opening, the laser diode and the remaining portion of the dielectric waveguide material stack and an interlevel dielectric (ILD) layer on the dielectric cap layer.

Referring to FIG. 14, a dielectric cap layer 70 is conformally deposited on the exposed surfaces of the semiconductor structure of FIG. 13 utilizing a conventional deposition process such as, for example, CVD or ALD. The dielectric cap layer 70 is typically composed of a dielectric nitride such as, for example, silicon nitride, silicon oxynitride, silicon boron nitride or silicon carbon oxynitride. The dielectric cap layer 70 functions as an etch stopping layer in the subsequent contact via open process. The thickness of the dielectric cap layer 70 can be from 5 nm to 30 nm, although lesser and greater thicknesses can be employed. In some embodiments of the present application, the dielectric cap layer 70 is optional and can be omitted.

Next, an interlevel dielectric (ILD) layer 72 is deposited to cover the dielectric cap layer 70 and to completely fill the opening 68. The ILD layer 72 may include a dielectric material that is different from the dielectric material of the dielectric cap layer 70. In one embodiment, when the dielectric cap layer 70 includes silicon nitride, the ILD layer 72 may include a dielectric oxide such as silicon oxide. The ILD layer 72 may be formed, for example, by CVD or spin-coating. The ILD layer 72 may be self-planarizing, or the top surface of the ILD 72 can be planarized, for example, by CMP. In one embodiment, the planarized top surface of the ILD layer 72 is located above the topmost surfaces of the PNP BJT 30 and NPN BJT 40.

Figure 15:
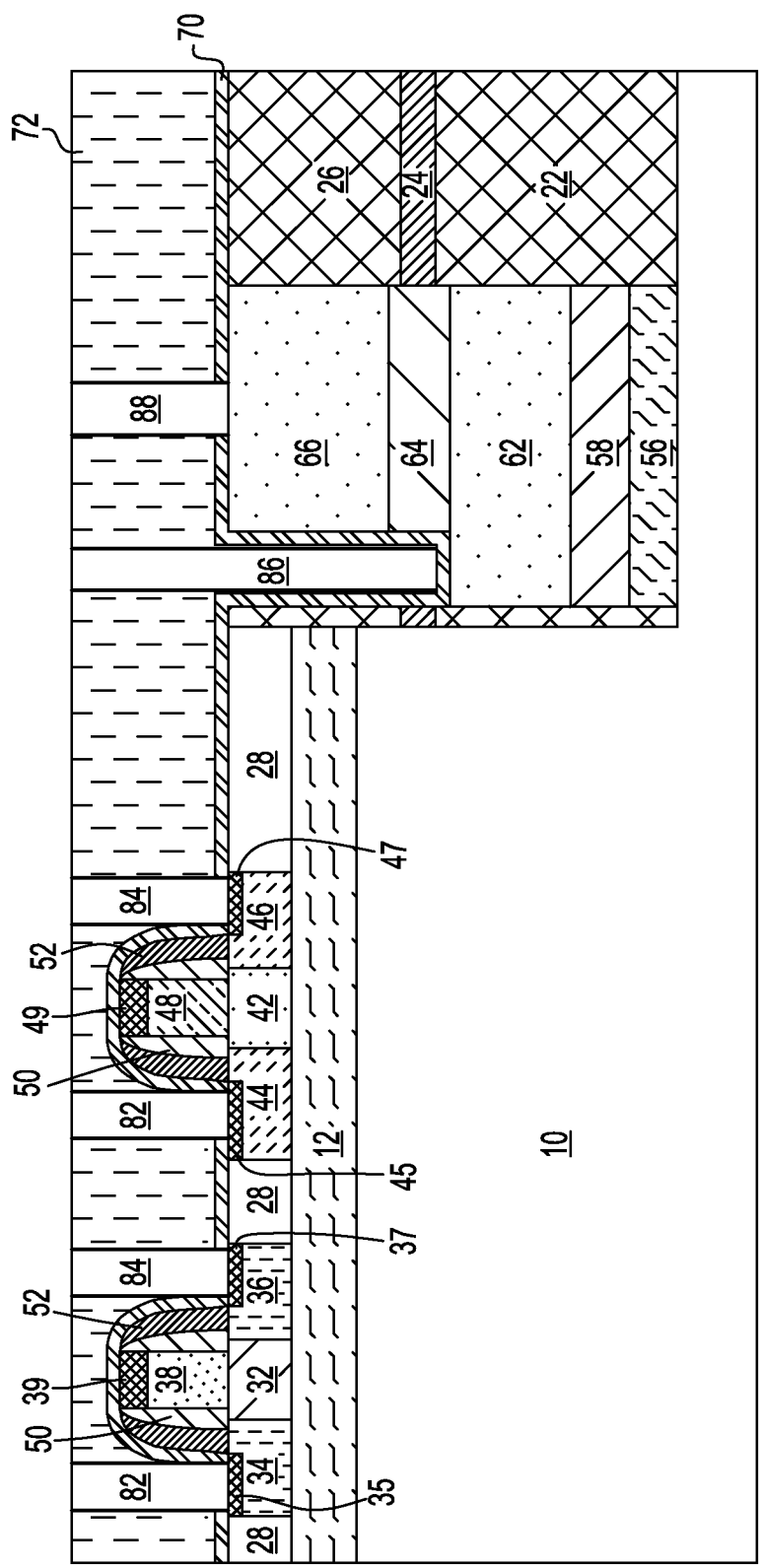
FIG. 15 is a cross-sectional view of the first exemplary semiconductor structure of FIG. 14 after forming contact via structures through the ILD layer and the dielectric cap layer to provide electrical contacts to various elements of the PNP and NPN BJTs and the laser diode.

Referring to FIG. 15, contact via structures are formed through the ILD layer 72 and the dielectric cap layer 70 to provide electrical contacts to various elements of the PNP BJT 30, NPN BJT 40 and the laser diode 60. The contact via structures may include emitter-side contact via structures 82 in contact with the first and the second emitters 34, 44, or the first and second emitter-side metal semiconductor alloy regions 35, 45, if present, and collector-side contact via structures 84 in contact with the first and the second collectors 36, 46, or the first and the second collector-side metal semiconductor alloy regions 37, 47, if present. The contact via structures may also include a first cladding conduct via structure 86 in contact with the lower semiconductor cladding layer 62 and a second cladding contact via structure 88 in contact with the upper semiconductor cladding layer 62. The contact via structures (82, 84, 86 88) may be formed by formation of contact via openings (not shown) by a combination of lithographic patterning and anisotropic etch followed by deposition of a conductive material (e.g., tungsten) and planarization that removes an excess portions of the conductive material from above the top surface of the ILD layer 72. In one embodiment, a separate step of lithographic patterning and etching may be need when forming a deep contact via opening that exposes a portion of the lower semiconductor cladding layer 62. Optionally, contact liners (not shown) may be formed on the sidewalls and bottoms surfaces of the contact via openings before filling the contact via openings with the conductive material. The contact liners may include TiN.

Figure 16:
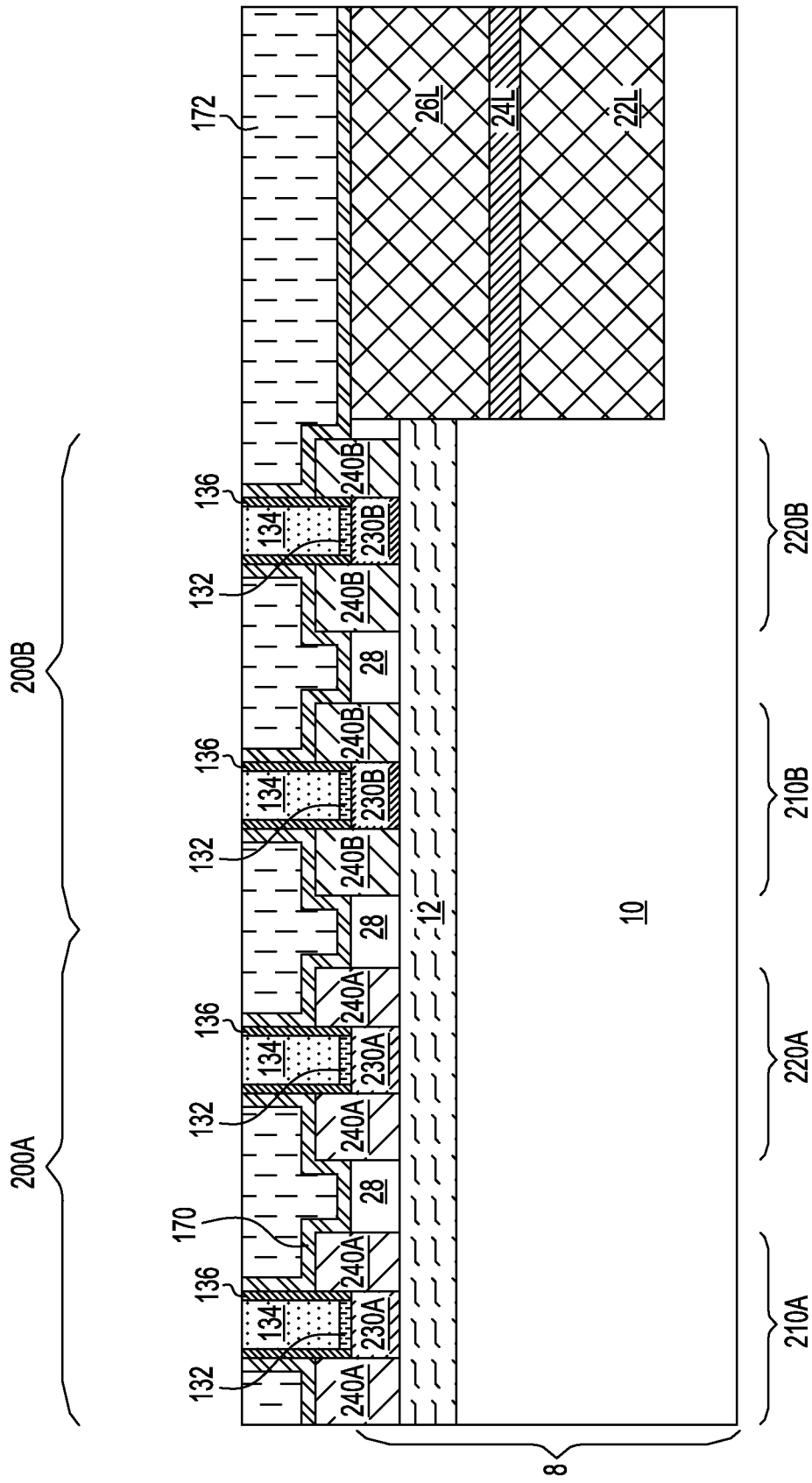
FIG. 16 is a cross-sectional view of a second exemplary semiconductor structure that can be derived from the first exemplary semiconductor structure of FIG. 4 after forming PMOS transistors comprising sacrificial gate stacks in the first device region and NMOS transistors comprising sacrificial gate stacks in the second device region and an ILD layer laterally surrounding the sacrificial gate stacks according to a second embodiment of the present application.

Referring to FIG. 16, a second exemplary semiconductor structure of the present application according to a second embodiment of the present application is derived from the first exemplary semiconductor structure of FIG. 4 by first forming sacrificial gate structures in the first device region 200A and the second device region 200B. In one embodiment, the first device region 200A is a p-type device region including a p-type metal-oxide-semiconductor (PMOS) sub-region 210A and a PNP BJT sub-region 220A, and the second device region 200B is an n-type device region including an n-type metal-oxide-semiconductor (NMOS) sub-region 210B and an NPN BJT sub-region 220B.

Each of the sacrificial gate structures includes a sacrificial gate stack of a sacrificial gate dielectric 132 and a sacrificial gate conductor 134. The sacrificial gate stacks (132, 134) can be formed using conventional techniques known in the art. For example, the sacrificial gate stacks (132, 134) may be formed by depositing a stack of sacrificial gate material layers including a sacrificial gate dielectric layer and a sacrificial gate conductor layer and patterning the sacrificial gate material layers using lithography and anisotropic etch. In one embodiment, the sacrificial gate dielectric layer may include silicon oxide, while the sacrificial gate conductor layer may include polysilicon.

Each of the sacrificial gate structures further includes a gate spacer 136 present on each sidewall of the sacrificial gate stack (132, 134). The gate spacers 136 may be formed by conformally depositing or growing a dielectric spacer material layer, followed by an anisotropic etch that removes the horizontal portion of the dielectric spacer material layer. In one embodiment, the gate spacers 136 may include silicon nitride.

Next, a first source region and a first drain region (collectively referred to as first source/drain regions 240A) may be formed on opposite sides of each of the sacrificial gate structures (132, 134, 136) in the p-type device region 200A and a second source region and a second drain region (collectively referred to as second source/drain regions 240B) may be formed on opposite sides of each of the sacrificial gate structures (132, 134, 136) in the n-type device region 200B utilizing block mask technology. In one embodiment, the first source/drain regions 240A may be formed by implanting p-type dopants into portions of the first top semiconductor layer portion 14A employing the sacrificial gate structures (132, 134, 136) in the p-type device region 200A as an implantation mask while masking the n-type device region 200B. The second source/drain regions 240B may be formed by implanting n-type dopants into portions of the second top semiconductor layer portion 14B employing the sacrificial gate structures (132, 134, 136) in the n-type device region 200B as an implantation mask while masking the p-type device region 200A. In another embodiment and as shown in FIG. 16, the first source/drain regions 240A and the second source/drain regions 240B are raised source/drain regions and may be formed by a selective epitaxy process. For example, the first source/drain regions 240 may be formed by first recessing portions of the first top semiconductor layer portion 14A that are not covered by the sacrificial gate structures (132, 134, 136) in the p-type device region 200A and epitaxially depositing a first semiconductor material on the recessed surface of the first top semiconductor layer portion 14A while masking the n-type device region 200B. In one embodiment, the first semiconductor material is SiGe with the strain effect tuned to enhance the performance of p-type transistors. The first source/drain regions 240A are doped with p-type dopants. The doping of the first source/drain regions 240A may be performed during deposition of the first source/drain regions 240A by in-situ doping, or can be performed by ion implantation after deposition of the first source/drain regions 240A. The second source/drain regions 240B may be formed by first recessing portions of the second top semiconductor layer portion 14B that are not covered by the sacrificial gate structures (132, 134, 136) in the n-type device region 200B and epitaxially depositing a second semiconductor material on the recessed surface of the second top semiconductor layer portion 14B while masking the p-type device region 200A. In one embodiment, the second semiconductor material is Si:C with the strain effect tuned to enhance the performance of n-type transistors. The second source/drain regions 240B are doped with n-type dopants. The doping of the second source/drain regions 240B may be performed during deposition of the second source/drain regions 240B by in-situ doping, or can be performed by ion implantation after deposition of the second source/drain regions 240B. Each remaining portion of the first top semiconductor layer portion 14A laterally contacting the first source/drain regions 240A constitutes a first channel portion 230A. Each remaining portion of the second top semiconductor layer portion 14B laterally contacting the second source/drain regions 240B constitute a second channel portion 230B.

Next, processing steps described above in FIG. 14 may be performed to form a dielectric cap layer 170 over the sacrificial gate structures (132, 134, 136), the first and second source/drain regions 240A, 240B, the STI structures 28 and the upper dielectric cladding layer 26L and an ILD layer 172 over the dielectric cap layer 170. Portions of the dielectric cap layer 170 and the ILD layer 172 that are located above the topmost surfaces of the gate structures (132, 134, 136), i.e., the top surface of the sacrificial gate conductor 134, may be removed by CMP or a recess etch. The topmost surfaces of the dielectric cap layer 170 and the ILD layer 172 are thus coplanar with the topmost surface of the sacrificial gate structure (132, 134, 136).

Figure 17:
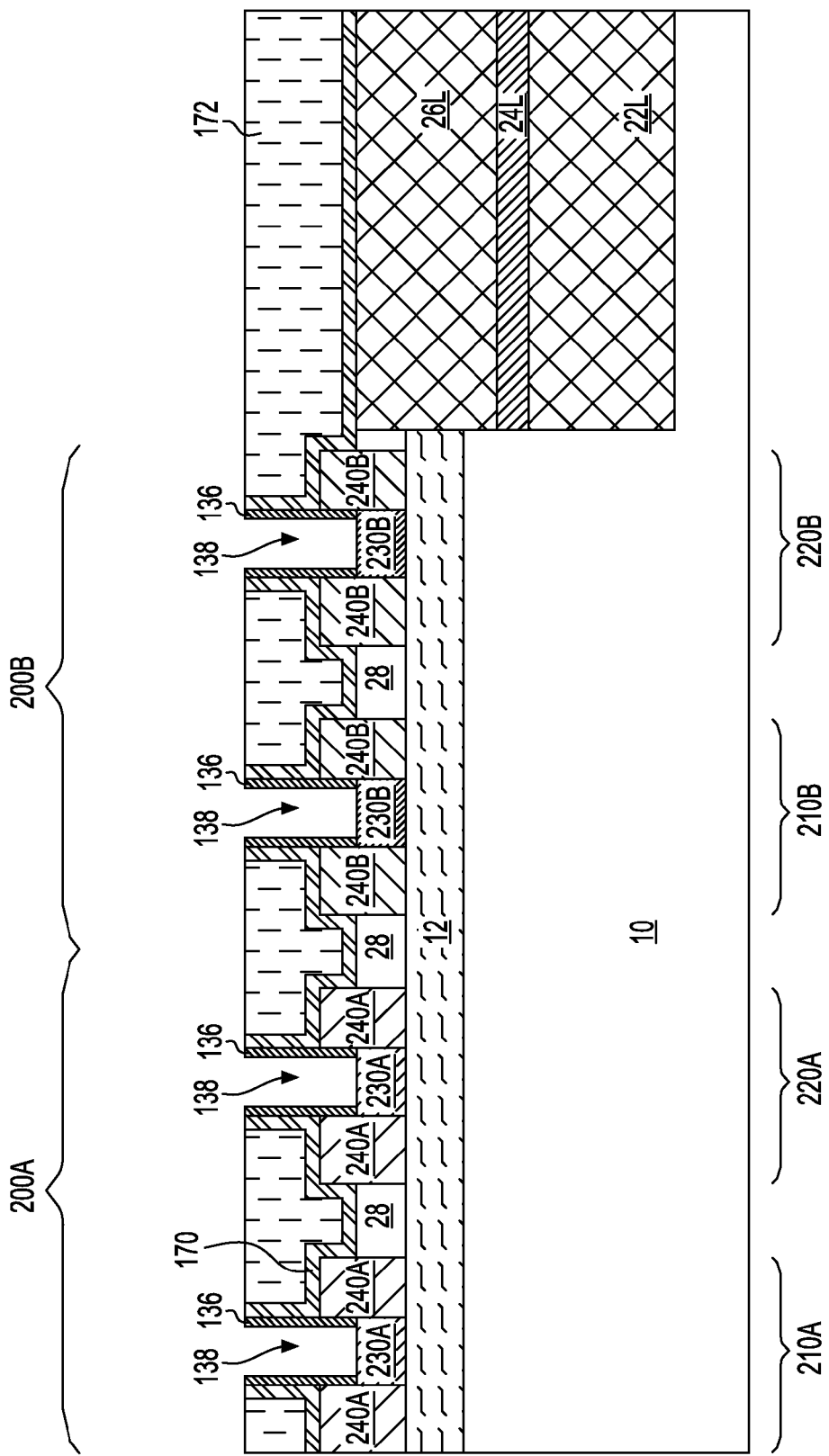
FIG. 17 is a cross-sectional view of the second exemplary semiconductor structure of FIG. 16 after removing sacrificial gate stacks to provide trenches in the first device region and the second device region.

Referring to FIG. 17, the sacrificial gate stacks (132, 134) are removed to provide trenches 138. The sacrificial gate stacks (132, 134) may be removed selective to the gate spacers 136 and the first and second channel portions 230A, 230B by any suitable etching technique known in the art. For example, the sacrificial gate stacks (132, 134) may be selectively etched by a wet etch such as an ammonia etch or a dry etch such as RIE. Each of the trenches 138 occupies a volume from which each sacrificial gate stack (132, 134, 136) is removed and is laterally confined by the gate spacers 136.

Figure 18:
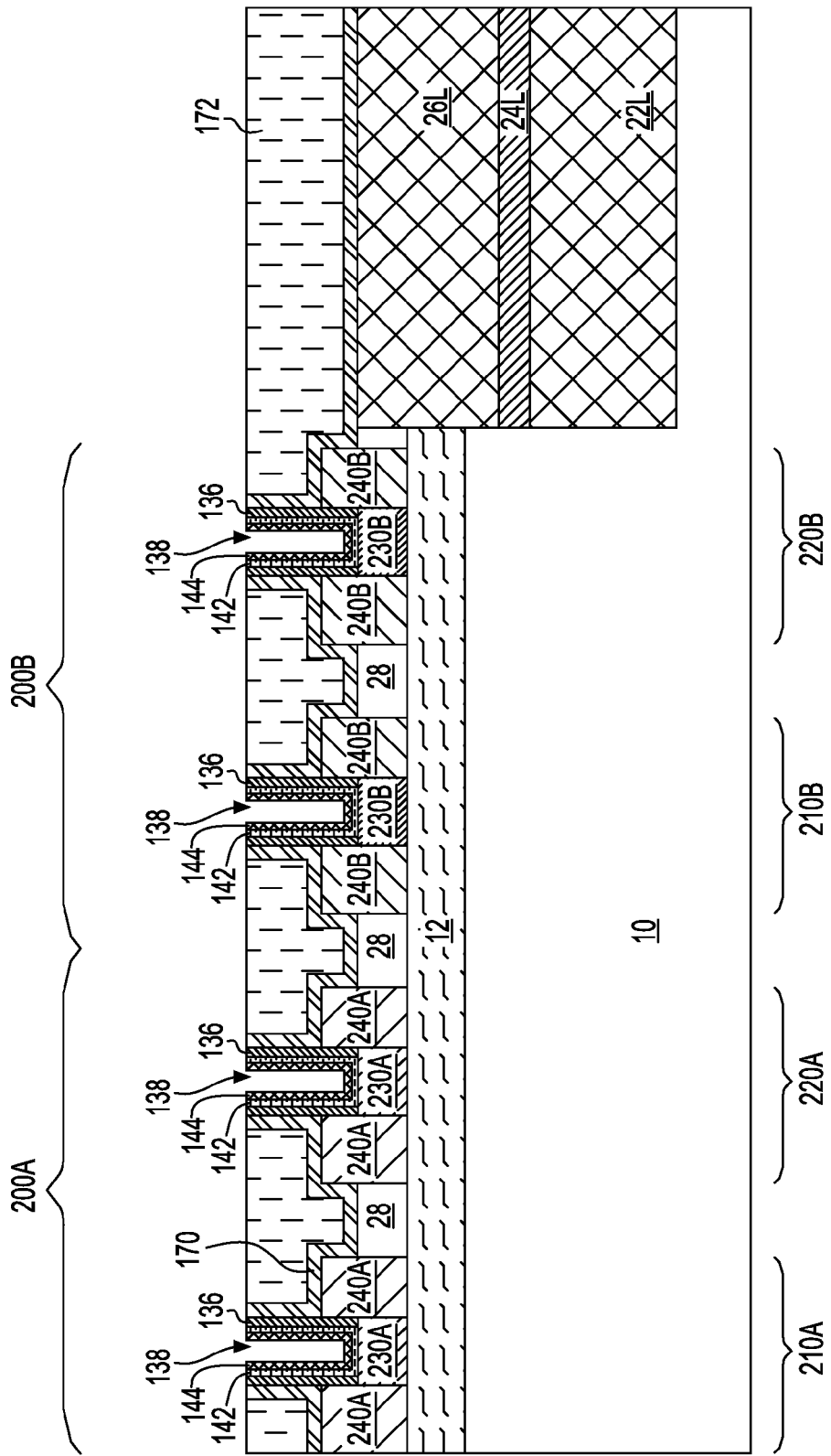
FIG. 18 is a cross-sectional view of the second exemplary semiconductor structure of FIG. 17 after forming a U-shaped gate dielectric in each of the trenches and a U-shaped sacrificial metal layer portion on the gate dielectric.

Referring to FIG. 18, a gate dielectric 142 is formed on sidewalls and the bottom surface of each of the trenches 138 following by formation of a sacrificial metal layer portion 144 on the gate dielectric 142. As shown, the gate dielectric 142 and the sacrificial metal layer portion 144 are both U-shaped. The gate dielectric 142 may be formed by conformally depositing a gate dielectric layer (not shown) on sidewalls and bottom surfaces of the trenches 138 and to the topmost surfaces of the dielectric cap layer 170 and the ILD layer 172 by any suitable deposition technique known in the art, such as, for example, CVD or ALD. The gate dielectric layer that is formed may have a thickness ranging from 1 nm to 5 nm, although lesser and greater thicknesses can also be employed. The gate dielectric layer may include silicon oxide, or alternatively a high-k dielectric, such as $HfO_2$, $ZrO_2$, $La_2O_3$, $Al_2O_3$, $TiO_2$, $SrTiO_3$, $LaAlO_3$ or $Y_2O_3$.

Following the deposition of the gate dielectric layer, a sacrificial metal layer (not shown) may be conformally deposited on top of the gate dielectric layer by CVD or ALD. The sacrificial metal layer that is formed may have a thickness ranging from 3 nm to 10 nm, although lesser and greater thicknesses can also be employed. In one embodiment, the sacrificial metal layer may include titanium nitride, titanium carbide or tantalum nitride.

Portions of the gate dielectric layer and the sacrificial metal layer that are located above the topmost surface of the ILD layer 172 are removed by a planarization process, such as, for example, CMP. The remaining portion of the gate dielectric layer within each trench 138 constitutes the gate dielectric 142. The remaining portion of the sacrificial metal layer within each trench 138 constitutes the sacrificial metal layer portion 144.

Figure 19:
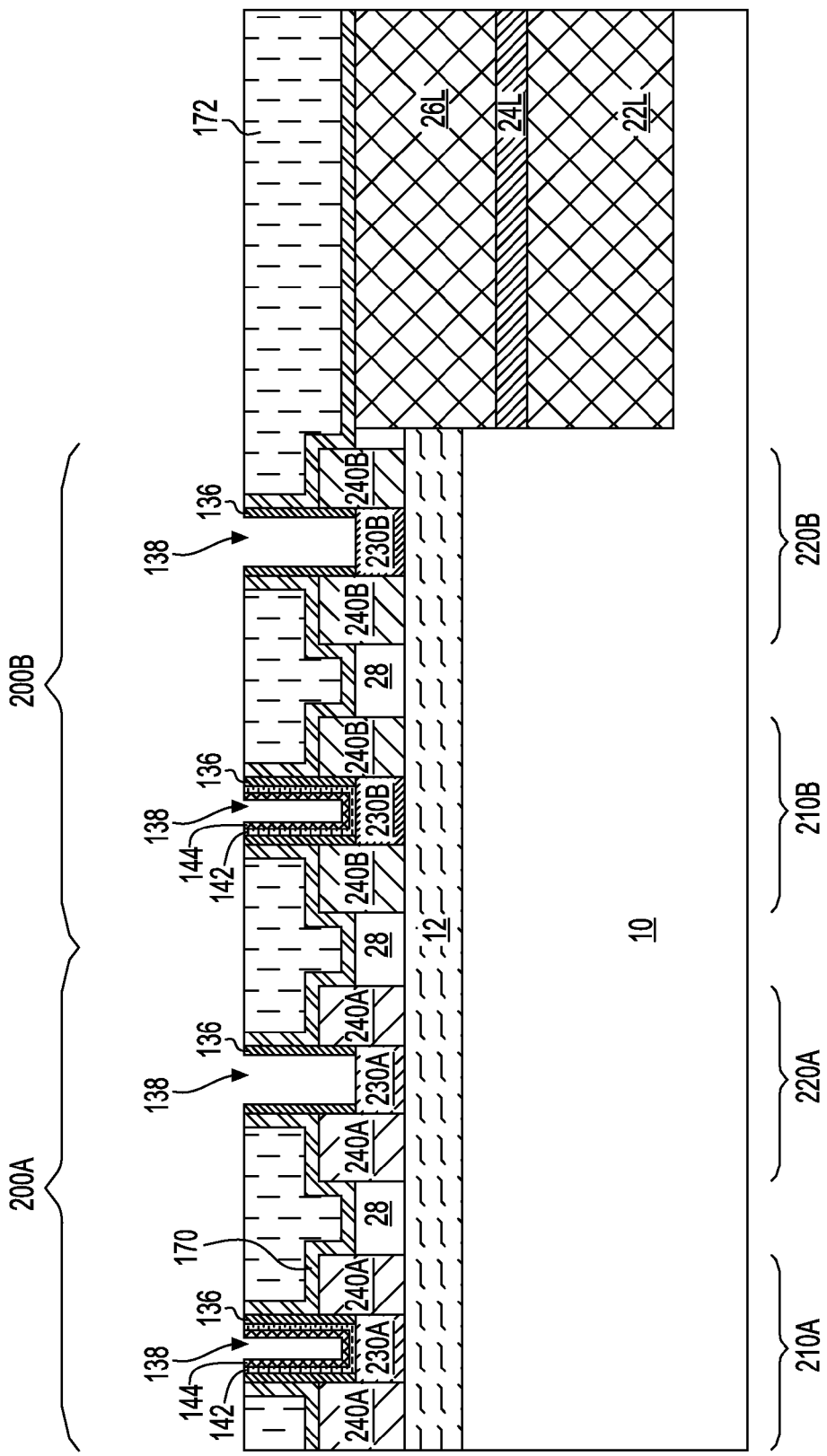
FIG. 19 is a cross-sectional view of the second exemplary semiconductor structure of FIG. 18 after removing the sacrificial metal layer portion and the gate dielectric from the trenches in a PNP BJT sub-region of the first device region and an NPN BJT sub-region of the second device region.

Referring to FIG. 19, the gate dielectric 142 and the sacrificial metal layer portion 144 are removed from the trenches 138 in the PNP BJT sub-region 220A and the NPN BJT sub-region 220B selective to the gate spacers 136 and the first and the second channel portions 230A, 230B while masking the PMOS and NMOS sub-regions 210A, 210B by a first photoresist layer (not shown). The sidewalls and the bottom surfaces of the trenches 138 in the PNP BJT sub-region 220A and the NPN BJT sub-region 220B are thus re-exposed. After removing the gate dielectric 142 and the sacrificial metal layer portion 144 from the trenches 138 in the PNP BJT sub-region 220A and the NPN BJT sub-region 220B, the first photoresist layer may be removed utilizing a conventional resist stripping process such as, for example, ashing.

Figure 20:
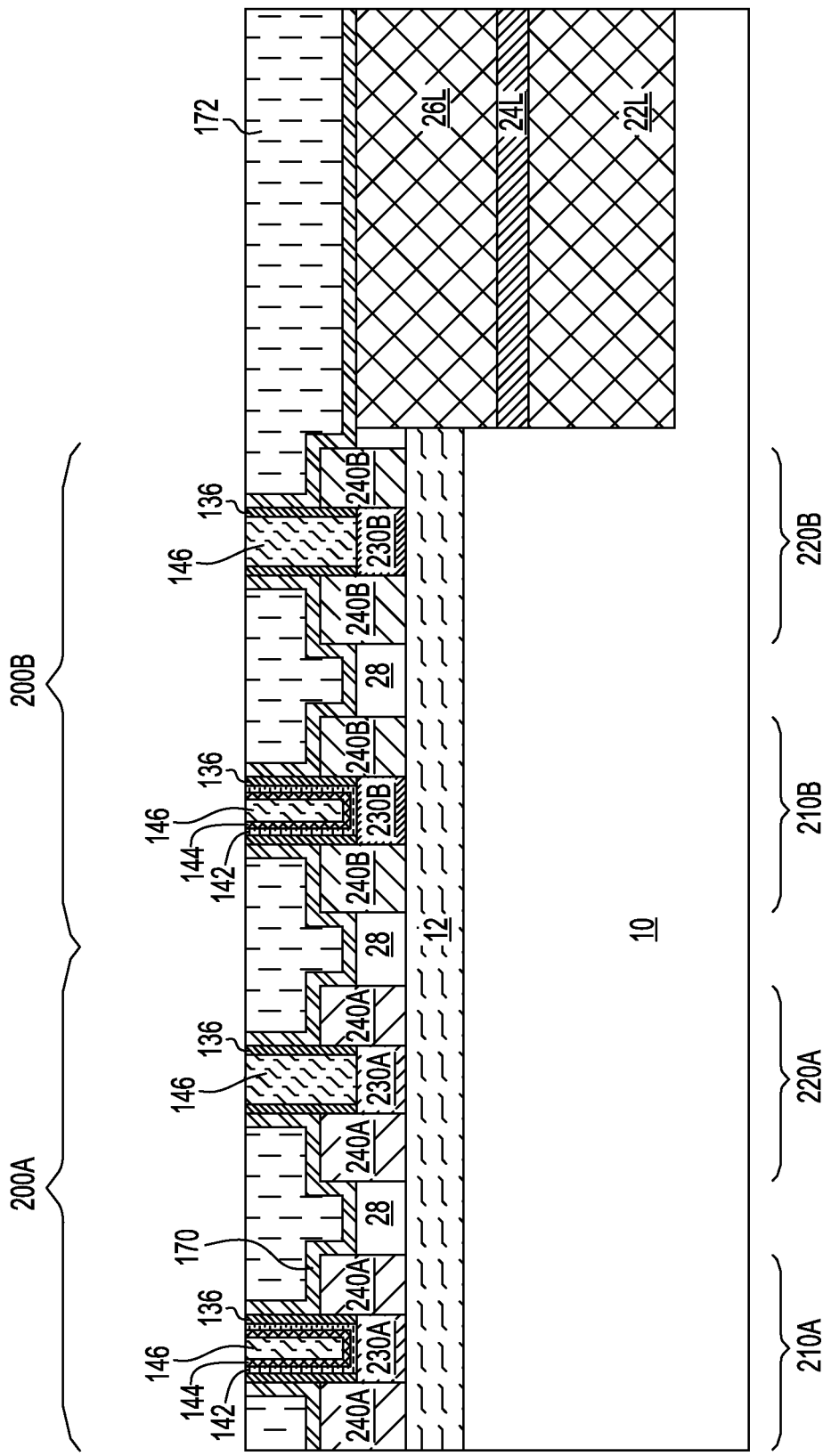
FIG. 20 is a cross-sectional view of the second exemplary semiconductor structure of FIG. 19 after forming semiconductor cap layer portions within the trenches in the first and the second device regions.

Referring to FIG. 20, semiconductor cap layer portions 146 may be deposited within the trenches 138. In the PMOS and NMOS sub-regions 210A, 210B, the semiconductor cap layer portions 146 may be formed on top of the sacrificial metal layer portions 144, filling the remaining volume within the trenches 138. In the PNP BJT and NPN BJT sub-regions 220A, 220B, the semiconductor cap layer portions 146 may substantially fill the trenches 138. The semiconductor cap layer portions 146 may be formed by any deposition method known in the part, including but not limited to, CVD and PECVD and by removing excess semiconductor materials from the topmost surfaces of the dielectric cap layer 170 and the ILD layer 172. In one embodiment, the semiconductor cap layer portions 146 may include an amorphous silicon (a-Si) material or a polycrystalline silicon material. The semiconductor cap layer portion 146 provides a medium to form an n-type or a p-type semiconductor material that may constitute an extrinsic base for the PNP BJT or NPN BJT respectively, as described in the steps below.

Figure 21:
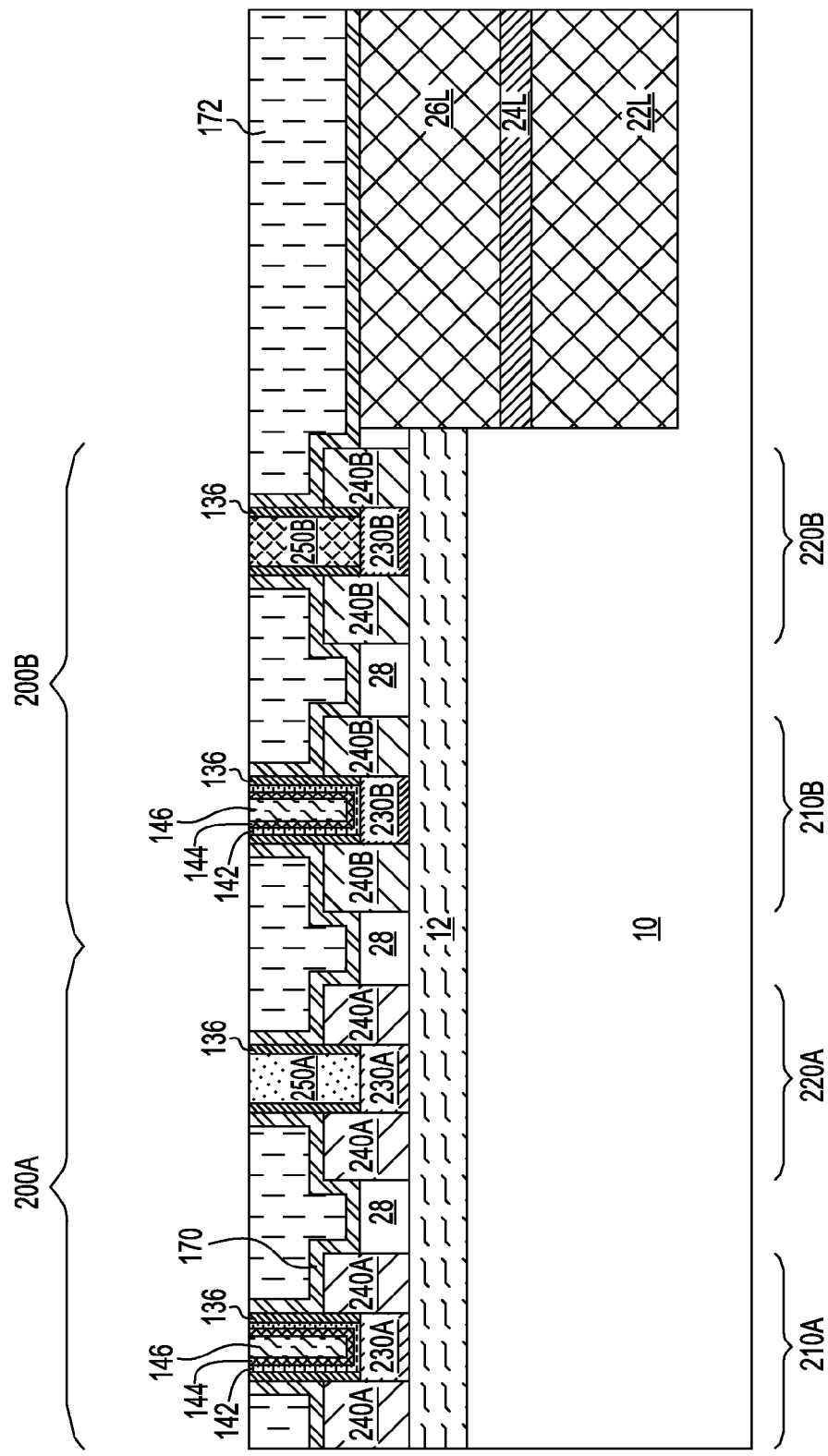
FIG. 21 is a cross-sectional view of the second exemplary semiconductor structure of FIG. 20 after forming an n-type extrinsic base within the trench in the PNP BJT sub-region of the first device region and a p-type extrinsic base within the trench in the NPN BJT sub-region of the second device region.

Referring to FIG. 21, an n-type extrinsic base 250A is formed in the PNP BJT sub-region 220A and a p-type extrinsic base 250B is formed in the NPN BJT sub-region 220B. The n-type extrinsic base 250A may be formed by first forming a second photoresist layer (not shown) to cover the PMOS, NMOS and NPN BJT sub-regions 210A, 210B, 220B, while exposing the PNP BJT sub-region 220A. Ion implantation may be subsequently performed to dope the exposed portion of the semiconductor cap layer 146 in the PNP BJT sub-region 220A with n-type dopants, such as phosphorus or arsenic, to provide the appropriate polarity to the semiconductor cap layer portion 146, thus forming the n-type extrinsic base 250A for a PNP BJT. The n-type extrinsic base 250A provides a low resistance contact to the underlying channel portion 230A which is typically referred to as an intrinsic base of the PNP BJT. It should be noted that in BJTs the p-type first source/drain regions 240A are typically referred to as p-type emitter-collector regions. The second photoresist layer may be subsequently removed utilizing a conventional resist stripping process such as, for example, ashing.

The p-type extrinsic base 250B may be formed by first forming a third photoresist layer (not shown) to cover the PMOS, NMOS and PNP BJT sub-regions 210A, 210B, 220A, while exposing the NPN BJT sub-region 220B. Ion implantation may be subsequently performed to dope the exposed portion of the semiconductor cap layer portion 146 in the NPN BJT sub-region 220B with p-type dopants, such as boron to provide the appropriate polarity to the semiconductor cap layer portion 146, thus forming the p-type extrinsic base 250B for an NPN BJT. The p-type extrinsic base 250B provides a low resistance contact to the underlying channel portion 230B which is typically referred to as an intrinsic base of the NPN BJT. It should be noted that in BJTs the n-type second source/drain regions 240B are typically referred to as n-type emitter-collector regions. The third photoresist layer may be subsequently removed utilizing a conventional resist stripping process such as, for example, ashing.

Subsequently, an annealing process may be conducted to activate the dopants in the second exemplary structure of FIG. 21 and to remove the crystal structure damage caused by ion irradiation. The annealing process may be conducted by any method known in the art, for example, rapid thermal annealing. The annealing temperature may range from 800° C. to 1000° C.

Figure 22:
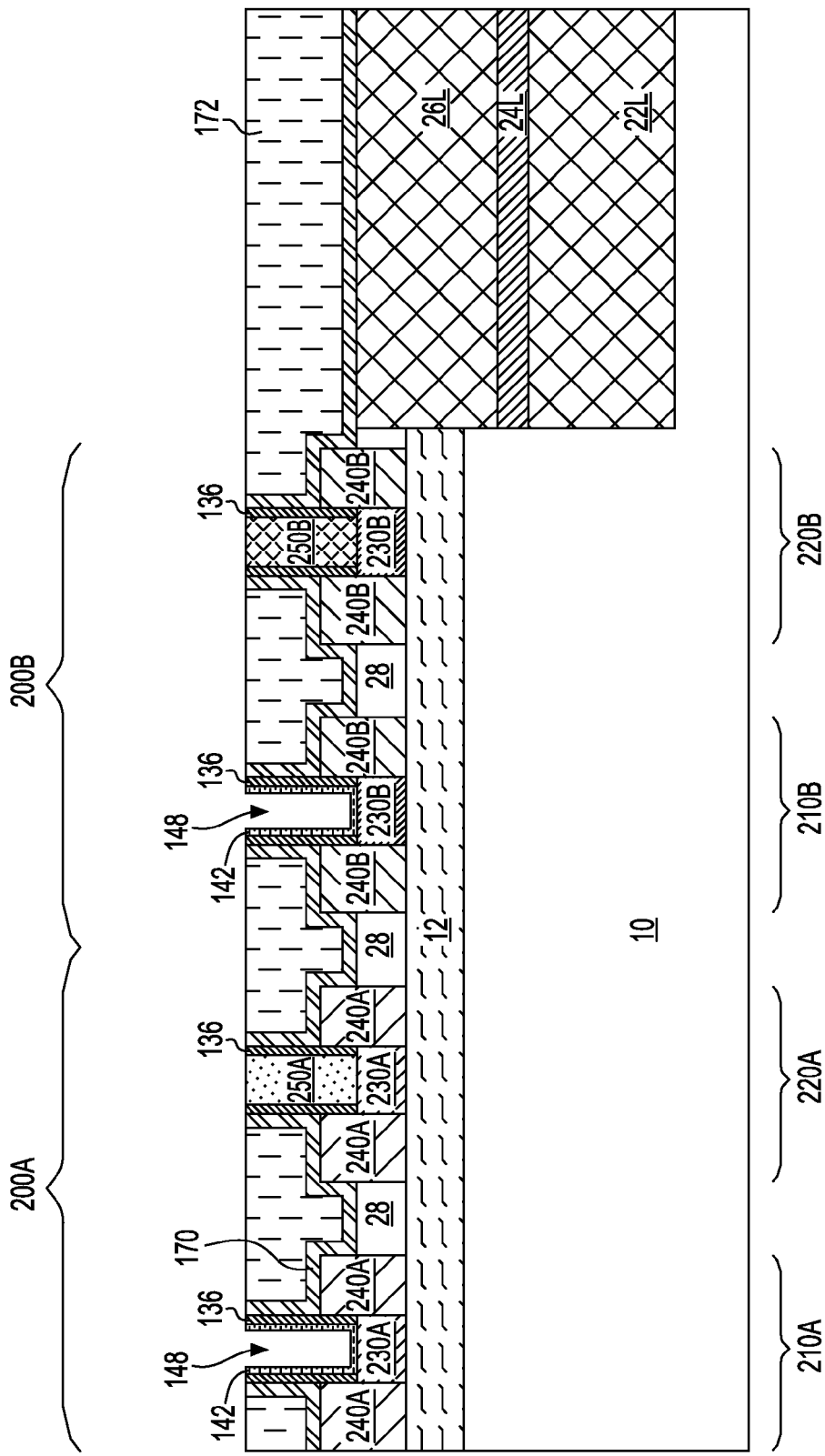
FIG. 22 is a cross-sectional view of the second exemplary semiconductor structure of FIG. 21 after removing the semiconductor cap layer portions and the sacrificial metal layer portions from the trenches in a PMOS sub-region of the first device region and an NMOS sub-region of the second device region to create recesses.

Referring to FIG. 22, the semiconductor cap layer portions 146 and the sacrificial metal layer portions 144 may be removed from the trenches 138 in the PMOS and NMOS sub-regions 210A, 210B by an anisotropic etch. The PNP BJT and NPN BJT sub-regions 220A, 220B are masked by a fourth photoresist layer (not shown) to protect the PNP BJT (230A, 240A, 250A) and the NPN BJT (230B, 240B, 250B). The anisotropic etch can be a dry etch such as RIE. Etching of the semiconductor cap layer portions 146 and the sacrificial metal layer portions 144 may create recesses 148 in the trenches 138 of the PMOS and NMOS sub-regions 210A, 210B.

Figure 23:
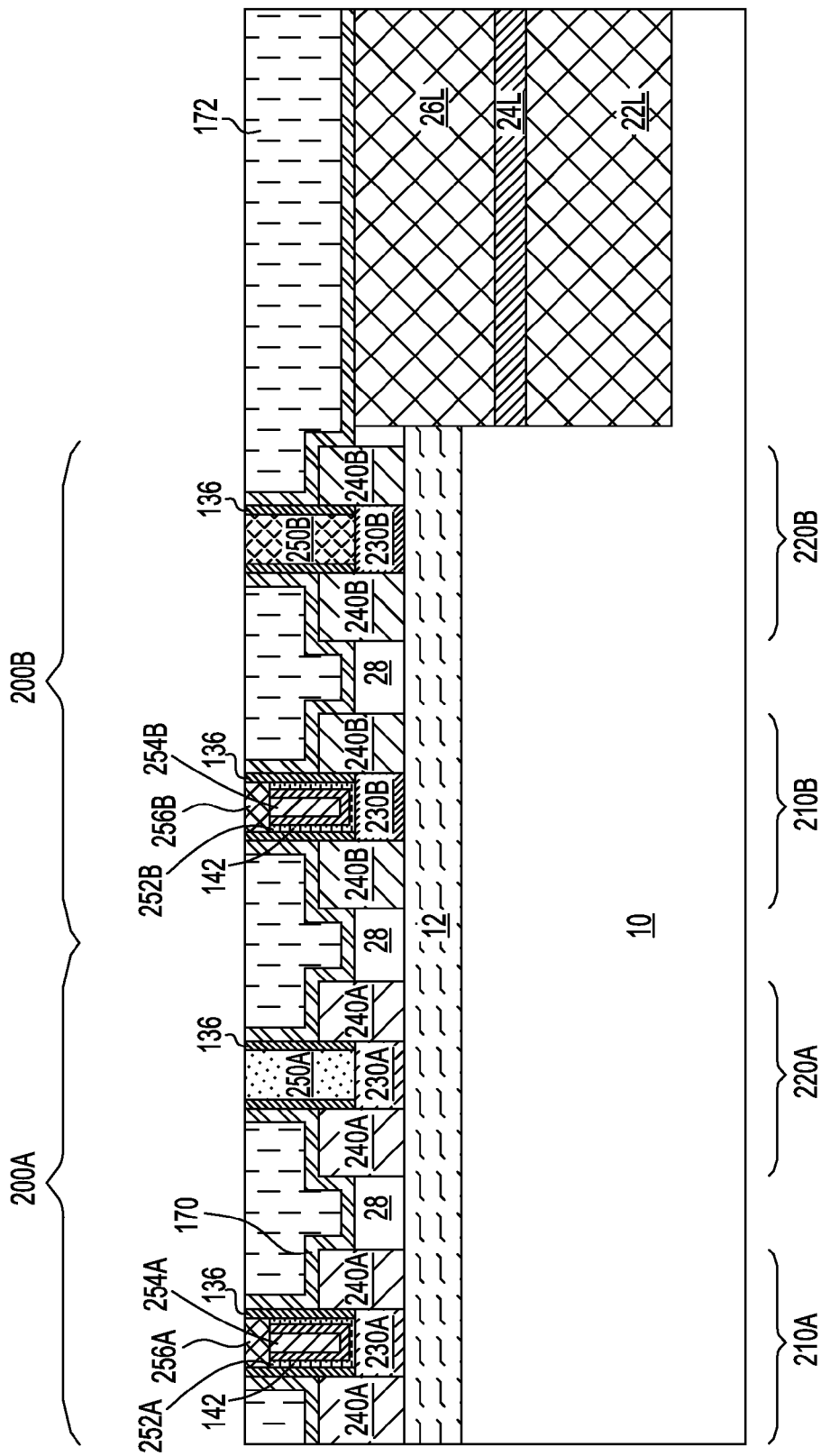
FIG. 23 is a cross-sectional view of the second exemplary semiconductor structure of FIG. 22 after forming a first metal gate in the recess in the PMOS sub-region and a second metal gate in the recess in the NMOS sub-region

Referring to FIG. 23, a first metal gate including a U-shaped first work function metal 252A and a first gate electrode 254A is formed within the recess 148 in the PMOS sub-region 210A and a second metal gate including a U-shaped second work function metal 252B and a second gate electrode 254B is formed within the recess 148 in the NMOS sub-region 210B. The first work function metal 252A may include a first metal, such as, for example, Pt, Ni, Co or TiN which can optimize the performance of p-type FETs. The second work function metal 252B may include a second metal, such as, for example, La, Ti, Ta or TiAl which can optimize the performance of n-type FETs. Each of the first gate electrode 254A and the second gate electrode 254B may include a conductive material such as, for example, doped polysilicon, Al, Au, Ag, Cu or W. The first metal gate (252A, 254A) and the second metal gate (252B, 254B) may be formed by any suitable deposition process known in the art.

Subsequently, the gate dielectric 142, the first metal gate (252A, 254A) and the second metal gate (252B, 254B) may be vertically recessed utilizing a dry etch or wet etch to provide a void (not shown) in each trench 138 of the PMOS and NMOS sub-regions 210A, 210B. The voids are subsequently filled with a dielectric material to provide a first gate cap 256A on top of the gate dielectric 142 in the PMOS sub-region 210A and the first metal gate (252A, 254A) and a second gate cap 256B on top of the gate dielectric 142 in the NMOS sub-region 210B and the second metal gate (252B, 254B). The gate dielectric 142 in the PMOS sub-region 210A, the first metal gate (252A, 254A), the first gate cap 256A and the gate spacer 136 laterally surrounding the gate dielectric 142 in the PMOS sub-region 210A collectively constitute a first functional gate structure. The gate dielectric 142 in the NMOS sub-region 210B, the second metal gate (252B, 254B), the second gate cap 256B and the gate spacer 136 laterally surrounding the gate dielectric 142 in the NMOS sub-region 210B collectively constitute a second functional gate structure.

A PMOS transistor is thus formed in the PMOS sub-region 210A. The PMOS transistor includes a first functional gate structure (142, 252A, 254A, 256A, 136) present on a first channel portion 230A and first source drain regions 240A laterally contacting the first channel portion 130A.

An NMOS transistor is thus formed in the NMOS sub-region 210B. The NMOS transistor includes a first functional gate structure (142, 252B, 254B, 256B, 136) present on a second channel portion 230B and second source drain regions 240B laterally contacting the second channel portion 230B.

The PMOS transistor located in the PMOS sub-region 210A of the first device region, the PNP BJT located in the PNP BJT sub-region 220A of the first device region, the NMOS transistor located in the NMOS sub-region 210B of the second device region, and the NPN BJT located in the NPN BJT sub-region 220B of the second device region collectively define a BiCMOS structure.

In another embodiment of the present application, the first device region can be a CMOS transistor region including a PMOS sub-region and an NMOS sub-region, while the second device region can be a complementary BJT region including a PNP BJT sub-region and an NPN BJT sub-region (not shown). The PMOS sub-region in the first device region and the PNP BJT sub-region in the second device region are n-type semiconductor regions and may be formed by performing the processing steps of FIG. 5. The NMOS sub-region in the first device region and the NPN BJT sub-region in the second device region are p-type semiconductor regions and may also be formed by performing the processing steps of FIG. 5. After forming the sacrificial gate structures and source/drain regions in the sub-regions of the first device region and the sub-regions of the second device region by performing the processing steps of FIG. 16, trenches are formed followed by forming a gate dielectric and a sacrificial metal layer portion on sidewalls and a bottom surface of each of trenches by performing the processing steps of FIGS. 17-18. Next, the gate dielectric and the sacrificial metal layer 144 may be removed from the trenches located in the second device region by performing the processing steps of FIG. 19. Next, the processing steps of FIGS. 20-23 are performed to form a PMOS transistor in the PMOS sub-region of the first device region, an NMOS transistor in the NMOS sub-region of the first device region, a PNP BJT in the PNP BJT sub-region of the second device region, and an NPN BJT in the NPN BJT sub-region of the second device region.

Figure 24:
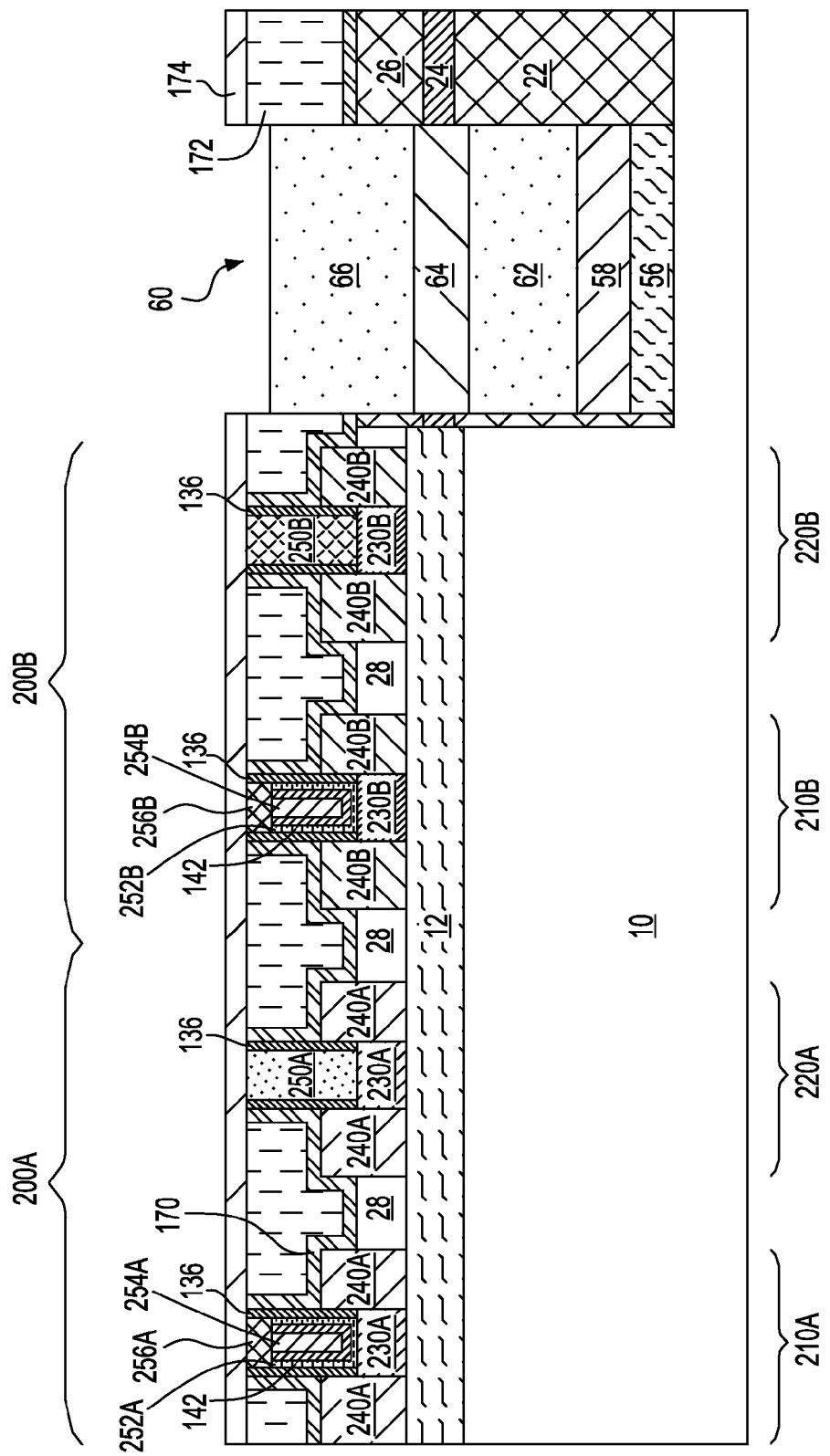
FIG. 24 is a cross-sectional view of the second exemplary semiconductor structure of FIG. 23 after forming a diode laser within a second trench that extends through a sacrificial dielectric cap layer located over the ILD layer, the ILD layer and the dielectric waveguide material stack.

Referring to FIG. 24, a sacrificial dielectric cap layer 174 may be formed over the topmost surfaces of the dielectric cap layer 170, the ILD layer 172, the PMOS (230A, 240A, 142, 252A, 254A, 256A, 136) transistor and the NMOS transistor ((230B, 240B, 142, 252B, 254B, 256B, 136), the PNP BJT (230A, 240A, 250A, 136) and the NPN BJT (230B, 240B, 250B, 136). The sacrificial dielectric cap layer 174 may include a dielectric nitride which can be silicon nitride and may be deposited by CVD or PVD. After forming the sacrificial dielectric cap layer 174, a second trench (not shown) extending through the ILD layer 172, the dielectric cap layer 170 and the dielectric waveguide material stack (22L, 24L, 26L) is formed by performing the processing steps of FIG. 7. The remaining portion of the dielectric waveguide material stack (22L, 24L, 26L) constitutes a dielectric waveguide. The dielectric waveguide includes a lower dielectric cladding portion 22, a core portion 24, and an upper dielectric cladding portion 26. Subsequently, a compound semiconductor seed layer 56, a compound semiconductor buffer layer 58, and a laser diode 60 including a lower semiconductor cladding layer 62, an active layer 64 and an upper semiconductor cladding layer 66 are formed within the second trench by performing the processing steps of FIGS. 8-10. The active layer 64 of the laser diode 60 is laterally aligned with the core portion 24 of the dielectric waveguide (22, 24, 26).

Figure 25:
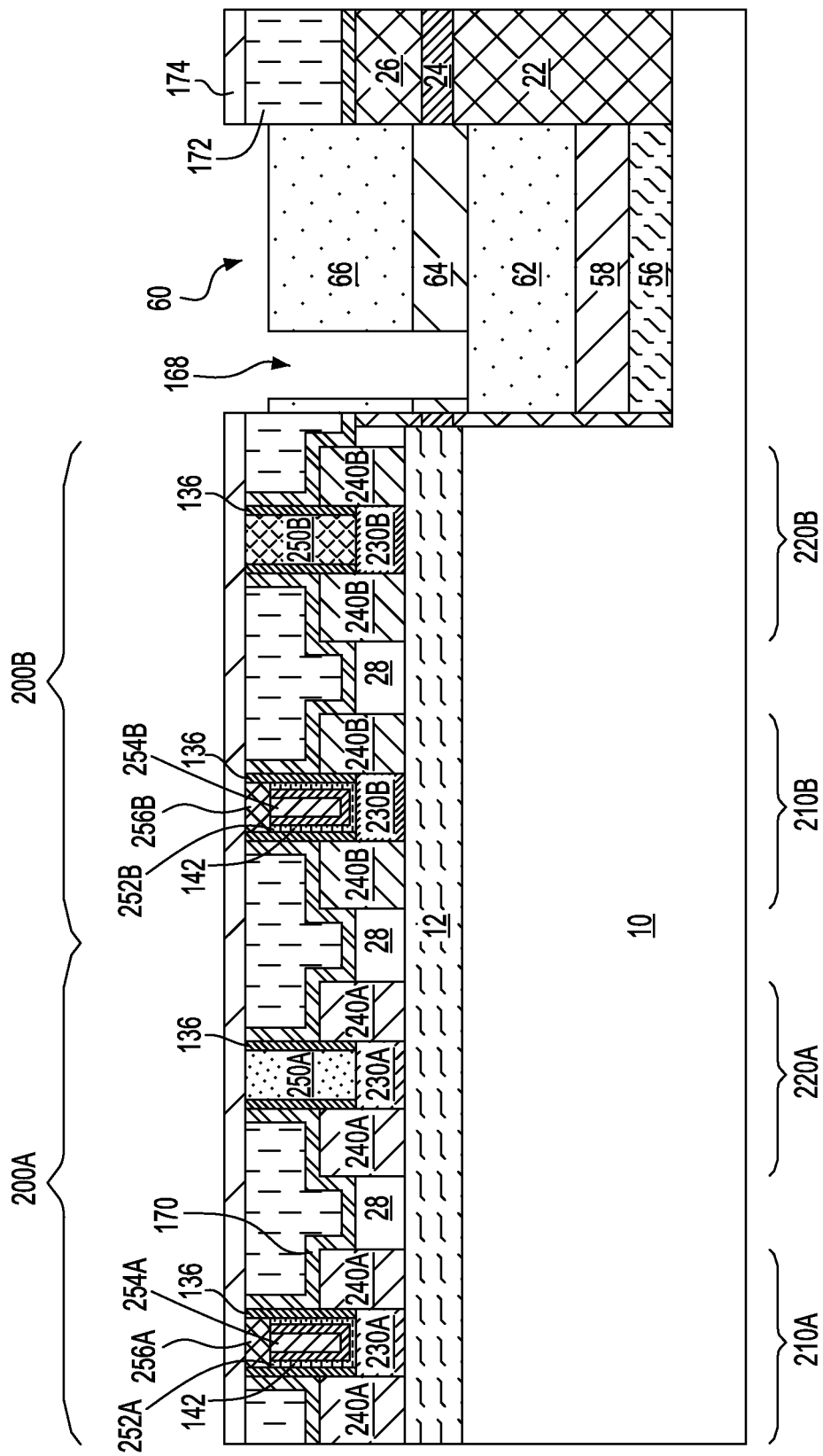
FIG. 25 is a cross-sectional view of the second exemplary semiconductor structure of FIG. 24 after forming an opening through an upper semiconductor cladding layer and an active layer to expose a portion of a lower semiconductor cladding layer.

Referring to FIG. 25, an opening 168 is formed extending through the upper semiconductor cladding layer 66 and the active layer 64 to physically expose a portion of the lower semiconductor cladding layer 62 by performing the processing steps of FIG. 13.

Figure 26:
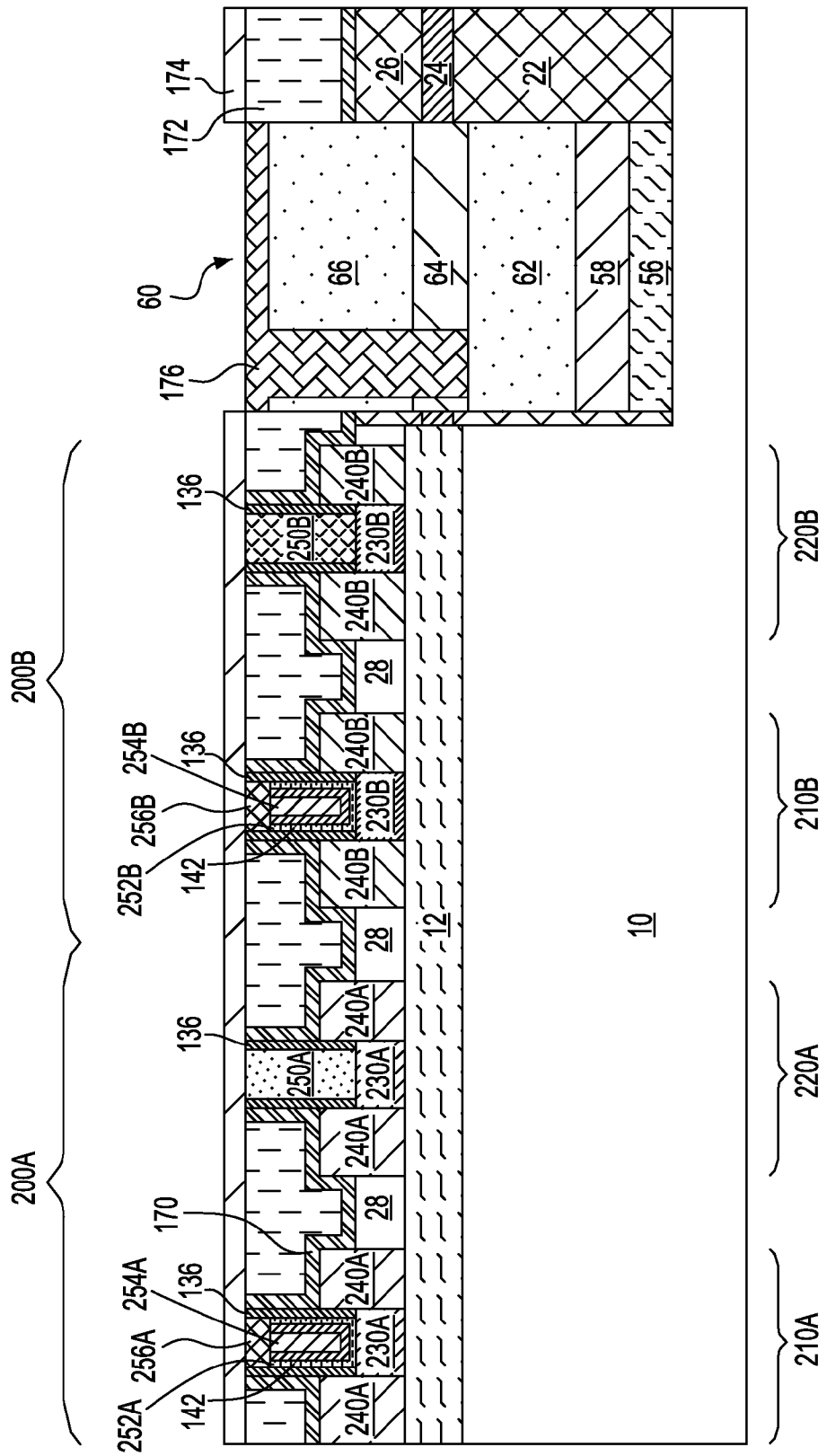
FIG. 26 is a cross-sectional view of the second exemplary semiconductor structure of FIG. 25 after forming a dielectric cap to fill the opening.

Referring to FIG. 26, a dielectric cap 176 is formed over the laser diode 60. A dielectric fill material layer (not shown) is deposited within the opening 168 and above the top surfaces of the upper semiconductor cladding layer 66 and the sacrificial dielectric cap layer 174. The dielectric fill material layer may include a dielectric material such as undoped silicon oxide, doped silicon oxide, porous or non-porous organosilicate glass, porous or non-porous nitrogen-doped organosilicate glass, or a combination thereof and may be formed by CVD or PECVD.

The dielectric fill material layer may be recessed, for example, by a recess etch to provide the dielectric cap 176. The recess depth of the dielectric fill material layer can be selected such that top surface of the dielectric cap 176 is coplanar with the top surface of the ILD layer 172. The sacrificial dielectric cap layer 174 may then be removed using a planarization process, such as CMP employing the top surface of the ILD layer 172 as a stopping layer.

Figure 27:
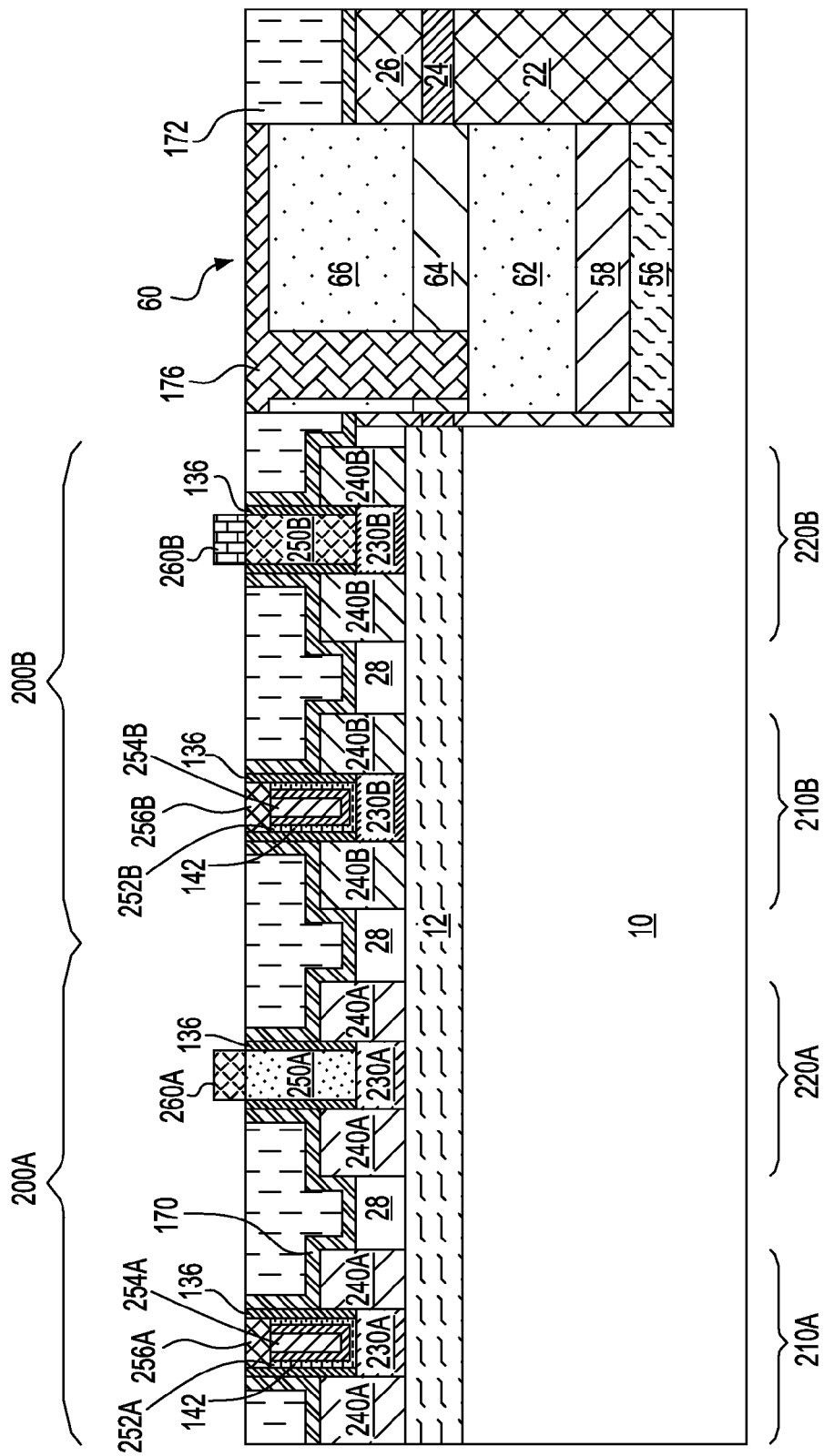
FIG. 27 is a cross-sectional view of the second exemplary semiconductor structure of FIG. 26 after removing the sacrificial dielectric cap layer and forming a first base-side metal semiconductor alloy region over the n-type extrinsic base and a second base-side semiconductor alloy region over the p-type extrinsic base.

Referring to FIG. 27, after removing the sacrificial dielectric cap layer 174, a first base-side metal semiconductor alloy region 260A is formed on top of the n-type extrinsic base 250A and a second base-side semiconductor alloy region 260B is formed on top of the p-type extrinsic base 250B by performing the processing steps of FIG. 12.

Figure 28:
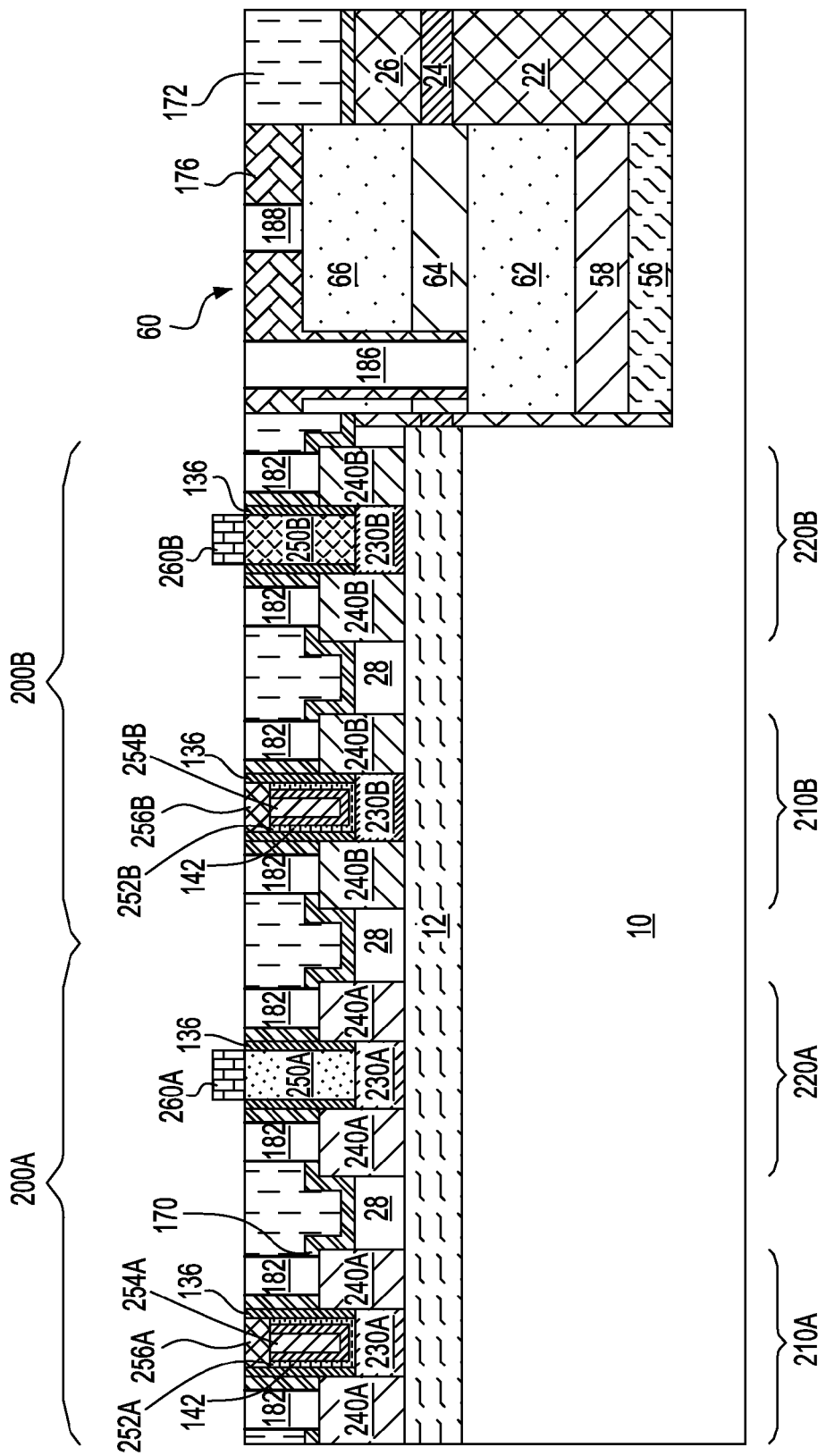
FIG. 28 is a cross-sectional view of the second exemplary semiconductor structure of FIG. 27 after forming contact via structures to provide electrical contacts to various elements of the PNP and NPN BJTs, the PMOS and NMOS transistors and the laser diode.

Referring to FIG. 28, various contact via structures are formed to provide electrical contacts to various elements of the PMOS transistor (230A, 240A, 142, 252A, 254A, 256A, 136) and the PNP BJT (230A, 240A, 250A, 260A) in the p-type device region 200A, the NMOS transistor (230B, 240B, 142, 252B, 254B, 256B, 136) and NPN BJT (230B, 240B, 250B, 260B) in the n-type device region 200B and the laser diode 60. The contact via structures may includes active contact region contact via structures 182 that extend through the ILD layer 172 and the dielectric cap layer 170 and contact the first and the second source/drain regions 240A, 240B, a first cladding conduct via structure 186 that extends through the dielectric cap 176 and contacts the lower semiconductor cladding layer 62, and a second cladding contact via structure 188 that extends through the dielectric cap 176 and contacts the upper semiconductor cladding layer 66. In some embodiments of the present application, contact liners (not shown) may be formed around the various contact via structures (180, 186, 188). The contact via structures (182, 186, 188) may be formed by performing processing steps of FIG. 15. In some embodiments of the present application, and before filling the contact via openings with the conductive material as described above in FIG. 15, metal semiconductor alloy portions (not shown) may be formed on top of the first and the second source/drain regions 240A, 240B by performing processing steps of FIG. 12.

Figure 29:
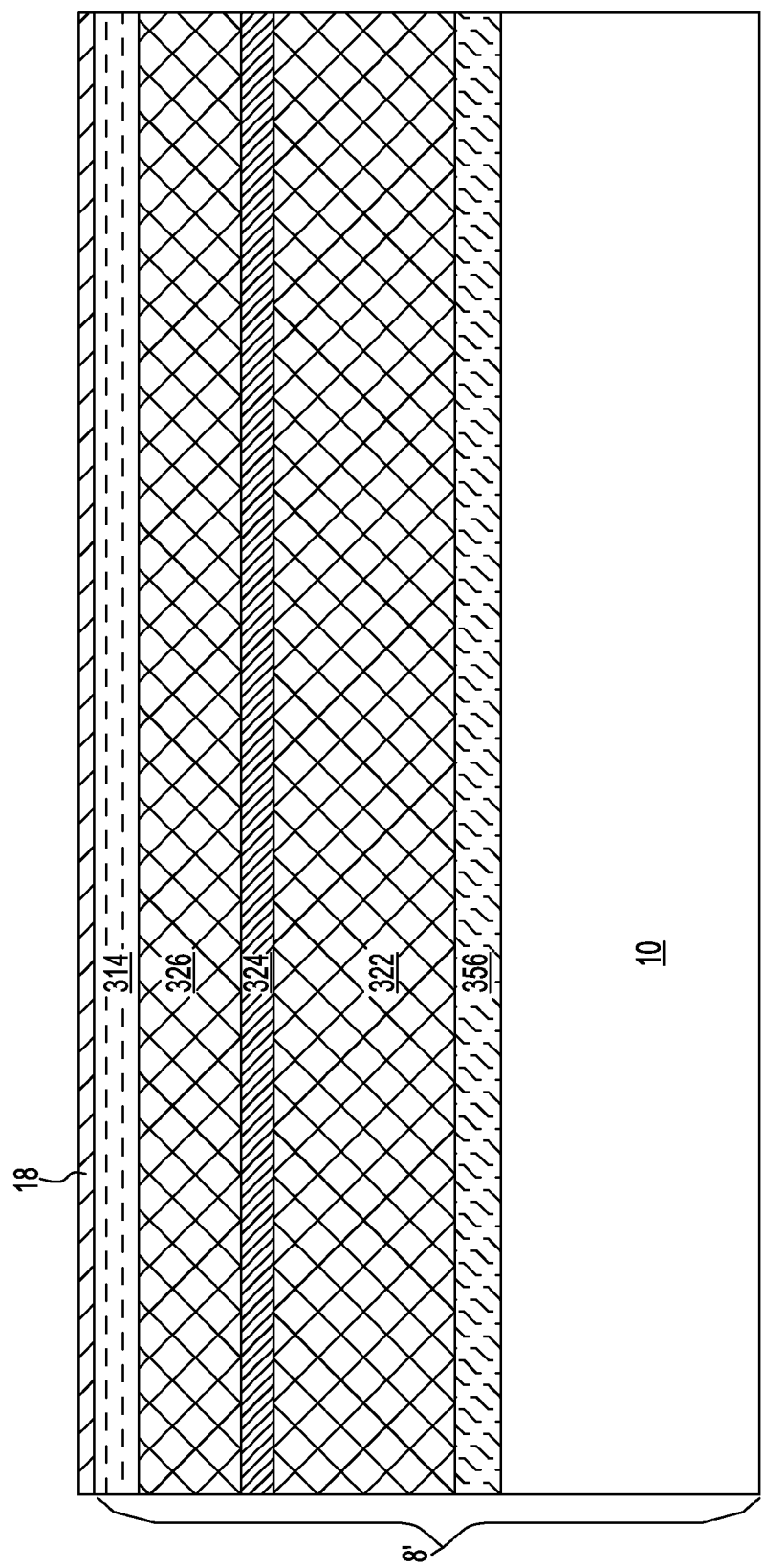
FIG. 29 is a cross-sectional view of a third exemplary semiconductor structure after forming a pad nitride layer on an SOI substrate that includes, from bottom to top, a handle substrate, a lower germanium-containing semiconductor layer, a buried insulator layer stack and a top germanium-containing semiconductor layer according to a third embodiment of the present application.

Referring to FIG. 29, a third exemplary semiconductor structure according to a third embodiment of the present application can be formed by providing a double-germanium-layer-containing SOI substrate 8' and a pad nitride layer 18 formed thereon. The double-germanium-layer-containing SOI substrate 8' includes, from bottom to top, a handle substrate 10, a lower germanium-containing semiconductor layer 356, a buried insulator layer stack (322, 324, 326), and a top germanium-containing semiconductor layer 314. The handle substrate 10 may be composed of a semiconductor material such as silicon as described above in the first embodiment of the present application. In one embodiment, each of the lower germanium-containing semiconductor layers 356 and the top germanium-containing semiconductor layers 314 may include germanium or silicon germanium. The lower germanium-containing semiconductor layer 356 serves as a compound semiconductor seed layer for growth of III-V compound semiconductors. The lower germanium-containing semiconductor layer 356 may be epitaxially grown on the handle substrate 10. The lower germanium-containing semiconductor layer 356 that is formed may have a thickness from 10 nm to 1000 nm, although lesser or greater thicknesses can also be employed. The top germanium-containing semiconductor layer 314 may be formed by a conventional layer transfer technique. For example, a thin germanium layer may be transferred from a germanium wafer (i.e., the donating wafer) onto a handle wafer including the handle substrate 10, the lower germanium-containing semiconductor layer, and the buried insulator layer stack (322, 324, 326).

The buried insulator layer stack (322, 324, 326) separates the top germanium-containing semiconductor layer 314 from the lower germanium-containing semiconductor layer 356 and the handle substrate 10. The buried insulator layer stack (322, 324, 326) contains dielectric layers with respective thicknesses and refractive indices from which a dielectric waveguide can be subsequently formed. In one embodiment, the buried insulator layer stack (322, 324, 326) includes a first dielectric layer 322 overlying the lower germanium-containing semiconductor layer 310, a second dielectric layer 324 overlying the first dielectric layer 322 and a third dielectric layer 326 overlying the second dielectric layer 324. In the third embodiment of the present application, a portion of the first dielectric layer 322 serves as the lower dielectric cladding portion, a portion of the second dielectric layer 324 serves as the core portion, and a portion of the third dielectric layer 326 serves as the upper dielectric cladding portion in a dielectric waveguide. The processing steps of FIG. 3 that are employed to form the dielectric waveguide material stack (22L, 24L, 26L) may be performed to form the buried insulator layer stack (322, 324, 324). In one embodiment, the buried insulator layer stack (322, 324, 326) includes a stack of silicon oxide/silicon nitride/silicon oxide.

The pad nitride 18 may be subsequently formed on the top surface of the top germanium-containing semiconductor layer 314 by performing the processing steps of FIG. 1.

Figure 30:
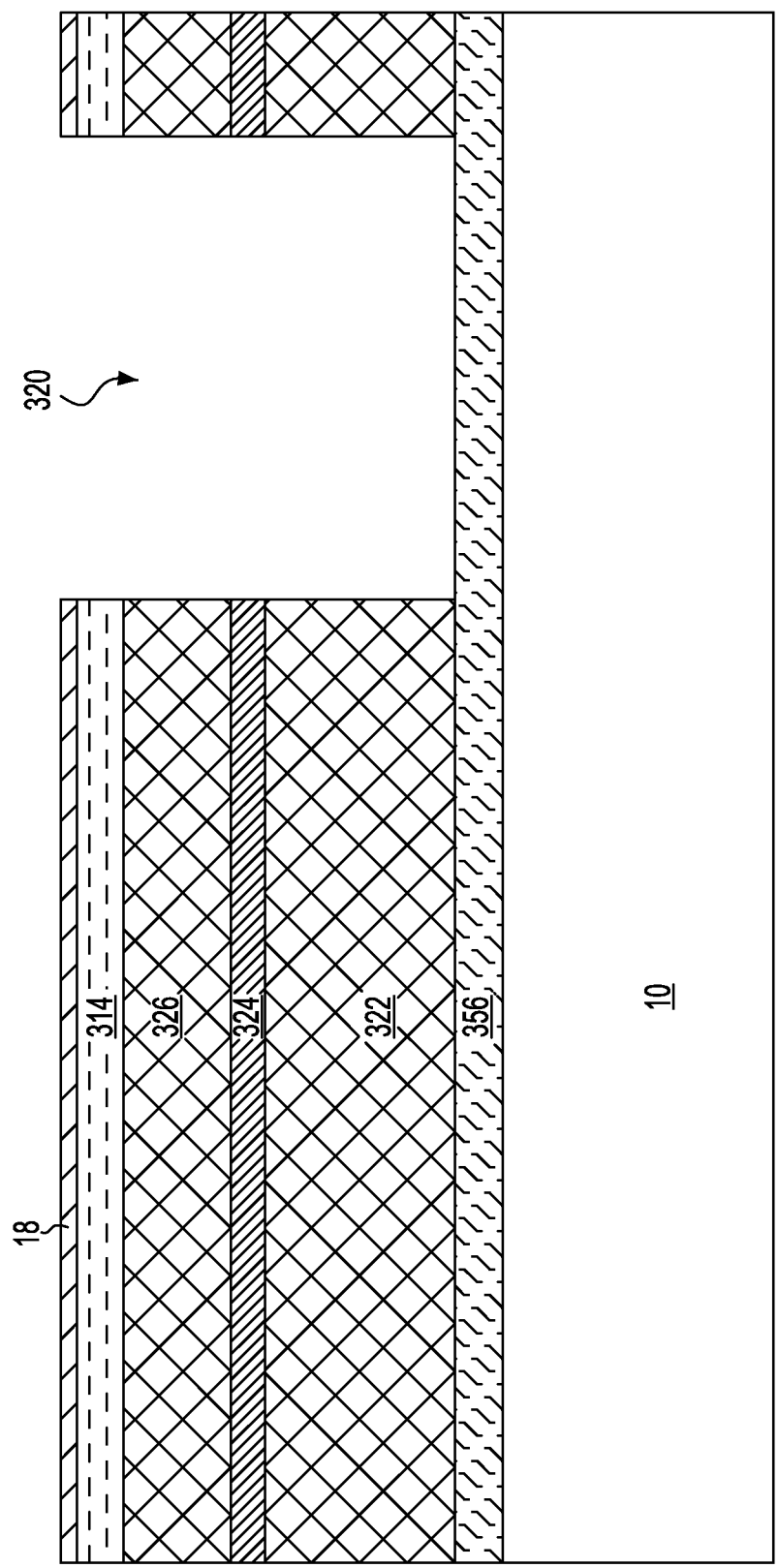
FIG. 30 is a cross-sectional view of the third exemplary semiconductor structure of FIG. 29 after forming a trench extending through the top germanium-containing semiconductor layer and the buried insulator layer stack to expose a portion of the lower germanium-containing semiconductor layer.

Referring to FIG. 30, a trench 320 is formed extending through the top germanium-containing semiconductor layer 314 and the buried insulator layer stack (322, 324, 326) by performing the processing steps of FIG. 2. The trench 320 exposes a portion of the top surface of the lower germanium-containing semiconductor layer 356 so as to define a region within which an optoelectronic device such as a photodetector or a laser diode to be formed.

Figure 31:
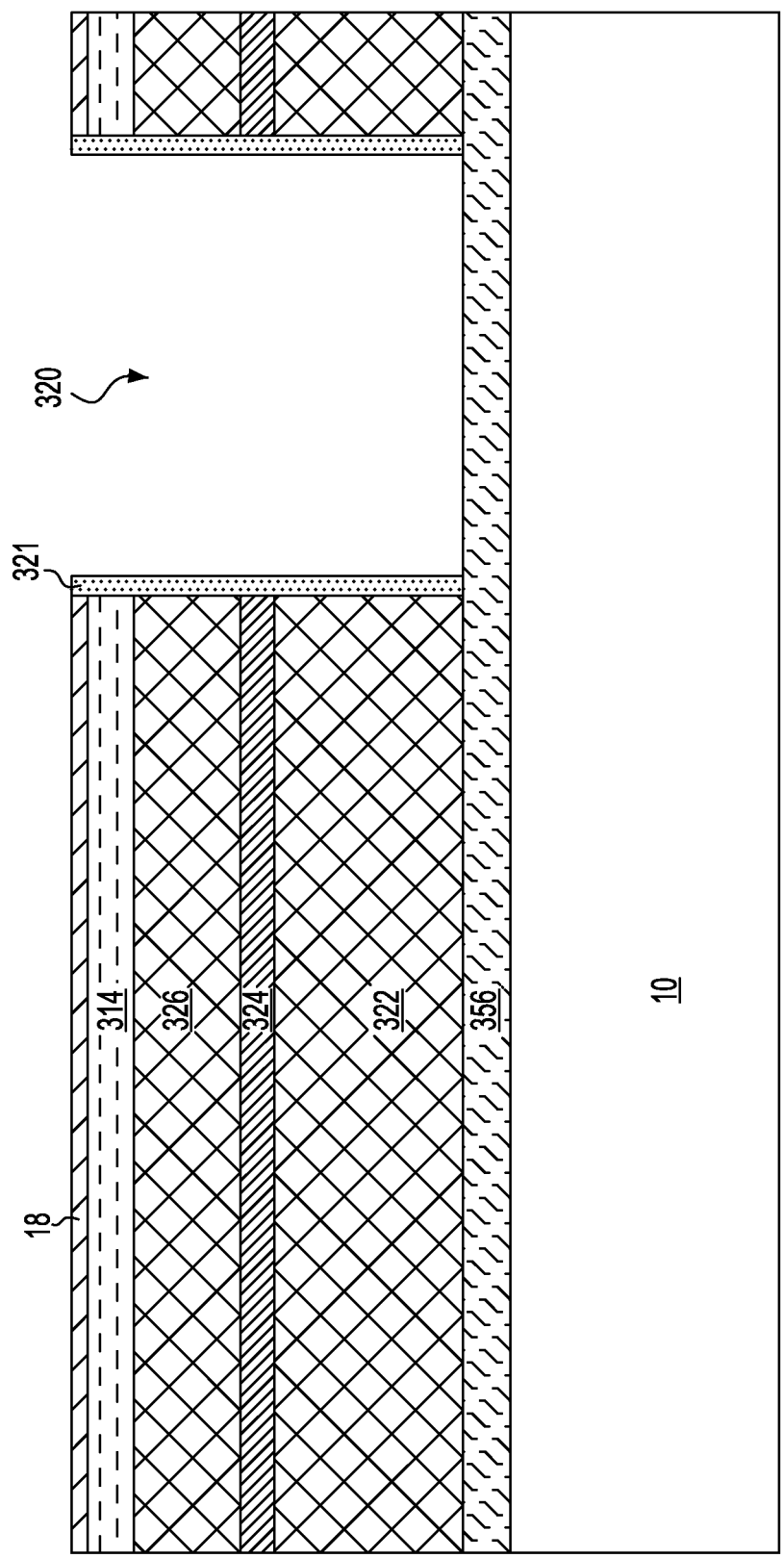
FIG. 31 is a cross-sectional view of the third exemplary semiconductor structure of FIG. 30 after forming spacers on sidewalls of the trench.

Referring to FIG. 31, spacers 321 are formed on sidewalls of the trench 320. The spacers 321 may include a dielectric oxide which can be silicon oxide. The spacers 321 may be formed by conformally depositing a dielectric material on the sidewalls and the bottom surface of the trench 320 and the top surface of the pad nitride layer 18 and removing horizontal portions of the deposited dielectric material from the top surfaces of the pad nitride layer 18 and the bottom surface of the trench 320. The remaining vertical portions of the deposited dielectric material present on sidewalls of the trench 320 constitute spacers 321.

Figure 32:
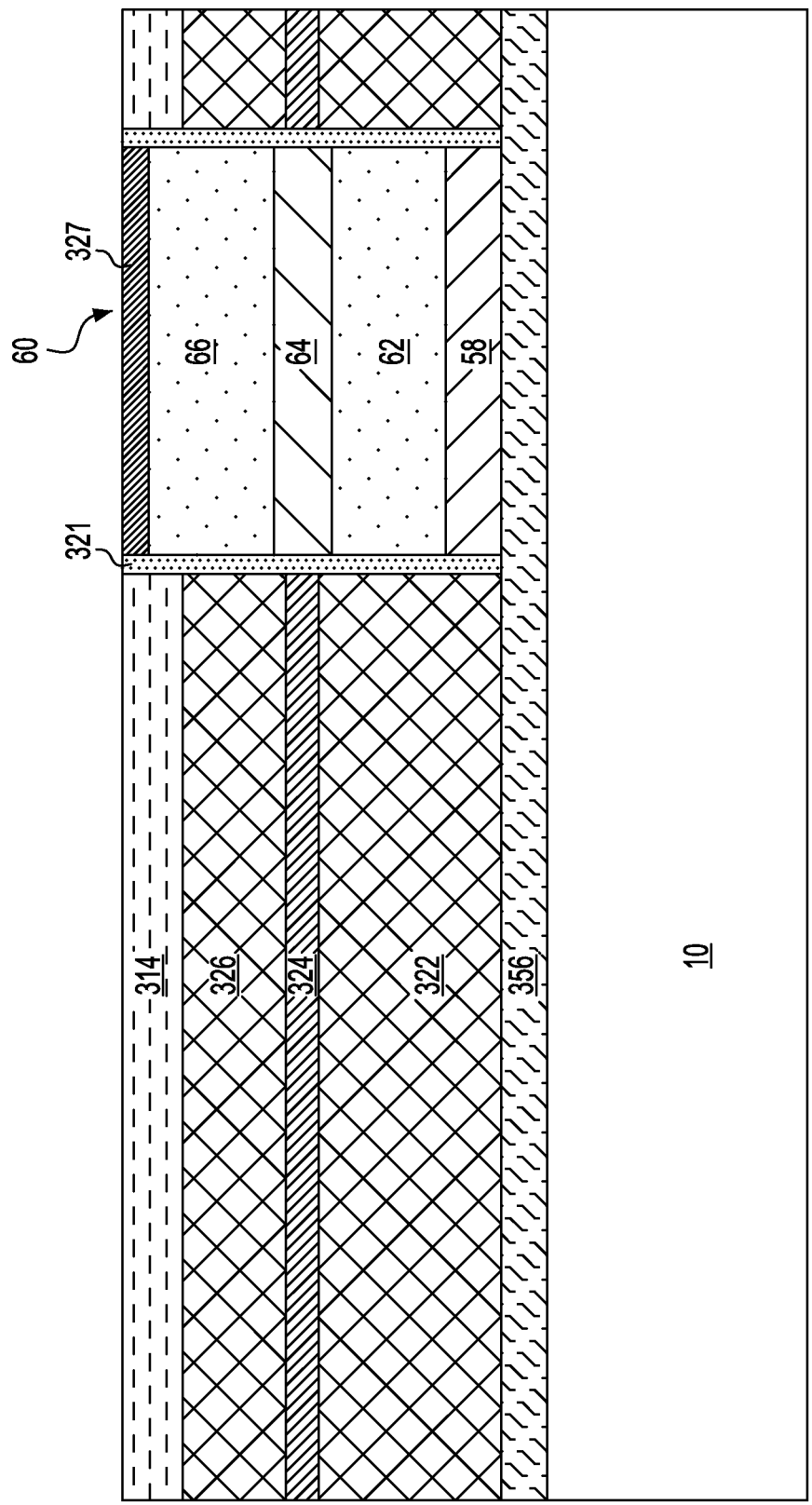
FIG. 32 is a cross-sectional view of the third exemplary semiconductor structure of FIG. 31 after forming a laser diode within the trench and a dielectric cap over the laser diode.

Referring to FIG. 32, a compound semiconductor buffer layer 58 and a laser diode 60 including a lower semiconductor cladding layer 62, an active layer 64 and an upper semiconductor cladding layer 66 are formed within the trench 320 by performing processing steps of FIGS. 9 and 10. In one embodiment and as shown in FIG. 32, the top surface of the upper semiconductor cladding layer 66 is located below the top surface of the top germanium-containing semiconductor layer 314.

Subsequently, a dielectric diode cap 327 is formed on the top surface of the upper semiconductor cladding layer 66. The dielectric diode cap 327 may include a dielectric nitride such as silicon nitride or silicon oxynitride. The dielectric diode cap 327 may be formed by depositing a dielectric material layer (not shown) within the trench 320, and by subsequently removing the portions of the dielectric material layer from above the top surface of the top germanium-containing semiconductor layer 314 by planarization, such as recess etch or CMP. The planarization process also remove the nitride pad layer 18 from the top surface of the top germanium-containing semiconductor layer 314. The dielectric diode cap 327 that is formed has a top surface coplanar with the top surface of the top germanium-containing semiconductor layer 314.

Figure 33:
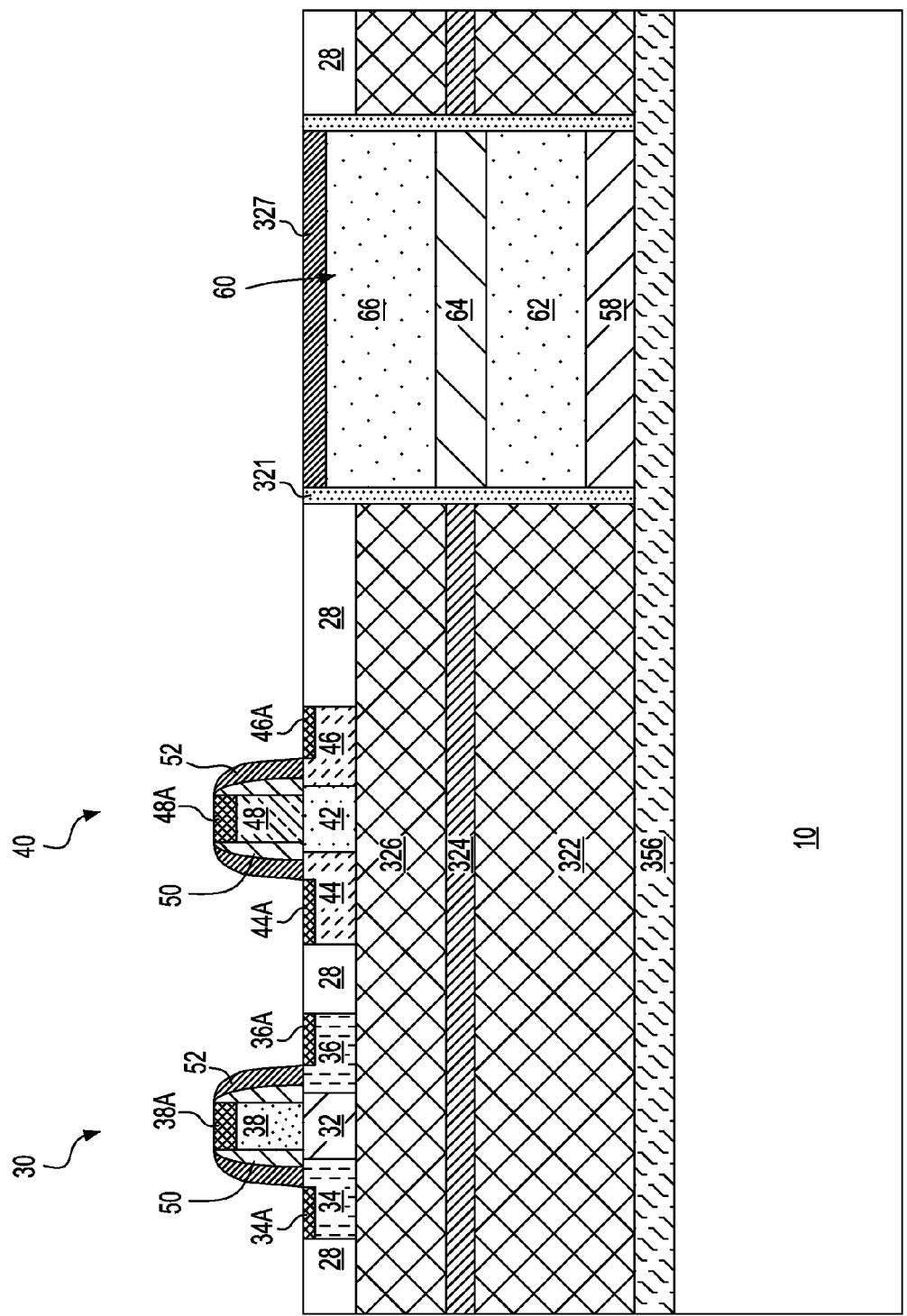
FIG. 33 is a cross-sectional view of the third exemplary semiconductor structure of FIG. 32 after forming a PNP BJT in a first device region and an NPN BJT in a second device region.

Referring to FIG. 33, after forming STI structures 28 in the top germanium-containing semiconductor layer 314 to define a first device region and a second device region by performing the processing steps of FIG. 4, a PNP BJT 30 is formed in the first device region and an NPN BJT 40 is formed in the second device region by performing the processing steps of FIGS. 5 and 6.

Figure 34:
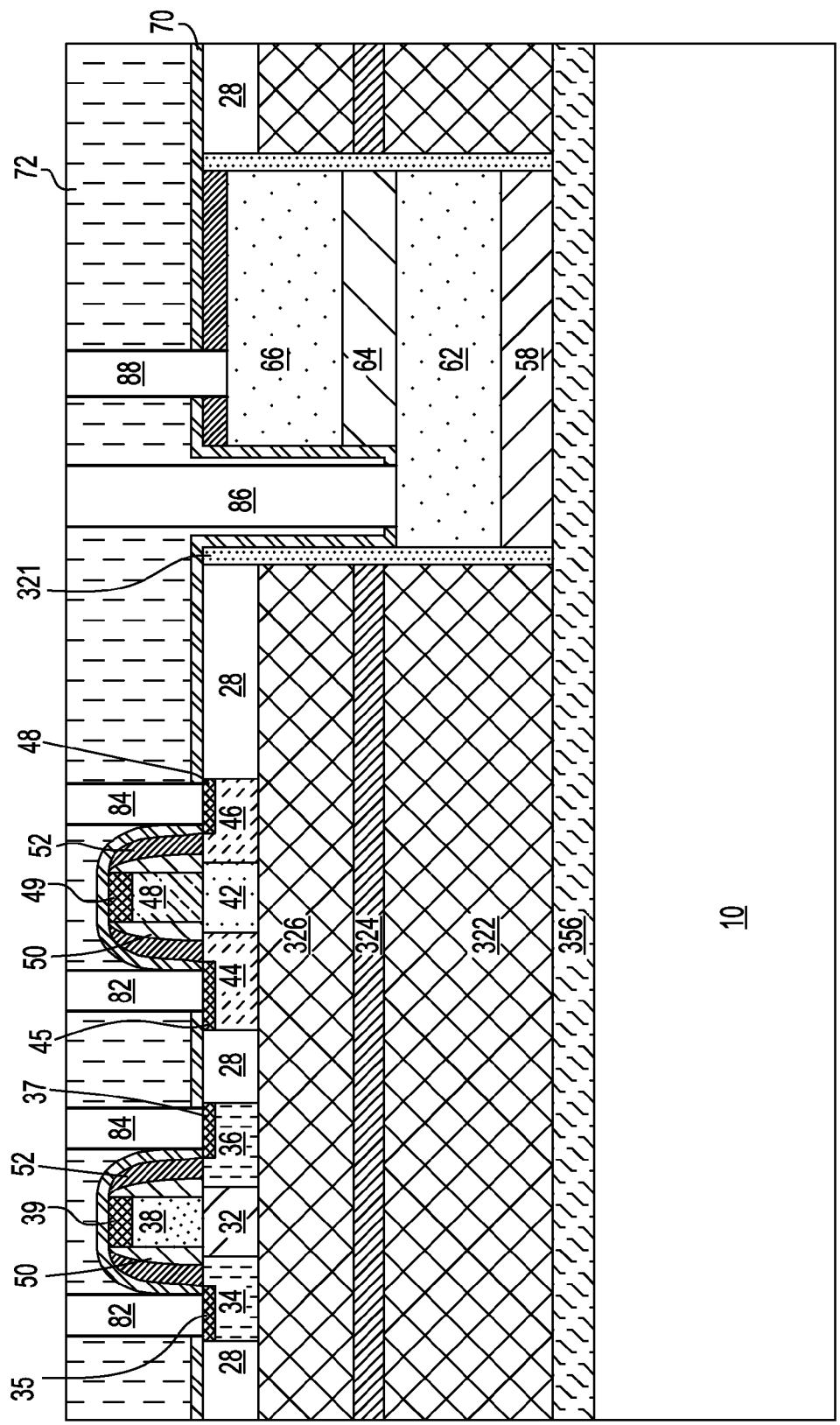
FIG. 34 is a cross-sectional view of the third exemplary semiconductor structure of FIG. 33 after forming contact via structures to provide electrical contacts to various elements of the PNP and NPN BJTs and the laser diode.

Referring to FIG. 34, various contact via structures providing electrical contacts to various elements of the PNP and NPN BJTs and the laser diode 60 are formed by performing the processing steps of FIGS. 13-15. The contact via structures may include emitter-side contact via structures 82 in contact with the first and the second emitters 34, 44, or the first and second emitter-side metal semiconductor alloy regions 35, 45, if present, and collector-side contact via structures 84 in contact with the first and the second collectors 36, 46, or the first and second collector-side metal semiconductor alloy regions 37, 47, if present. The contact via structures may also include a first cladding conduct via structure 86 in contact with the lower semiconductor cladding layer 62 and a second cladding contact via structure 88 in contact with the upper semiconductor cladding layer 62.

Referring to FIG. 35, a fourth exemplary semiconductor structure according to a fourth embodiment of the present application can be formed, for example, by replacing the SOI substrate 8 of FIG. 1 with a bulk semiconductor substrate (herein referring to as handle substrate 10), which can consist of a semiconductor material of the SOI substrate 8 of FIG. 1. Upon formation of a first trench 20 within handle substrate 10 by performing the processing steps of FIG. 2 and a spacer 421 on the sidewall of the first trench 20 by performing the processing steps of FIG. 32, a compound semiconductor seed layer 56 is formed on the bottom surface of the first trench 20 by performing the processing steps of FIG. 8.

Referring to FIG. 36, a dielectric waveguide material stack including a lower dielectric cladding layer 22L, a core layer 24L, and an upper dielectric cladding layer 26L is formed in the first trench 20 by performing the processing steps of FIG. 2. The topmost surface of the dielectric waveguide material stack (22L, 24L, 26L) is coplanar with the top surface of the handle substrate 10.

Figure 37:
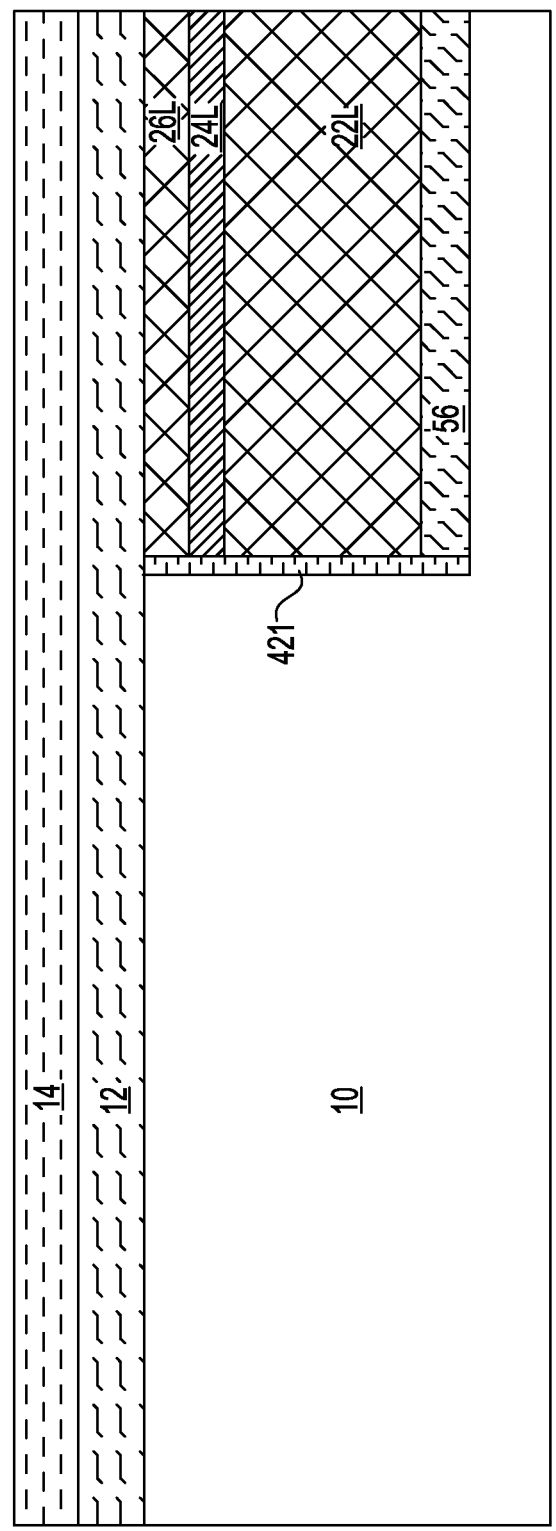
FIG. 37 is a cross-sectional view of the fourth exemplary semiconductor structure of FIG. 36 after forming a buried insulator layer over the bulk semiconductor substrate, the spacer and the dielectric waveguide material stack and a top semiconductor layer on the buried insulator layer.

Referring to FIG. 37, a buried insulator layer 12 and a top semiconductor layer 14 are sequentially formed on the top surfaces of the handle substrate 10 and the spacer 421 and the topmost surface of the dielectric waveguide material stack (22L, 24L, 26L) by performing processing steps of FIG. 1. The top semiconductor layer 14 may be obtained by a layer transfer process.

Figure 38:
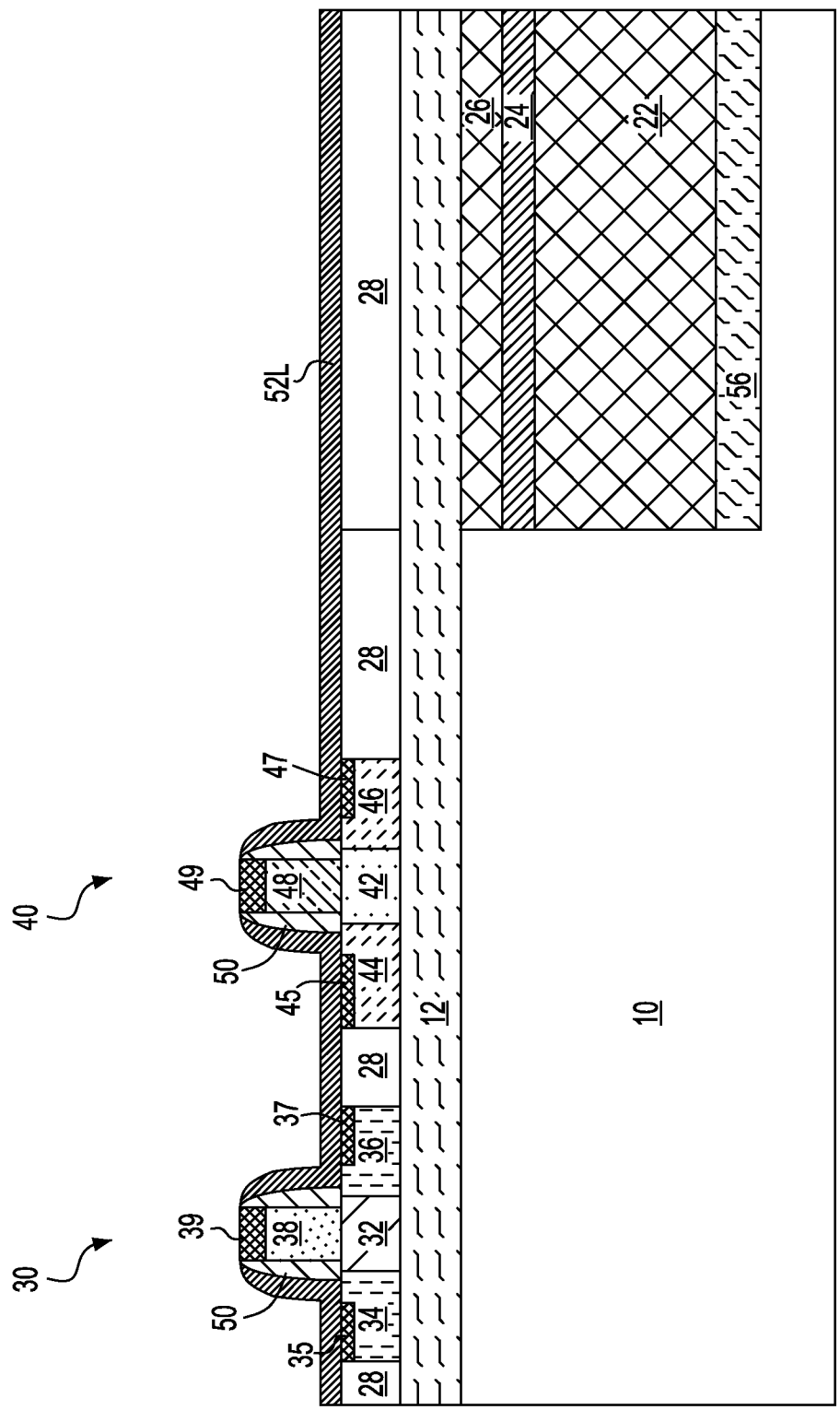
FIG. 38 is a cross-sectional view of the fourth exemplary semiconductor structure of FIG. 37 after forming a PNP BJT in a first device region and an NPN BJT in a second device region.

Referring to FIG. 38, after forming STI structures 28 in the top semiconductor layer 14 to define the first and the second device regions, a PNP BJT 30 is formed in the first device region and an NPN BJT 40 is formed in the second device region by performing processing steps of FIGS. 4 and 5. The first dielectric spacers 50 around the PNP and NPN BJTs 30, 40 and the second dielectric spacer material layer 52L are subsequently formed by performing the processing steps of FIGS. 5 and 6.

Figure 39:
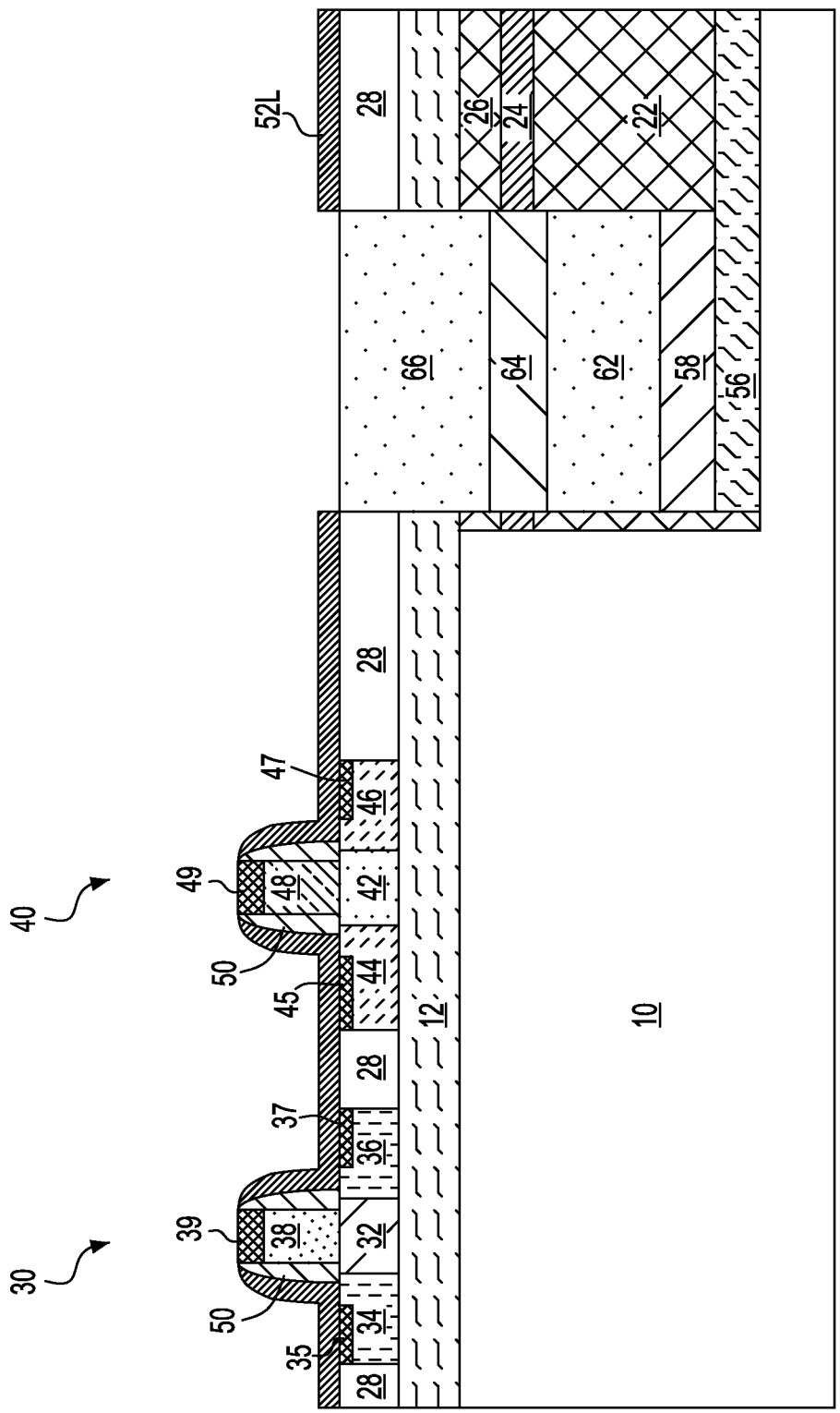
FIG. 39 is a cross-sectional view of the fourth exemplary semiconductor structure of FIG. 38 after forming a second trench to expose a portion of the compound semiconductor seed layer and forming a laser diode in the second trench.

Referring to FIG. 39, a second trench (not shown) is formed extending through the second dielectric spacer material layer 52L, the STI structure 28, the buried insulator layer 12 and the dielectric waveguide material stack (22L, 24L, 26L) by performing the processing steps of FIG. 7. The second trench exposes a portion of the compound semiconductor seed layer 56. The patterning of the dielectric waveguide material stack (22L, 24L, 26L) provide a dielectric waveguide including a lower dielectric cladding portion 22, a core portion 24 and an upper dielectric cladding portion 26. Subsequently, a compound semiconductor buffer layer 58 and a laser diode 60 including a lower semiconductor cladding layer 62, an active layer 64 and an upper semiconductor cladding layer 66 are formed within the second trench by performing the processing steps of FIGS. 9 and 10.

Figure 40:
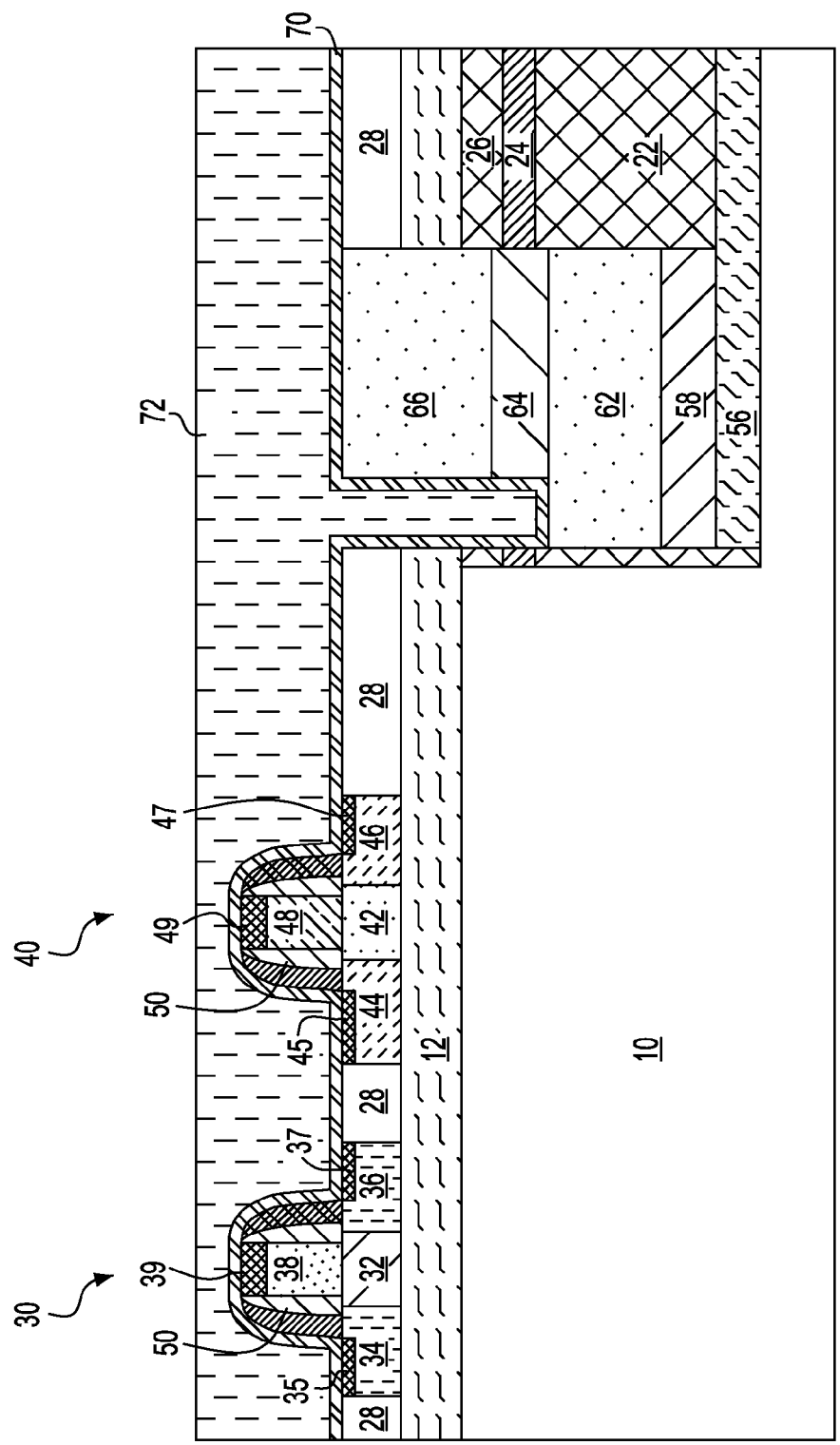
FIG. 40 is a cross-sectional view of the fourth exemplary semiconductor structure of FIG. 39 after forming an opening to expose a portion of a lower semiconductor layer of the laser diode and forming a dielectric cap layer over the PNP and NPN BJTs and the opening and an ILD layer on the dielectric cap layer to fill the opening.

Referring to FIG. 40, after forming an opening (not shown) to expose a portion of the lower semiconductor cladding layer 62 by performing the processing steps of FIG. 13, a dielectric cap layer 70 and an ILD layer 72 are formed sequentially by performing the processing steps of FIG. 14.

Figure 41:
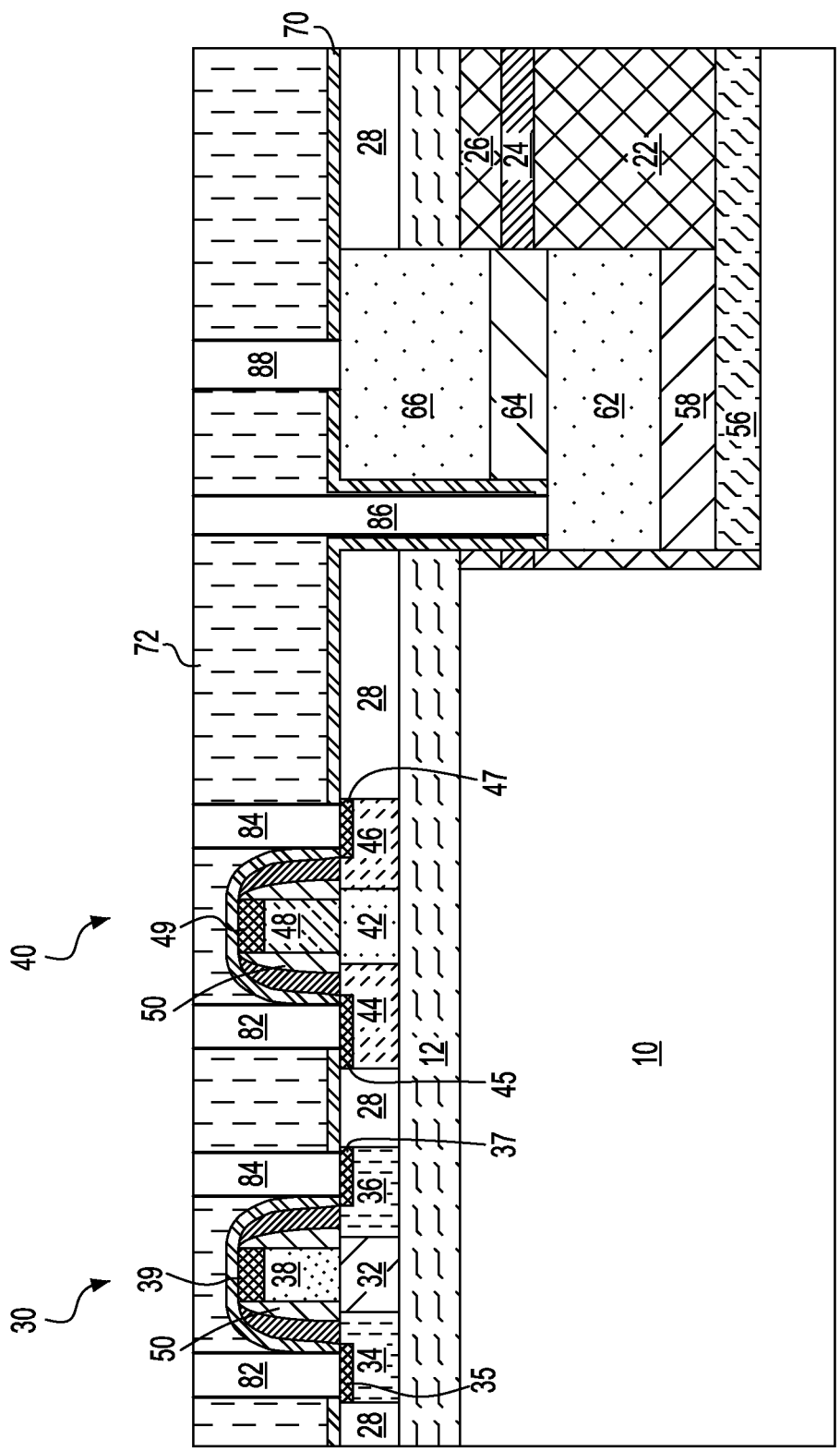
FIG. 41 is a cross-sectional view of the fourth exemplary semiconductor structure of FIG. 39 after forming contact via structures to provide electrical contacts to various elements of the PNP and NPN BJTs and the laser diode.

Referring to FIG. 41, various contact via structures (82, 84, 86, 88) are formed by performing the processing steps of FIG. 15. The contact via structures may include emitter-side contact via structures 82 in contact with the first and the second emitters 34, 44, or the first and second emitter-side metal semiconductor alloy regions 35, 45, if present, and collector-side contact via structures 84 in contact with the first and the second collectors 36, 46, or the first and the second collector-side metal semiconductor alloy regions 37, 47, if present. The contact via structures may also include a first cladding conduct via structure 86 in contact with the lower semiconductor cladding layer 62 and a second cladding contact via structure 88 in contact with the upper semiconductor cladding layer 62.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming a first trench within a semiconductor-on-insulator (SOI) substrate, the first trench extending through a top semiconductor layer of the SOI substrate and a buried insulator layer of the SOI substrate and into a handle substrate of the SOI substrate;
    forming a dielectric waveguide material stack in the first trench;
    forming at least one electronic device in the top semiconductor layer, wherein the at least one electronic device comprises at least one bipolar junction transistor (BJT);
    forming a second trench extending through a portion of the dielectric waveguide material stack, the second trench re-exposing a portion of the bottom surface of the first trench;
    epitaxially depositing a compound semiconductor seed layer on the exposed portion of the bottom surface of the first trench;
    epitaxially depositing a compound semiconductor buffer layer on the compound semiconductor seed layer; and
    forming an optoelectronic device on the compound semiconductor buffer layer within the second trench.

2. The method of claim 1, wherein the forming the at least one electronic device in the top semiconductor layer comprises forming a PNP BJT in a first device region of the top semiconductor layer and an NPN BJT in a second device region of the top semiconductor layer.

3. The method of claim 2, wherein the forming the at least one electronic device in the top semiconductor layer comprises:
    forming the first and the second device regions laterally surrounded by shallow trench isolation (STI) structures in the top semiconductor layer;
    implanting n-type dopants to the first device region of the top semiconductor layer to provide an n-type semiconductor region;
    implanting p-type dopants to the second device region of the top semiconductor layer to provide a p-type semiconductor region;
    forming a semiconductor layer over the first device region and the second device region of the top semiconductor layer;
    patterning the semiconductor layer to form a first semiconductor layer portion over the n-type semiconductor region and a second semiconductor layer portion over the p-type semiconductor region;
    implanting n-type dopants to the first semiconductor layer portion to provide a first extrinsic base;
    implanting p-type dopants to the second semiconductor layer portion to provide a second extrinsic base;
    forming a dielectric spacer on each sidewall of the first extrinsic base and the second extrinsic base;
    implanting p-type dopants to portions of the top semiconductor layer in the first device region that are not covered by the first extrinsic base or the dielectric spacers; and
    implanting n-type dopants to portions of the top semiconductor layer in the second device region that are not covered by the second extrinsic base or the gate spacers while masking the first device region.

4. The method of claim 1, wherein the forming the at least one electronic device in the top semiconductor layer comprises forming complementary metal-oxide-semiconductor (CMOS) transistors in a first device region of the top semiconductor layer and complementary bipolar junction transistors (BJTs) in a second device region of the top semiconductor layer, wherein the CMOS transistors comprise a p-type metal-oxide-semiconductor (PMOS) transistor located in a first sub-region of the first device region and an n-type metal-oxide-semiconductor (NMOS) transistor located in a second sub-region of the first device region, and wherein the complementary BJTs comprise a PNP BJT located in a first sub-region of the second device region and an NPN BJT located in a second sub-region of the second device region.

5. The method of claim 4, wherein the forming the at least one electronic device in the top semiconductor layer comprises:
    forming sacrificial gate structures in the first and the second sub-regions of the first device region and the first and the second sub-regions of the second device region, each of the sacrificial gate structures comprising a sacrificial gate stack contacting the top semiconductor layer and a gate spacer present on each sidewall of the sacrificial gate stack;

forming source/drain regions on opposite sides of the sacrificial gate structures located in the first and the second sub-regions of the first device region and emitter/collector regions on opposite sides of the sacrificial gate structures located in the first and the second dub-regions of the second device region;

removing the sacrificial gate stacks to provide trenches;

forming a U-shaped gate dielectric in each of the trenches;

forming a U-shaped sacrificial metal layer portion on the U-shaped gate dielectric in each of the trenches;

removing the U-shaped gate dielectric and the U-shaped sacrificial metal layer portion from the trenches in the first and the second sub-regions of the second device region without removing the U-shaped gate dielectric and the U-shaped sacrificial metal layer portion from the trenches in the first and the second sub-regions of the first device region;

depositing a semiconductor cap layer portions to fill the trenches;

implanting n-type dopants into the semiconductor cap layer portion located in the trench in the first sub-region of the second device region;

implanting p-type dopants into the semiconductor cap layer portion located in the trench in the second sub-region of the second device region;

removing the semiconductor cap layer portion and the U-shaped sacrificial metal layer portion from the trenches in the first and the second sub-regions of the first device region to expose the gate dielectric in each of the trenches in the first and the second sub-regions of the first device region; and forming a first metal gate over the exposed gate dielectric to fill the trench in the first sub-region of the first device region and a second metal gate over the exposed gate dielectric to fill the trench in the second sub-region of the first device region.

6. The method of claim 1, wherein a portion of a remaining portion of the dielectric waveguide material stack constitutes a dielectric waveguide.

7. The method of claim 1, wherein the optoelectronic device is a laser diode formed by:

forming a lower semiconductor cladding layer on the compound semiconductor buffer layer;

forming an active layer on the lower semiconductor cladding layer, wherein the active layer is laterally aligned with a portion of a remaining portion of the core layer of the dielectric waveguide; and forming an upper semiconductor cladding layer on the active layer.

8. A method of forming a semiconductor structure comprising:

providing a semiconductor-on-insulator (SOI) substrate comprising a handle substrate, a lower germanium-containing semiconductor layer present on the handle substrate, a buried insulator layer stack present on the lower germanium-containing semiconductor layer, and a top germanium-containing semiconductor layer present on the buried insulator layer stack, the buried insulator layer stack comprising a first dielectric layer contacting the lower germanium-containing semiconductor layer, a second dielectric layer present on the first dielectric layer, and a third dielectric layer present on the second dielectric layer;

forming a trench within the SOI substrate, the trench extending through the top germanium-containing semiconductor layer and the buried insulator layer stack to expose a portion of the lower germanium-containing semiconductor layer;

forming spacers on sidewalls of the trench;

epitaxially depositing a compound semiconductor buffer layer on a bottom surface of the trench;

forming an optoelectronic device on the compound semiconductor buffer layer within the trench and edge coupled to the second dielectric layer of the buried insulator layer stack;

forming a dielectric cap on a topmost surface of the optoelectronic device; and forming at least one electronic device in the top semiconductor layer, wherein the at least one electronic device comprises at least one bipolar junction transistor (BJT).

9. The method of claim 8, wherein the optoelectronic device is a diode laser comprising a lower semiconductor cladding layer present on the compound semiconductor buffer layer, an active layer present on the lower semiconductor cladding layer, and an upper semiconductor cladding layer present on the active layer.

* * * * *